(12) United States Patent
Yokokawa et al.

(10) Patent No.: US 8,098,775 B2
(45) Date of Patent: Jan. 17, 2012

(54) DATA PROCESSING APPARATUS, DATA PROCESSING METHOD AND PROGRAM

(75) Inventors: Takashi Yokokawa, Kanagawa (JP);
Naoki Yoshimochi, Tokyo (JP);
Toshiyuki Miyauchi, Kanagawa (JP);
Takashi Horiguti, Kanagawa (JP);
Satoru Hori, Kanagawa (JP)

(73) Assignee: Sony Corporation, Tokyo (JP)

( * ) Notice: Subject to any disclaimer, the term of this patent is extended or adjusted under 35 U.S.C. 154(b) by 489 days.

(21) Appl. No.: 12/403,445

(22) Filed: Mar. 13, 2009

(65) Prior Publication Data

US 2009/0235060 A1    Sep. 17, 2009

(30) Foreign Application Priority Data

Mar. 14, 2008 (JP) .................. P2008-066090

(51) Int. Cl.
*H04L 27/06* (2006.01)
(52) U.S. Cl. ..................... 375/341; 375/265

(58) Field of Classification Search ............... 375/265, 375/341; 714/795
See application file for complete search history.

(56) References Cited

U.S. PATENT DOCUMENTS

2009/0122891 A1*  5/2009  Bottero et al. ............. 375/265
2009/0125794 A1*  5/2009  Li et al. ..................... 714/795

FOREIGN PATENT DOCUMENTS

JP          2000-502859        3/2000
* cited by examiner

*Primary Examiner* — Emmanuel Bayard
(74) *Attorney, Agent, or Firm* — Finnegan, Henderson, Farabow, Garrett & Dunner, L.L.P.

(57) ABSTRACT

A data processing apparatus includes: a branch-metric computation section configured to compute a branch metric; a state-metric computation section configured to compute a state metric; a detection section configured to detect a minimum state metric; a storage section configured to store states as surviving states; and a selection section configured to select a candidate.

12 Claims, 19 Drawing Sheets

STATE →TIME t

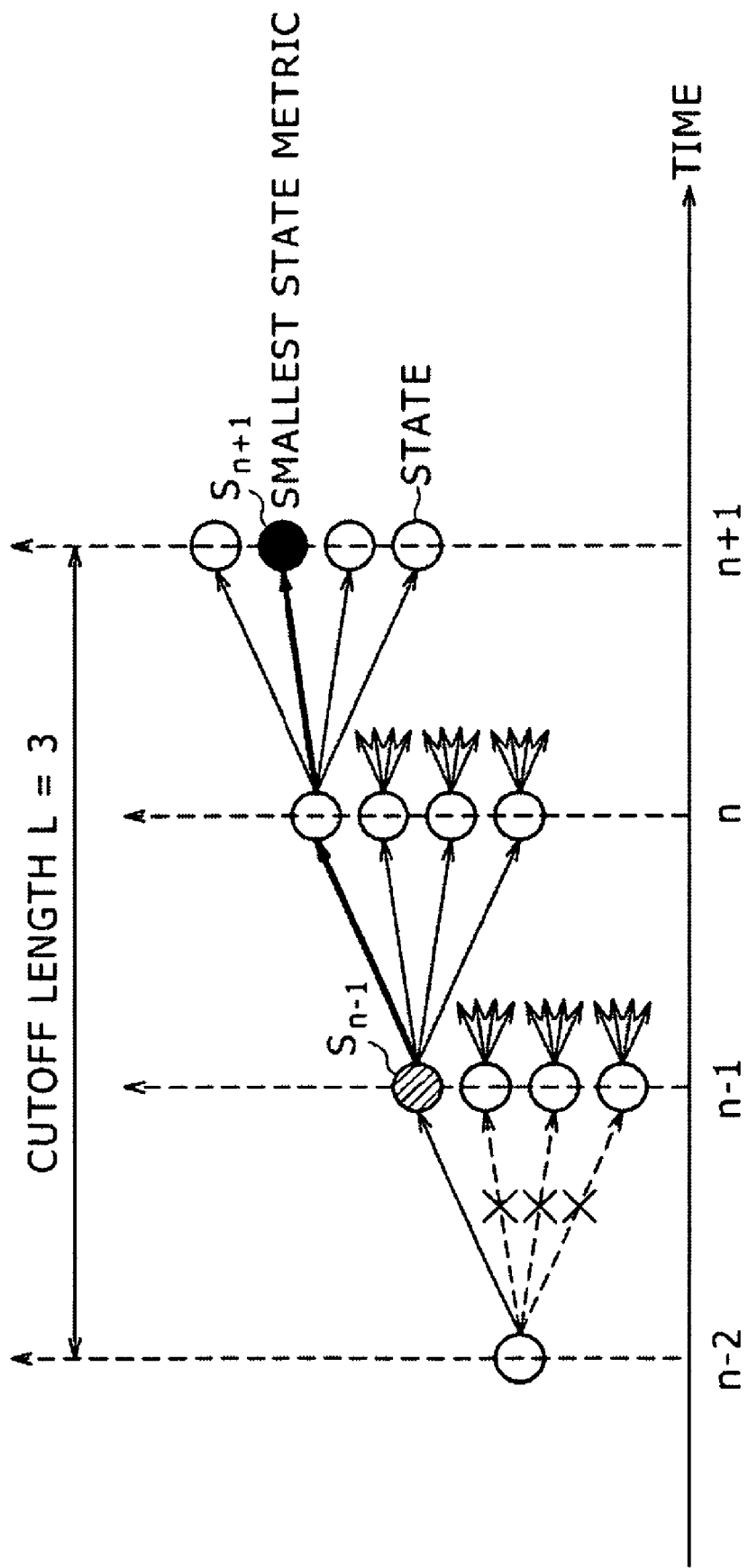

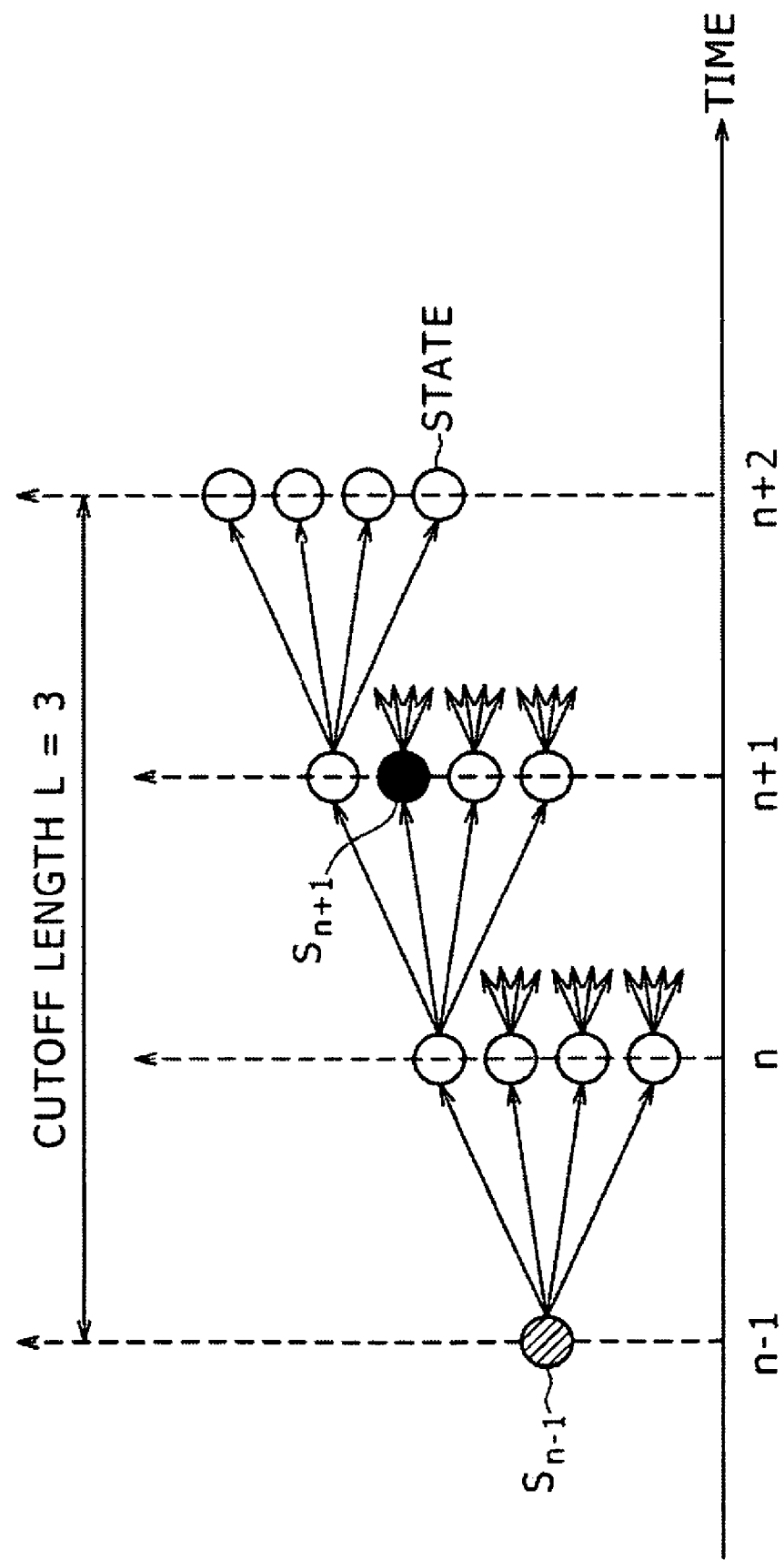

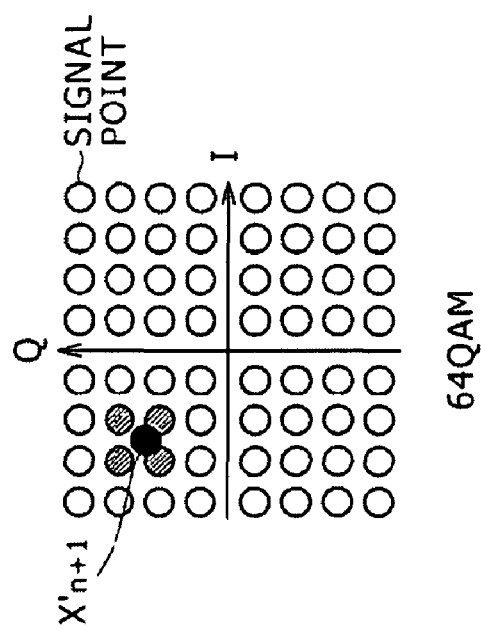
FIG.7C 64QAM
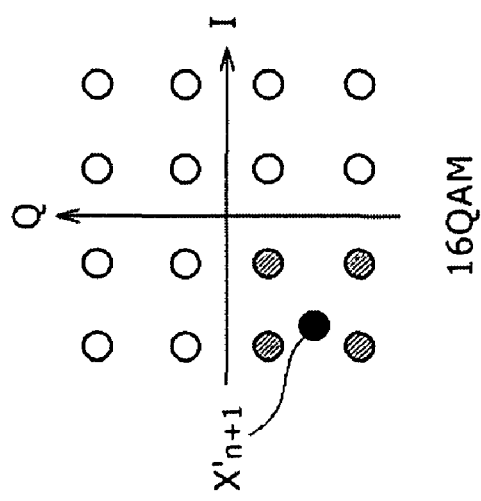
FIG.7B 16QAM
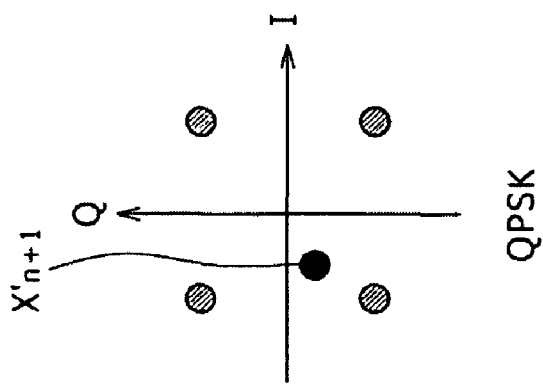
FIG.7A QPSK

DATA PROCESSING APPARATUS, DATA PROCESSING METHOD AND PROGRAM

BACKGROUND OF THE INVENTION

1. Field of the Invention

The present invention relates to a data processing apparatus, a data processing method adopted by the data processing apparatus and a data processing program implementing the data processing method. In particular, the present invention relates to a data processing apparatus capable of inferring a data series by making use of a trellis with a high degree of precision while reducing the number of surviving states surviving in the trellis and relates to a data processing method adopted by the data processing apparatus as well as a data processing program implementing the data processing method.

2. Description of the Related Art

A convolution code is a typical example of codes used in a wide range of fields such as communications and broadcastings. The convolution code has a much peculiar feature of a capability of implementing a maximum-likelihood decoding process of decoding a code word into a most likely data series. A data series is an information series serving as a subject of a coding process. A Viterbi decoding method is a typical example of methods for implementing the maximum-likelihood decoding process.

In accordance with the Viterbi decoding method, a most likely data series is inferred by making use of a trellis (referred to as a maximum-likelihood inference process).

That is to say, in accordance with the Viterbi decoding method, a process to find a candidate for a path (a series of states) of a minimum distance (a minimum matrix) passing through states as a path for the states and store the candidate in a memory is carried out repeatedly so that, while wasteful computation processing is being eliminated, a received word and a code word of the minimum distance can be eventually selected.

The Viterbi decoding method has a feature that, if the decoding length (or the coding length) increases, the amount of processing increases only linearly.

In the ISDB (Integrated Services Digital Broadcasting)-T system or other systems, an OFDM (Orthogonal Frequency Division Multiplexing) technique is adopted. The ISDB-T system is one of ground wave digital television broadcasting systems in Japan.

The OFDM technique adds the rear portion of each symbol to the head (of the symbol) to serve as a guard interval so as to offer a characteristic of resistance against a delayed wave (or a multipath echo). If a delay exceeding the length of a guard interval exists, however, interferences between symbols and interferences between carriers are generated so that the signal reception characteristic (or the signal decoding characteristic) deteriorates considerably.

Even if a delayed wave exceeding the length of a guard interval exists, interferences between symbols can be reduced whereas interferences between carriers other than carriers adjacent to each other can also be decreased as well. The decrease can be implemented by typically applying a Hannington window to an OFDM signal of the base band and carrying out FFT (Fast Fourier Transform) processing.

Let reference notation n denote a carrier number used for identifying a carrier (or a sub-carrier) of an OFDM signal whereas reference notation $Y_n$ denote an OFDM signal obtained by applying a Hannington window to the OFDM signal and carrying out the FFT processing. In the following description, the OFDM signal obtained by applying a Hannington window to the OFDM signal and carrying out the FFT processing is referred to as a reduced-interference signal. In this case, the reduced-interference signal $Y_n$ is expressed by Eq. (1) as follows:

[Eq. 1]

$$Y_n = -\tfrac{1}{2} X_{n-1} H_{n-1} + X_n H_n - \tfrac{1}{2} X_{n+1} H_{n+1} N_n \qquad (1)$$

In the above equation, reference notation $X_n$ denotes a transmitted symbol transmitted by making use of carrier #n which is a carrier identified by the carrier number n.

On the other hand, reference notation $N_n$ denotes a noise component included in the reduced-interference signal $Y_n$. The noise component $N_n$ is the sum of interferences between symbols, interferences between carriers and an additivity white noise. In addition, reference notation $H_n$ denotes the characteristic of a transmission line for carrier #n. In the following description, the characteristic of a transmission line is also referred to as transmission-line information.

It is to be noted that, in Eq. (1) given above, a coefficient of $-\tfrac{1}{2}$ multiplied by a term $X_{n-1} H_{n-1}$, a coefficient of $+1$ multiplied by a term $X_n H_n$ and a coefficient of $-\tfrac{1}{2}$ multiplied by a term $X_{n+1} H_{n+1}$ are each a coefficient of the Hannington window.

Carrier #n, which is a carrier identified by the carrier number n, is the nth carrier among carriers arranged in an order of increasing carrier frequencies.

In accordance with Eq. (1), the reduced-interference signal $Y_n$ can be perceived as a convolution code obtained as a result of a convolution coding process by making use of two memories used for storing transmitted symbols $X_n$ and $X_{n-1}$ as internal states. Thus, if the transmission-line information $H_n$ is known and each of the transmitted symbols $X_n$ transmitted by making use of carriers #n having carrier numbers n equal to or smaller than 0 is assumed to be 0, the transmitted symbols $X_n$ can be inferred as a result of a process of inferring a series of transmitted symbols $X_0$, $X_1$ and so on by making use of a trellis. The series of transmitted symbols $X_0$, $X_1$ and so on is a series of aforementioned transmitted symbols $X_n$.

That is to say, the transmitted symbols $X_n$ can be inferred by carrying out a maximum-likelihood inference process adopting typically the Viterbi decoding method.

In a Viterbi decoder for carrying out a maximum-likelihood inference process adopting the Viterbi decoding method on a transmitted symbol $X_n$, the number of trellis states is equal to the second power of a signal-point count which is the number of signal points of the first-order modulation of the OFDM signal. The signal points of the first-order modulation of the OFDM signal are signal points on an IQ-constellation plane.

The first-order modulation processing carried out in the ISDB-T system cited before is a 64QAM (Quadrature Amplitude Modulation) process, a 16QAM process, a QPSK (Quadrature Phase Shift Keying) process or a BPSK (Binary Phase Shift Keying) process.

If the 64QAM process is carried out as the first-order modulation processing for example, the number of trellis states is 4,096(=64×64).

In addition, in the Viterbi decoder, the number of branch metrics BM to be computed for one state of the trellis is equal to the signal-point count which is the number of signal points of the first-order modulation of the OFDM signal.

Since the number of trellis states is equal to the second power of a signal-point count which is the number of signal points of the first-order modulation of the OFDM signal as described above, the number of branch metrics BM to be computed for one carrier of the OFDM signal is the third power of the number of signal points of the first-order modulation of the OFDM signal.

FIG. 1 is a diagram showing a trellis of a general Viterbi decoding method.

It is to be noted that, in the trellis shown in the diagram of FIG. 1 or any of other figures in this patent specification, the axis stretched in the horizontal direction is a time axis representing the lapse of time. Each of circles arranged in the vertical direction represents a trellis state at a particular time. A segment connecting any two states of the trellis is referred to as a branch.

If the 64QAM process is carried out as the first-order modulation processing, the number of trellis states at a particular point of time is 4,096(=64×64) as described above. In addition, the number of branch metrics BM to be computed for each carrier of the OFDM signal is 262,144(=64×64×64). Thus, it is extremely difficult to implement a Viterbi decoder having a small size.

A method described in non-patent document 1 (mentioned later) is a typical method for reducing the increase of the size of a data-series inference detector for inferring a data series. The Viterbi detector is a typical example of the data-series inference detector. In the following description, the method described in non-patent document 1 is referred to as an M algorithm.

In accordance with the M algorithm, the number of surviving states surviving on the trellis is repressed as described below in order to reduce the increase of the size of a data-series inference detector. A surviving state surviving in the trellis is defined as a state stored in the data-series inference detector.

That is to say, in accordance with the M algorithm, at every time, the number of states originated from one surviving state is limited to a number M determined in advance as shown in the diagrams of FIGS. 2A to 2C. In the following description, a state originated from one surviving state through a branch is also referred to as a child state and a surviving state from which a child state is also referred to as a parent state. The number M determined in advance is referred to as a limited state count. Then, state metrics sm of child states originated from all surviving parent states are sorted. Subsequently, in accordance with the M algorithm, C child states are selected from the child states, the state metrics sm of which have been sorted, in an order of increasing state metrics to serve as new surviving states where reference notation C denotes an integer determined in advance. In other words, each of the C selected child states has a relatively small state metric sm in comparison with those of the unselected states. That is to say, the C child states are selected in an order of increasing state metrics sm starting with the smallest state metric among the sorted state metrics sm. Symbol C denotes a certain constant. These processes of limiting the number of child states to the limited state count M, sorting the state metrics sm of the child states and selecting new surviving states from the child states are carried out repeatedly.

Finally, in accordance with the M algorithm, a data series is inferred by going upstream through preceding surviving states from a determined surviving state.

FIGS. 2A to 2C are explanatory diagrams referred to in description of the M algorithm.

In case of the M algorithm explained by referring to the diagrams of FIGS. 2A to 2C, the limited state count M is set at 2 whereas the predetermined integer C representing the number of surviving states selected at the most recent time is set at 4. In the following description, the number of surviving states selected at the most recent time is referred to as a most recent surviving state count C.

FIG. 2A is a diagram showing a trellis to which the M algorithm is applied.

In the trellis shown in the diagram of FIG. 2A, for example, four surviving states exist at a time t of n (that is, for the time t=n). In the diagrams of FIGS. 2A to 2C, a white circle denotes a surviving state whereas a black circle denotes a state not selected to serve as a surviving state. In the following description, the phrase "for the time t=n" is also used to mean "at a time of n."

In accordance with the M algorithm, child states are originated from each of the four surviving parent states existing for the time t=n to serve as child states for the time t=n+1. The number of child states is limited to the limited state count M which is set at 2 as described above.

That is to say, two (=M) child states originated from any specific one of the four surviving parent states, which exists for the time t=n, through branches to serve as child states for the time t=n+1 are found to serve as two child states, which have smallest branch metrics BM, among child states that can be originated from the specific parent state. The child states found in this way each serves as a candidate for a surviving state for the time t=n+1.

To put it concretely, in the trellis shown in the diagram of FIG. 2A, four surviving states exist for the time t=n. Since two child states originate from each of the four surviving parent states existing for the time t=n to serve as two child states for the time t=n+1, for the time t=n+1, eight child states each become a candidate for a surviving state for the time t=n+1.

Thereafter, the branch metric BM of each of the eight child states each becoming a candidate for a surviving state for the time t=n+1 is found and the branch metrics BM are then sorted.

Subsequently, four (=C) candidates for surviving states are selected in an order of increasing branch metrics BM from the eight candidates for the surviving states for the time t=n+1 to serve as new surviving states for the time t=n+1.

In the same way, two (=M) child states originated from any specific one of the four surviving parent states, which exist for the time t=n+1, through branches to serve as child states for the time t=n+2 are found as 2 child states, which have smallest branch metrics BM, among child states that can be originated from the specific parent state. The child states found in this way each serves as a candidate for a surviving state for the time t=n+2. Then, the subsequent processes described above are repeated.

Each of FIGS. 2B and 2C is a diagram showing surviving grandparent states which need to be stored in a memory in advance after the execution of the processing to select surviving states by adoption of the M algorithm as described above by referring to the diagram of FIG. 2A.

To be more specific, FIG. 2B is a diagram showing three grandparent states for the time t=n−1 as surviving states which need to be stored in a memory in advance after four surviving grandchild states have been selected for the time t=n+1 lagging behind time t=n−1 by a typical interval of two time units.

The three stored surviving states have been selected from grandparent states for the time t=n−1 as surviving states each linked to one of the four surviving grandchild states for the time t=n+1 by a branch and need to be stored in a memory in advance to be used for inferring a data series in a process of going upstream through preceding surviving states in the trellis. In the diagram of FIG. 2B, the three stored surviving states selected from grandparent states for the time t=n−1 are enclosed by a dotted line in order to indicate that the three selected surviving states are grandparent states which need to be stored in a memory in advance.

By the same token, FIG. 2C is a diagram showing four grandparent states for the time t=n as surviving states which need to be stored in a memory in advance after four surviving grandchild states have been selected for the time t=n+2 lagging behind time t=n by a typical interval of two time units.

In the same way, the four stored surviving states have been selected from grandparent states for the time t=n as surviving states each linked to one of the four surviving grandchild states for the time t=n+2 by a branch and need to be stored in a memory in advance to be used for inferring a data series in a process of going upstream through preceding surviving states in the trellis. In the diagram of FIG. 2C, the four stored surviving states selected from grandparent states for the time t=n are enclosed by a dotted line in order to indicate that the four selected surviving states are grandparent states which need to be stored in a memory in advance.

A document used in this patent specification as non-patent document 1 mentioned before is "Source and Channel Coding: An Algorithmic Approach," J. B. Anderson and S. Mohan, Kluwer Academic Press, 1991.

SUMMARY OF THE INVENTION

The number of surviving grandparent states which have been selected in the past and need to be stored in a memory in advance changes from time and time. For example, the number of surviving grandparent states selected in the past and stored in a memory in advance changes from three to four in the example described above.

Thus, the data-series inference apparatus adopting the M algorithm requires a memory with a storage capacity determined by on the basis of the maximum number of surviving ancestor states which have been selected in the past and need to be stored in a memory in advance. As a result, the size of the data-series inference apparatus increases. Incidentally, such a memory is referred to as a path memory.

In the example explained earlier by referring to the diagrams of FIGS. 2A to 2C, the limited state count M is set at 2 whereas the most recent surviving state count C is set at 4. Thus, in this case, the maximum number of surviving ancestor states which have been selected in the past and need to be stored in a memory in advance in accordance with the M algorithm is the most recent surviving state count C which is set at 4.

Therefore, the present invention has been made in view of the problems described above, and provides a technology for inferring a data series by making use of a trellis with a high degree of precision while reducing the number of surviving states surviving in the trellis by, for example, properly limiting the number of candidates for the surviving states.

In accordance with a first embodiment of the present invention, there is provided a data processing apparatus or a data processing program to be executed by a computer which functions as the data processing apparatus. The data processing apparatus employs: a branch-metric computation section configured to compute a branch metric while limiting the number of child states each originated from a parent state in a trellis used for inferring a data series to a number M determined in advance; a state-metric computation section configured to compute a state metric of a candidate for a surviving state surviving in the trellis by making use of the branch metric; a detection section configured to detect a minimum state metric which is a smallest state metric among state metrics each computed as a candidate for a surviving state; a storage section configured to store states, which have been each originated through branches in the trellis from an effective state reached by going upstream from a state with the minimum state metric through the branches in the trellis by a distance of (L−1) time units where L is a cutoff length used as a unit for cutting off a process to infer the data series, as surviving states; and a selection section configured to select a candidate, which corresponds to the effective state to serve as a candidate for data composing the data series, to be used to serve as a candidate for the inferred value of the data.

A data processing method provided for a data processing apparatus, which is used for inferring a data series, in accordance with the first embodiment of the present invention includes the steps of: computing a branch metric while limiting the number of child states each originated from a parent state in a trellis used for inferring the data series to a number M determined in advance; computing a state metric of a candidate for a surviving state surviving in the trellis by making use of the branch metric; detecting a minimum state metric which is a smallest state metric among state metrics each computed as the state metric of a candidate for a surviving state; storing states, which have been each originated through branches in the trellis from an effective state reached by going upstream from a state with the minimum state metric through the branches in the trellis by a distance of (L−1) time units where L is a cutoff length used as a unit for cutting off a process to infer the data series, as surviving states; and selecting a candidate, which corresponds to the effective state to serve as a candidate for data composing the data series, to be used to serve as a candidate for the inferred value of the data.

In accordance with the data processing apparatus according to the first embodiment of the present invention and the data processing method provided for the data processing apparatus, processing is carried out by executing the steps of: computing a branch metric while limiting the number of child states each originated from a parent state in a trellis used for inferring the data series to a number M determined in advance; computing a state metric of a candidate for a surviving state surviving in the trellis by making use of the branch metric; detecting a minimum state metric which is a smallest state metric among state metrics each computed as a state metric of the candidate for the surviving state; storing states, which have been each originated through branches in the trellis from an effective state reached by going upstream from a state with the minimum state metric through the branches in the trellis by a distance of (L−1) time units where L is a cutoff length used as a unit for cutting off a process to infer the data series, as surviving states; and selecting a candidate, which corresponds to the effective state to serve as a candidate for data composing the data series, to be used to serve as a candidate for the inferred value of the data.

In accordance with a second embodiment of the present invention, there is provided a data processing apparatus which limits the number of candidates for surviving states surviving in a trellis used for computing a data series to $M^L$, where M is a predetermined number and L is a cutoff length used as a unit for cutting off a process to infer the data series, in processing to: limit the number of child states each originated from a parent state in the trellis to the predetermined number M; and make use of a state series having a length equal to the cutoff length in outputting an inferred value of data composing the data series.

The data processing apparatus described above as a data processing apparatus according to the second embodiment of the present invention limits the number of candidates for surviving states surviving in a trellis used for computing a data series is limited to $M^L$, where M is a predetermined number and L is a cutoff length used as a unit for cutting off a process to infer the data series, in processing to: limit the number of child states each originated from a parent state in the trellis to the predetermined number M; and make use of a state series having a length equal to the cutoff length in outputting an inferred value of data composing the data series.

It is to be noted that the data processing apparatus can be designed as an independent apparatus or internal blocks composing an apparatus.

In addition, the data processing program can be presented to the user by transmitting the program through a transmission medium or recording the program on a recording medium to be given to the user.

In accordance with the first and second embodiments of the present invention, it is possible to infer a data series and, particularly, to infer a data series by making use of a trellis with a high degree of precision while reducing the number of surviving states surviving in the trellis.

BRIEF DESCRIPTION OF THE DRAWINGS

FIG. 5 is another diagram showing the trellis used in processing carried out by the transmitted-series inference section in order to infer a transmitted symbol;

FIG. 6 is a further diagram showing the trellis used in processing carried out by the transmitted-series inference section in order to infer a transmitted symbol;

FIGS. 7A to 7C are diagrams used for an explanation of a method for limiting the number of states originated from a surviving state to a limited state count M;

DETAILED DESCRIPTION OF THE PREFERRED EMBODIMENTS

Figure 3:
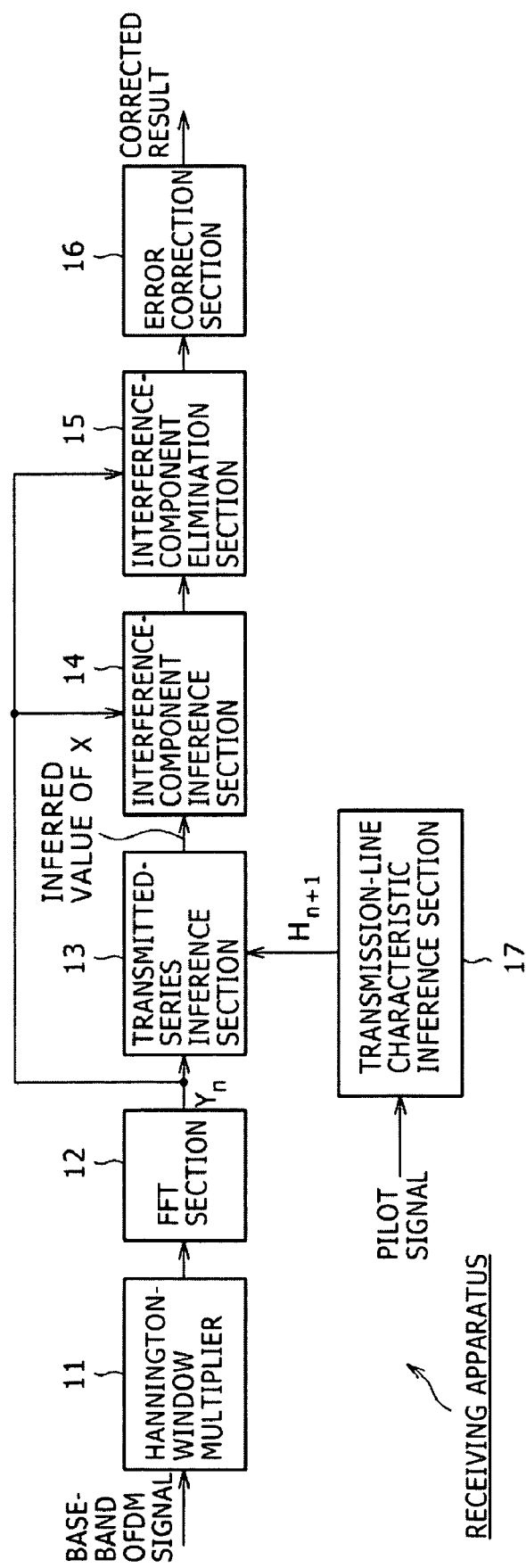
FIG. 3 is a block diagram showing a typical configuration of a receiving apparatus according to an embodiment of the present invention.

FIG. 3 is a block diagram showing a typical configuration of a receiving apparatus according to an embodiment of the present invention.

The receiving apparatus shown in the block diagram of FIG. 3 is an apparatus for receiving an OFDM signal typically conforming to ISDB-T standards and processing the signal.

As shown in the block diagram of FIG. 3, the receiving apparatus employs a Hannington-window multiplication section 11, an FFT section 12, a transmitted-series inference section 13, an interference-component inference section 14, an interference-component elimination section 15, an error correction section 16 and a transmission line characteristic inference section 17.

The Hannington-window multiplication section 11 is a section for receiving a base-band OFDM signal which is a signal in the time domain. The Hannington-window multiplication section 11 applies typically a window function such as a Hannington window to the OFDM signal and supplies the OFDM signal obtained as a result of applying the window function to the FFT section 12.

The FFT section 12 is a section for carrying out an FFT process on the OFDM signal received from the Hannington-window multiplication section 11 and supplying a reduced-interference signal $Y_n$ obtained as a result of the FFT process to the transmitted-series inference section 13, the interference-component inference section 14 and the interference-component elimination section 15. The reduced-interference signal $Y_n$ is a signal expressed by Eq. (1) given earlier.

The Hannington window can be applied to an OFDM signal in the time region as described above or, as an alternative, an OFDM signal in the frequency region.

In the case of the receiving apparatus shown in the block diagram of FIG. 3, the Hannington window is applied by the Hannington-window multiplication section 11 to the OFDM signal which is a signal in the time domain. Then, the FFT section 12 carries out an FFT process on the OFDM signal received from the Hannington-window multiplication section 11 in order to generate a reduced-interference signal $Y_n$ expressed by Eq. (1) given earlier as a result of the FFT process. However, it is also possible to first carry out the FFT process on the OFDM signal which is a signal in the time domain in order to produce an OFDM signal in the frequency domain and, then, apply the Hannington window to the OFDM signal in the frequency domain in order to generate the reduced-interference signal $Y_n$ expressed by Eq. (1) given earlier.

Let reference notation $R_n$ denote the frequency-domain OFDM signal obtained as a result of the FFT process on the OFDM signal which is a signal in the time domain. In this case, the frequency-domain OFDM signal $R_n$ is expressed by Eq. (2) as follows.

[Eq. 2]

$$R_n = X_n H_n + N_{ISI} + H_{ICI} + N_{AWGN} \quad (2)$$

It is to be noted that, in the above equation, reference notation $H_{ICI}$ denotes an inter-carrier interference included in the frequency-domain OFDM signal $R_n$, reference notation $N_{ISI}$ denotes an inter-symbol interference included in the frequency-domain OFDM signal $R_n$ whereas reference notation $N_{AWGN}$ denotes an additivity white noise included in the frequency-domain OFDM signal $R_n$.

In the following description, the inter-carrier interference $H_{ICI}$ and the inter-symbol interference Nisi are collectively referred to as an interference component.

As described above, if a delayed wave (or a multipath echo) with a delay exceeding the length of a guard interval exists, the effect of the interference component becomes stronger so that the signal reception characteristic of the receiving apparatus deteriorates considerably.

If the Hannington window is applied to the frequency-domain OFDM signal $R_n$ expressed by Eq. (2) given above, the interference component included in the reduced-interference signal $Y_n$ expressed by Eq. (1) is limited to inter-symbol interferences $N_{ISI}$ from carriers #(n−1) and #(n+1) on both sides of carrier #n and inter-carrier interferences $H_{ICI}$ also from carriers #(n−1) and #(n+1). That is to say, it is possible to repress inter-symbol interferences $N_{ISI}$ from other carriers and inter-carrier interferences $H_{ICI}$ also from the other carriers.

The processing of applying the Hannington window to the frequency-domain OFDM signal $R_n$ expressed by Eq. (2) in order to obtain the reduced-interference signal $Y_n$ expressed by Eq. (1) can be carried out by convoluting the frequency-domain OFDM signal $R_n$ with Hannington-window coefficients of −(½), 1 and −(½).

That is to say, the processing of applying the Hannington window to the time-domain OFDM signal can be carried out by multiplying the OFDM signal by the Hannington-window coefficients in the time domain. On the other hand, the processing of applying the Hannington window to the frequency-domain OFDM signal can be carried out by convoluting the OFDM signal with the Hannington-window coefficients in the frequency domain.

As described earlier, the reduced-interference signal $Y_n$ expressed by Eq. (1) can be regarded as convolution codes. Thus, the transmitted symbols $X_n$ on the right-hand side of the expression of Eq. (1) can be inferred by carrying out an inference process making use of a trellis as explained previously.

By applying the Hannington window to the OFDM signal in the receiving apparatus shown in the block diagram of FIG. 3, it is therefore possible to establish a constraint condition of Eq. (1) as a condition for inferring a symbol series consisting of transmitted symbols $X_n$ by making use of a trellis. The series of symbols is the data series mentioned earlier.

The transmitted-series inference section 13 is a data processing apparatus for inferring the data series by making use of a trellis. The transmitted-series inference section 13 infers the data series from the reduced-interference signal $Y_n$ which is received from the FFT section 12 as convolution codes. As mentioned above, the data series is a symbol series which consists of transmitted symbols $X_n$. The transmitted-series inference section 13 generates inferred values of the transmitted symbols $X_n$ and supplies the inferred values to the interference-component inference section 14.

In addition to the reduced-interference signal $Y_n$ received from the FFT section 12 as convolution codes, the transmitted-series inference section 13 also receives transmission-line information $H_{n+1}$ from the transmission line characteristic inference section 17.

By making use of a trellis, the transmitted-series inference section 13 infers the transmitted symbols $X_n$ from the reduced-interference signal $Y_n$ received from the FFT section 12 as convolution codes and the transmission-line information $H_{n+1}$ received from the transmission line characteristic inference section 17. As explained above, the transmitted symbols $X_n$ are symbols composing the series of symbols which is the data series mentioned before.

To put it concretely, the transmitted-series inference section 13 finds the transmitted symbol $X_{n+1}$ or, strictly speaking, the received value $X'_{n+1}$ of the transmitted symbol $X_{n+1}$, from the reduced-interference signal $Y_n$ received from the FFT section 12 and the transmission-line information $H_{n+1}$ received from the transmission line characteristic inference section 17 in accordance with Eq. (3) given below. Eq. (3) expressing the transmitted symbol $X_{n+1}$ is an expression derived from Eq. (1), which expresses the reduced-interference signal $Y_n$, by ignoring the noise component $N_n$.

[Eq. 3] \quad (3)

$$X_{n+3} = \frac{Y_n + \frac{1}{2} X_{n-1} H_{n-1} - X_n H_n}{-\frac{1}{2} H_{n+1}}$$

Then, as will be described later in detail, the transmitted-series inference section 13 produces the inferred value of each transmitted symbol included in the series of symbols on the basis of the received value $X'_{n+1}$ of the transmitted symbol $X_{n+1}$. The inferred value is found by limiting the number of child states that can be originated from a parent state in a trellis used for inferring the symbol series consisting of transmitted symbols to a limited state count M and making use of a state series having a length equal to a cutoff length L which is used as the cutoff unit of the process of inferring the series of symbols. In the process of inferring the series of symbols, the number of candidates for surviving states surviving in the trellis is limited to $M^L$.

The interference-component inference section 14 is a section for inferring the interference component included in the reduced-interference signal $Y_n$ by making use of the reduced-interference signal $Y_n$ received from the FFT section 12 and inferred values received from the transmitted-series inference section 13 as inferred values of transmitted symbols composing the series of symbols. The interference-component inference section 14 supplies the inferred value of the interference component to the interference-component elimination section 15.

The interference-component elimination section 15 is a section for removing the interference component represented by the inferred value supplied by the interference-component inference section 14 from the reduced-interference signal $Y_n$ supplied by the FFT section 12 and supplying a signal obtained as a result of the process of removing the interference component from the reduced-interference signal $Y_n$ to the error correction section 16.

The error correction section 16 is a section for carrying out an error correction process on the interference-component free signal received from the interference-component elimination section 15 and generating a series of information bits composing the transmitted symbols as a result of the error correction process. The series of information bits is an information series transmitted by a signal transmitting apparatus by adoption of the OFDM technique.

A pilot signal according to the OFDM technique is supplied to the transmission line characteristic inference section 17. The transmission line characteristic inference section 17 is a section for inferring the transmission-line information $H_{n+1}$ from the OFDM pilot signal and supplying the transmission-line information $H_{n+1}$ to the transmitted-series inference section 13.

Figure 4:
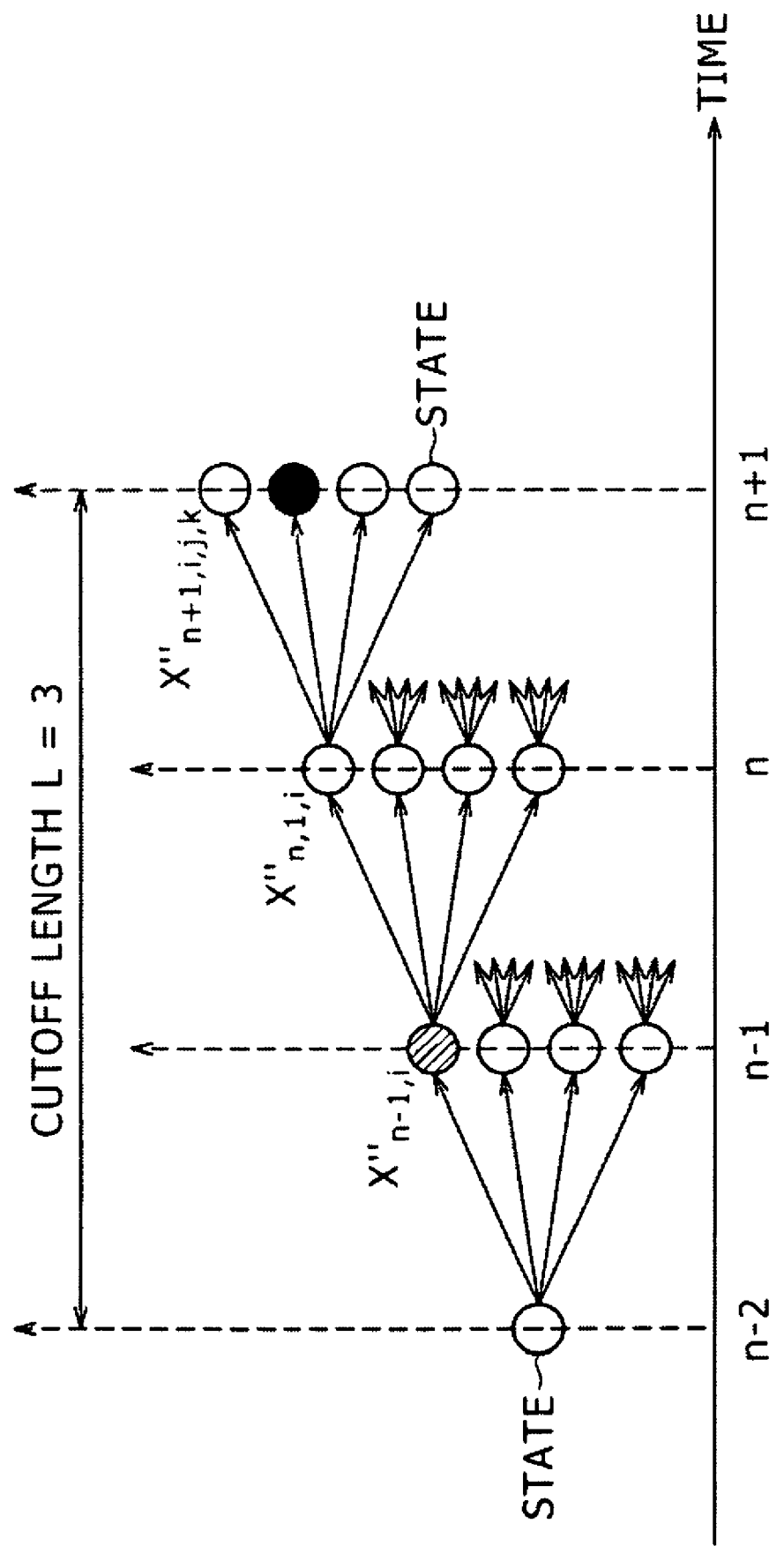
FIG. 4 is a diagram showing a trellis used in processing carried out by a transmitted-series inference section of the receiving apparatus in order to infer a transmitted symbol.

Next, processing carried out by the transmitted-series inference section 13 to infer transmitted symbols is explained by referring to trellis diagrams of FIGS. 4 to 6.

While limiting the number of child states that can be originated from a parent state in a trellis used for inferring the symbol series consisting of transmitted symbols to a limited state count M, the transmitted-series inference section 13 computes the branch metric BM of each branch emanating from the parent state to one of the M child states where reference notation M denotes the limited-state count.

In addition, the transmitted-series inference section 13 also computes the state metric sm of each specific one of the M child states, where reference notation M denotes the limited-state count, by making use of the branch metric BM computed for the branch emanating from the parent state to the specific child state. Subsequently, the transmitted-series inference section 13 determines an effective state by making use a state series having a length equal to the cutoff length L. Then, the transmitted-series inference section 13 finds an inferred value of a transmitted symbol from the effective state and outputs the inferred value to the interference-component inference section 14.

The transmitted-series inference section 13 repeatedly carries out the processing described above every time the transmitted-series inference section 13 receives the reduced-interference signal $Y_n$ from the FFT section 12.

FIG. 4 is a trellis diagram showing a trellis in which the limited state count M is set at 4 whereas the cutoff length L is set at 3, meaning that the number of time units spread along the state series is 3. In a trellis shown in each of the trellis diagrams of FIGS. 5 and 6, the limited state count M is also set at 4 whereas the cutoff length L is set at 3 as well.

As described earlier, the cutoff length L is the cutoff unit of the process of inferring a series of symbols. The cutoff length L represents the number of aforementioned received values from which the inferred value of one transmitted symbol is output. In other words, the cutoff length L represents the number of received values from which one transmitted symbol is inferred. Thus, in the case of a cutoff length L set at 1 for example, the inferred value of one transmitted symbol is output by making use of one received value. In this case, however, the cutoff length L set at 1 cannot be used in the processing carried out to infer a series of symbols.

In the case of a cutoff length L set at 3 for example, the inferred value of 1 transmitted symbol is output by making use of three received values, that is, by making use of a state series having a length equal to the cutoff length L which has a magnitude of three time units.

Let attention be paid to a time t=n+1 for example. The transmitted-series inference section 13 limits the number of child states that can be originated from each surviving parent state for the time t=n leading ahead of the time t=n+1 by an interval of one time unit to the limited state count M which has been set at 4. The transmitted-series inference section 13 computes the branch metric BM of the branch emanating from a surviving parent state for the time t=n to each of the four (=M) child states for the time t=n+1. The transmitted-series inference section 13 computes the branch metric BM for every branch emanating from each surviving parent state.

The following description explains a method for limiting the number of child states that can be originated as child states for the time t=n+1 from a surviving parent state for the time t=n in a trellis used for inferring the symbol series consisting of transmitted symbols to a limited state count M which has been set at 4.

With the attention paid to a time t=n+1 shown in the trellis diagram of FIG. 4, let reference notation $X''_{n,i,j}$ denote the jth candidate for the inferred value of a transmitted symbol $X_n$ for the time t=n leading ahead of the time t=n+1 by an interval of one time unit.

Let reference notation $X''_{n-1,i}$ denote the ith candidate for the inferred value of a transmitted symbol $X_{n-1}$ for the time t=n−1 leading ahead of the time t=n by an interval of one time unit. The ith candidate $X''_{n-1,i}$ corresponds to a surviving parent state from which a child state is originated through a branch. As described above, the jth candidate $X''_{n,i,j}$ is a candidate which is provided for the inferred value of the transmitted symbol $X_n$ to serve as a candidate corresponding to this child state. In the following description, a candidate for an inferred value of a transmitted symbol is also referred to as a symbol candidate whereas a state corresponding to a symbol candidate is also referred to as a surviving state. For example, a state corresponding to the jth symbol candidate $X''_{n,i,j}$ is referred to as a surviving state $X''_{n,i,j}$ whereas a state corresponding to the ith symbol candidate $X''_{n-1,i}$ is referred to as a surviving state $X''_{n-1,i}$.

Reference notation $X''_{n+1,i,j,k}$ denotes a kth symbol candidate $X''_{n+1,i,j,k}$ corresponding to a child state $X''_{n+1,i,j,k}$ originated through a branch from a surviving parent state $X''_{n,i,j}$ for a time t=n to serve as a state for a time t=n+1.

In the trellis, the child state $X''_{n+1,i,j,k}$ for the time t=n+1 is the end of a branch emanating from the surviving parent state $X''_{n,i,j}$ for the time t=n whereas the parent state $X''_{n+1,i,j}$ for the time t=n is the end of a further branch emanating from the surviving grandparent state $X''_{n,i}$ for the time t=n.

With the attention be paid to the time t=n+1, child states are originated through their respective branches emanating from the surviving parent state $X''_{n,i,j}$ for the time t=n leading ahead of the time t=n+1 by an interval of one time unit. A child state $X''_{n+1,i,j,k}$ originated as a child state for the time t=n+1 from the surviving parent state $X''_{n,i,j}$ through a branch, the branch metric BM thereof is to be computed, is selected from child states that can be originated from the surviving parent state $X''_{n,i,j}$ on the basis of state metrics sm of the child states. Thereafter, the selected child state $X''_{n+1,i,j,k}$ serves as a candidate for a surviving state for the time t=n+1. In the following description, the child state $X''_{n+1,i,j,k}$ serving as a candidate for a surviving state for the time t=n+1 is also referred to as a surviving candidate $X''_{n+1,i,j,k}$.

It is to be noted that each of the suffixes i, j and k is a suffix associated with the observation times t=n−1, n or n+1 respectively. Each of the suffixes i, j and k has one of four (=L) values 0, 1, 2 and 3(=L−1). The suffix n is a suffix representing the time t=n.

The transmitted-series inference section 13 finds the branch metric BM of the branch emanating from the surviving parent state $X''_{n,i,j}$ for the time t=n to the surviving candidate $X''_{n+1,i,j,k}$ for the time t=n+1. Then, the transmitted-series inference section 13 adds the branch metric BM to the state metric sm of the surviving parent state $X''_{n,i,j}$ in order to find the state metric sm of the surviving candidate $X''_{n+1,i,j,k}$.

Subsequently, the transmitted-series inference section 13 detects a minimum state metric sm which is the smallest state metric among the state metrics sm of the surviving candidates $X''_{n+1,i,j,k}$. Then, the transmitted-series inference section 13 detects a surviving grandparent state $X''_{n-1,i}$ which is reached by going upstream from the surviving candidate $X''_{n+1,i,j,k}$ with the minimum state metric sm in the trellis by a distance of (L−1) time units where L is a cutoff length used as a unit for cutting off a process to infer the data series, to serve as a surviving grandparent state $X''_{n-1,i}$ for the time t=n−1. In the case of the trellis shown in the trellis diagram of FIG. 4, the cutoff length L is set at 3. Thus, the surviving grandparent state $X''_{n-1,i}$ is reached by going upstream from the surviving candidate $X''_{n+1,i,j,k}$ with the minimum state metric sm by a distance of 2(=3−1) time units to serve as a surviving grandparent state $X''_{n-1,i}$ for the time t=n−1. In the following description, the surviving grandparent state $X''_{n-1,i}$ for the time t=n−1 is referred to as an effective state $X''_{n-1,i}$ for the time t=n−1.

FIG. 5 is a diagram showing a trellis which includes the effective state $X''_{n-1,i}$ for the time t=n−1. In the trellis diagram of FIG. 5, the effective state $X''_{n-1,i}$ for the time t=n−1 is shown as a state $S_{n+1}$.

In the trellis diagram of FIG. 5, a state $S_{n+1}$ for the time t=n+1 is the surviving candidate $X''_{n+1,i,j,k}$ with the minimum state metric sm. That is to say, the state $S_{n+1}$ is a surviving candidate with the smallest state metric among the state metrics sm of the surviving candidates $X''_{n+1,i,j,k}$ shown in the trellis diagram of FIG. 4 as the surviving candidates $X''_{n+1,i,j,k}$ for the time t=n+1.

In the trellis shown in the trellis diagram of FIG. 5, the transmitted-series inference section 13 determines a particular state $S_{n-1}$ selected among surviving grandparent states $X''_{n-1,i}$ for the time t=n−1 leading ahead of the time t=n−1 by an interval of two (=L−1) time units. The particular state $S_{n-1}$ serving as the surviving grandparent state $X''_{n-1,i}$ for the time t=n−1 is reached by going upstream through branches in the trellis from the state $S_{n+1}$ serving as the surviving candidate $X''_{n+1,i,j,k}$ with the smallest state metric among the state metrics sm of the surviving candidates $X''_{n+1,i,j,k}$ for the time t=n+1 by a distance of two (=L−1) time units to serve as the effective state $X''_{n-1,i}$ for the time t=n−1. Thus, in the trellis shown in the trellis diagram of FIG. 5, the effective state $S_{n-1}$ is a surviving state $X''_{n-1,i}$ for the time t=n−1 whereas the surviving candidate $S_{n+1}$ is a surviving state $X''_{n+1,i,j,k}$ for the time t=n+1.

Then, the transmitted-series inference section 13 stores particular surviving states $X''_{n-1,i}$, $X''_{n,i,j}$ and $X''_{n+1,i,j,k}$ in a memory as new surviving states. The particular surviving states $X''_{n-1,i}$, $X''_{n,i,j}$ and $X''_{n+1,i,j,k}$ are surviving states that are connected by branches between the effective state $S_{n-1}$ serving as the surviving grandparent state $X''_{n-1,i}$ for the time t=n−1 and the state $S_{n+1}$ serving as the surviving candidate $X''_{n+1,i,j,k}$ for the time t=n+1. In the case of the trellis shown in the trellis diagram of FIG. 5, the particular surviving state for the time t=n−1 is the effective state $S_{n-1}$. The particular surviving state for the time t=n+1 is the surviving candidate $S_{n+1}$. The particular surviving state for the time t=n is the surviving parent state $X''_{n,i,j}$ placed on branches between the effective state $S_{n-1}$ and the surviving candidate $S_{n+1}$. The surviving parent state $X''_{n,i,j}$ for the time t=n is said to be originated directly from the surviving grandparent state $X''_{n-1,i}$ for the time t=n−1 whereas the surviving candidate $X''_{n+1,i,j,k}$ for the time t=n+1 is said to be originated indirectly from the surviving grandparent state $X''_{n-1,i}$. The new surviving states stored in the memory are referred to as a path between the effective state $S_{n-1}$ and a state indirectly originated from the effective state $S_{n-1}$ as a new surviving state for the most recent time t which is the time t=n+1 in the case of the trellis shown in the trellis diagram of FIG. 5. States other than the effective state $X''_{n-1,i}$ for the time t=n−1, the surviving parent state $X''_{n,i,j}$ placed on branches between the effective state $S_{n-1}$ and the surviving candidate $S_{n+1}$ to serve as a surviving parent state $X''_{n,i,j}$ for the time t=n and the surviving candidate $X''_{n+1,i,j,k}$ for the time t=n+1 are excluded from being selected as surviving states.

Then, the transmitted-series inference section 13 selects a symbol candidate $X''_{n-1,i}$ corresponding to the effective state $S_{n-1}$ for the time t=n−1 leading ahead of for the time t=n+1 by an interval of two time units to serve as the inferred value of the transmitted symbol $X_{n-1}$ and outputs the inferred value. That is to say, the transmitted-series inference section 13 cuts off the processing to infer the transmitted symbol $X_{n-1}$ at the end of the state series having a length equal to the cutoff length L and outputs the result of the symbol inference processing. In the trellis diagram of FIG. 5, the state series is a state series having a length of three (=L) unit times between the time t=n−2 and the time t=n+1.

Then, the transmitted-series inference section 13 limits the number of child states that can be originated as child states for a time t=n+2 from one surviving parent state for the time t=n+1 in the trellis used for inferring the symbol series consisting of transmitted symbols to a limited state count M which has been set at 4. Subsequently, the transmitted-series inference section 13 computes the branch metric BM of the branch emanating from a surviving parent state for the time t=n+1 to each of the four (=M) child states for the time t=n+2. The transmitted-series inference section 13 computes the branch metric BM for every branch emanating from each surviving parent state. Thereafter, the same processing as the processing described above is carried out.

FIG. 6 is a diagram showing a trellis with attention paid to the time t=n+2.

In the case of the trellis shown in the trellis diagram of FIG. 6, only offspring states originated from the effective state $S_{n-1}$ for the time t=n−1 exists as surviving states. In addition, for the most recent time, that is, for the time t=n+2 to which the attention is being paid currently, only each of child states directly originated from a surviving parent state for the time t=n+1 leading ahead of the time t=n+2 by an interval of one time unit becomes a surviving candidate.

That is to say, surviving candidates are selected from states for the time t=n+2 lagging behind the time t=n−1 of the effective states $S_{n-1}$ by three (=L) time units.

As described above, the transmitted-series inference section 13 limits the number of present-time child states each originated from one surviving parent state for a time leading ahead of the present time currently drawing attention by an interval of one time unit to serve as a surviving candidate for the present time to the limited state count M which has been set at 4.

Thus, the (total) number of child states each originated directly from an effective parent state for a time t=n to serve as a child state for a time t=n+1 lagging behind the time t=n by an interval of one time unit is the limited state count M.

Therefore, the total number of child states originated from M surviving parent states for a time t=n+1 to serve as child states for a time t=n+2 lagging behind the time t=n+1 by an interval of one time unit is $M^2$ which is the limited state count M squared. This is because the number of child states each originated from one of the M surviving parent states for a time t=n+1 to serve as a child state for a time t=n+2 lagging behind the time t=n+1 by an interval of one time unit is limited to the limited state count M.

The process of originating child states from a parent state as described above is repeated in the same way from generation to generation so that the total number of offspring states each originated from one effective ancestor state for a time t=n to serve as an offspring state for a time t=n+T lagging behind the time t=n by T time units is $M^T$ which is the Tth power of the limited state count M.

By the way, as described above, the time of a surviving candidate is the time t=n+L lagging behind the time t=n of the effective state by L time units.

Thus, the total number of surviving candidates originated from the effective state is $M^L$. In the case of the trellises shown in the diagrams of FIGS. 4 to 6 for example, the limited state count M is set at 4 whereas the cutoff length L is set at 3. Thus, the total number of surviving candidates is limited to 64(=$4^3$).

Next, by referring to diagrams of FIG. 7, the following description explains a method for limiting the number of child states each originated from one surviving parent state for a time t=n to serve as a surviving candidate for a time t=n−1 to the limited state count M.

The number of child states each originated from one surviving parent state for a time t=n to serve as a surviving candidate for a time t=n+1 is also the number of branches connecting the surviving parent state for a time t=n to the surviving candidates for a time t=n+1. The number of child states which can each be originated from one surviving parent state for a time t=n to serve as a surviving candidate for a time t=n+1 is equal to the number of signal points existing on the IQ constellation plane of the first-order modulation process.

The transmitted-series inference section 13 carries out an originated-state limiting process based on an originated-state limiting method for limiting the number of child states each originated from one surviving parent state for a time t=n to serve as a surviving candidate for a time t=n+1 to the limited state count M which also represents the number of child states included in as many possible child states as signal points existing on the IQ constellation plane of the first-order modulation process.

In accordance with a first originated-state limiting method adopted as a typical originated-state limiting method, the branch metric BM of each branch connecting the surviving parent state for a time t=n to one of the possible child states the number of which is equal to the number of signal points existing on the IQ constellation plane of the first-order modulation process. Than, child states connected by M branches having smallest branch metrics BM to the surviving parent state for a time t=n are selected to serve as surviving candidates for a time t=n+1.

In accordance with the first originated-state limiting method, however, it is necessary to compute as many branch metrics BM as signal points existing on the IQ constellation plane of the first-order modulation process.

In order to solve the problem described above, a second originated-state limiting method is adopted. In accordance with the second originated-state limiting method, the number of surviving candidates for a time t=n+1 is limited to the number of states corresponding to symbol candidates represented by M signal points close to a particular point existing on the IQ constellation plane of the first-order modulation process. The particular point existing on the IQ constellation plane of the first-order modulation process is a point corresponding to the received value X' of the transmitted symbol X to be computed in accordance with a constraint condition of Eq. (1) used for inferring a series of symbols by making use of a trellis.

To put it in detail, in accordance with the second originated-state limiting method, the transmitted-series inference section 13 selects M signal points from signal points existing on the IQ constellation plane of the first-order modulation process. Each of the M selected signal points is a point closest to the particular point existing on the IQ constellation plane of the first-order modulation process. The particular point existing on the IQ constellation plane of the first-order modulation process is a point corresponding to the received value $X'_{n+1}$ of a transmitted symbol $X_{n+1}$ to be computed in accordance with Eq. (3) which is derived from Eq. (1). That is to say, the transmitted-series inference section 13 detects M signal points closest to the received value $X'_{n+1}$ of the transmitted symbol $X_{n+1}$ which is computed in accordance with Eq. (3). Then, the transmitted-series inference section 13 takes each of states corresponding to symbol candidates represented by the M signal points as a surviving candidate.

FIGS. 7A to 7C are diagrams showing four (=M) signal points detected in accordance with the second originated-state limiting method as signal points close to the received value $X'_{n+1}$ of a transmitted symbol $X_{n+1}$ with the limited state count M set at 4.

To be more specific, FIG. 7A is a diagram showing the four detected signal points with the QPSK modulation process carried out as the first-order modulation process.

In the case of the QPSK modulation process, the number of signal points existing on the IQ constellation plane is four. Thus, the four points existing on the IQ constellation plane are detected as the four signal points close to the received value $X'_{n+1}$.

FIG. 7B is a diagram showing the four detected signal points with the 16QAM modulation process carried out as the first-order modulation process.

In the case of the 16QAM modulation process, the number of points existing on the IQ constellation plane is 16. Thus, IQ-constellation signal points closest to the received value $X'_{n+1}$ are selected among the 16 points existing on the IQ constellation plane and detected as the four close signal points.

FIG. 7C is a diagram showing the four detected signal points with the 64QAM modulation process carried out as the first-order modulation process.

In the case of the 64QAM modulation process, the number of points existing on the IQ constellation plane is 64. Thus, IQ-constellation signal points closest to the received value $X'_{n+1}$ are selected among the 64 points existing on the IQ constellation plane and detected as the four close signal points.

It is to be noted that the M surviving candidates obtained by adoption of the second originated-state limiting method all but match the M closest child states having smallest branch metrics BM.

In addition, without regard to whether the first or second originated-state limiting method is adopted, in the case of the 64QAM modulation process in which the number of points existing on the IQ constellation plane is 64, a number of child states are dropped, that is, excluded from being selected as surviving candidates.

Even if child states that will be otherwise dropped are left as surviving candidates, it is all but out of the bounds of possibility that one of such child states is eventually selected as an effective state. Thus, the operations to limit the number of surviving candidates to limited state count M and drop a number of child states have only a very small effect on the signal reception characteristic.

In addition, the IQ-constellation signal points close to the received value $X'_{n+1}$ can be found in advance as points for (a range of) coordinates (I,Q) associated with the received value $X'_{n+1}$ as (a range of) coordinates (I,Q) on the IQ constellation plane. Thus, in comparison with the first originated-state limiting method which requires that branch metrics BM be computed, the second originated-state limiting method allows surviving candidates to be found fast by carrying out a small amount of processing.

By the way, the transmitted-series inference section 13 is capable of reducing the number of surviving states by selecting only offspring states originated from an effective ancestor state among surviving states and surviving candidates in the trellis and storing each of the offspring states in a memory as a new surviving state as described before.

Figure 1:
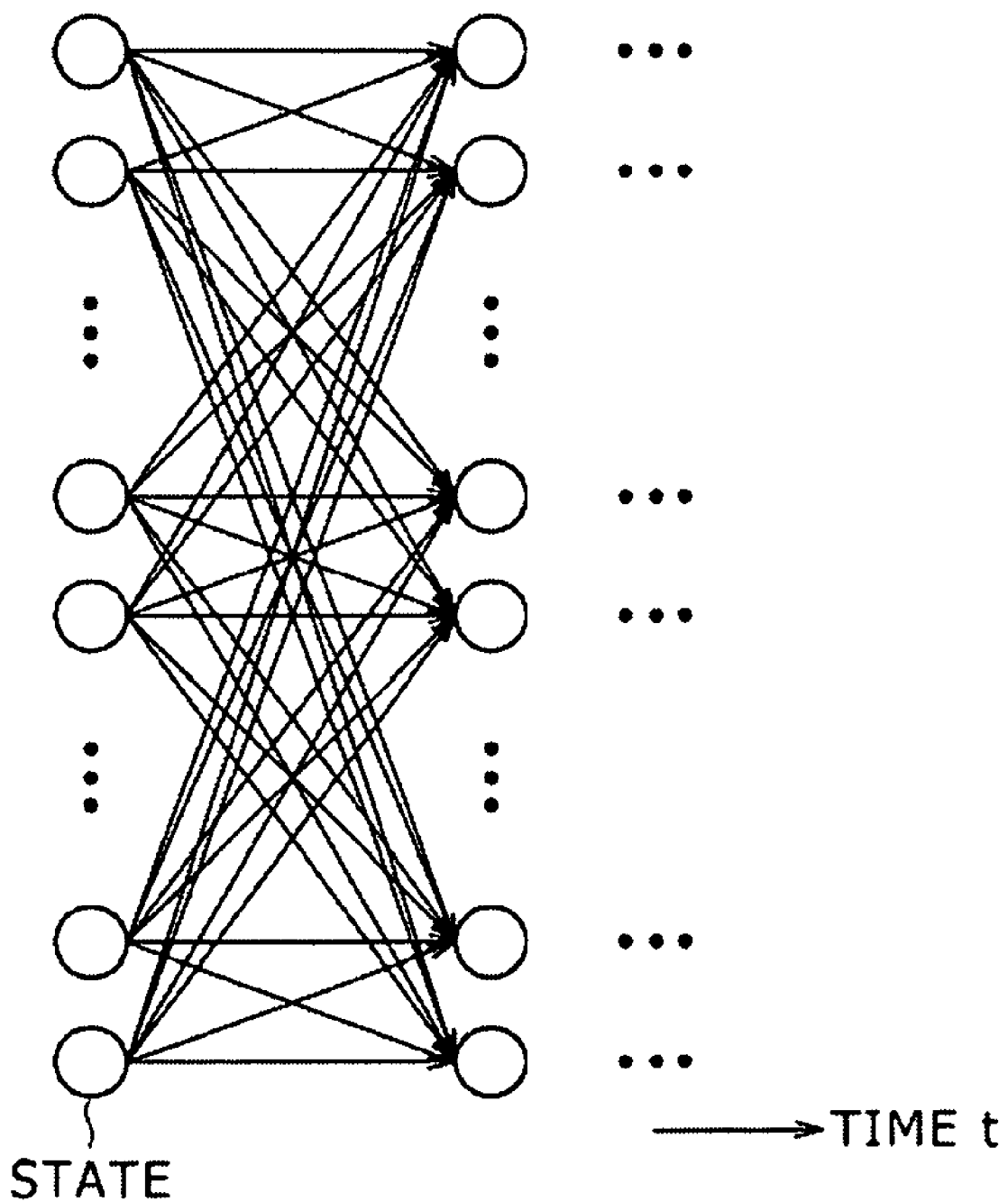
FIG. 1 is a diagram showing a trellis of a general Viterbi decoding method.
Figure 2A:
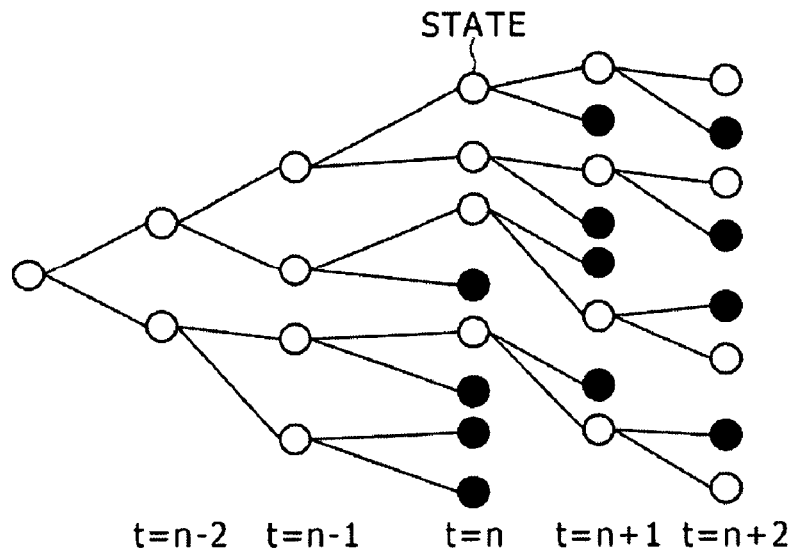
FIGS. 2A to 2C are explanatory trellis diagrams to be referred to in description of an M algorithm.
Figure 2B:
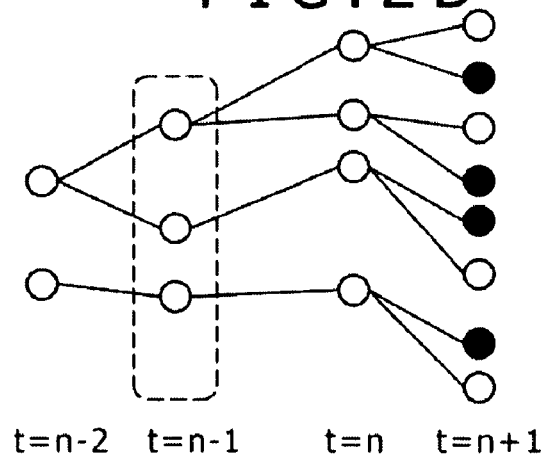
Figure 2C:
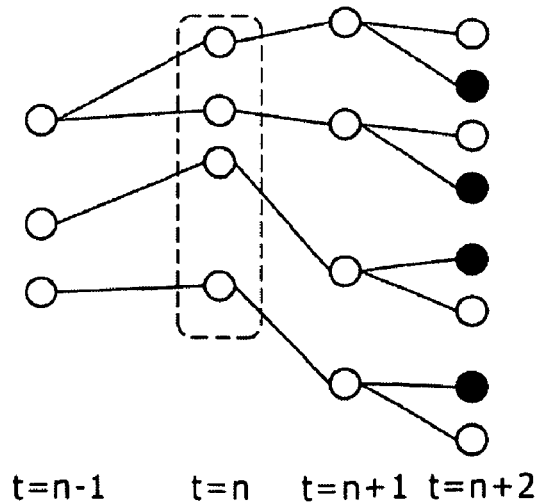
Figure 8:
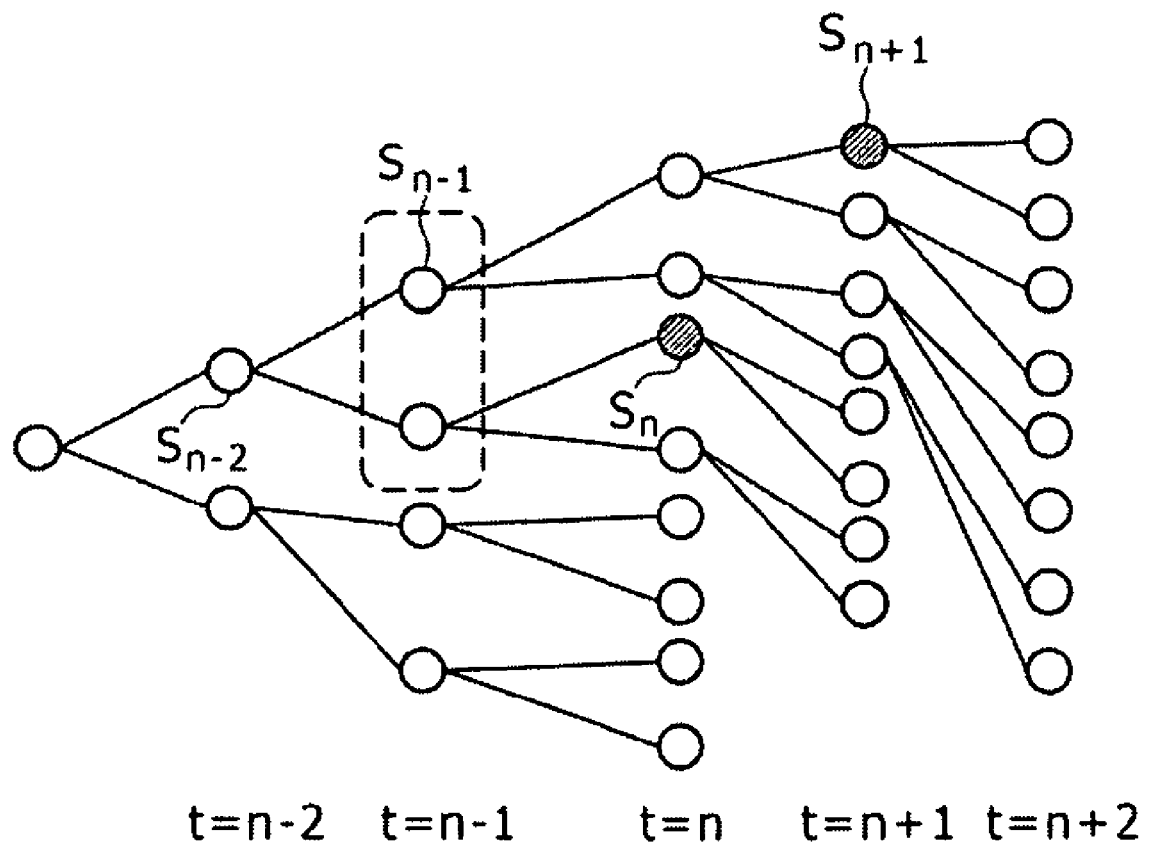
FIG. 8 is a diagram showing a trellis to be referred to in description of an M algorithm, in which the limited state count M is set at 2 and a most recent surviving state count C is set at 4.

To put it in detail, FIG. 8 is given as a diagram showing a trellis used in a process carried out by the transmitted-series inference section 13 to infer a transmitted symbol as a trellis in which the limited state count M is set at 2 and the most recent surviving state count C is set at 4 in the same way as the M algorithm explained previously by referring to the trellis diagrams of FIGS. 2A to 2C. As explained before, the most recent surviving state count C is the number of surviving states selected at the most recent time.

In the following description, an algorithm adopted in the process carried out by the transmitted-series inference section 13 to infer a transmitted symbol is referred to as an X algorithm.

With the limited state count M set at 2, in the X algorithm, the most recent surviving state count C set at 4 means that the cutoff length L is 3.

Thus, in accordance with the X algorithm with attention paid to a time t=n for example, the number of child states originated from a surviving parent state for a time t=n−1 leading ahead of the time t=n by an interval of one time unit is limited to 2 at which the limited state count M is set. In addition, the branch metrics BM of branches connecting each of surviving parent states for a time t=n−1 to the M child states each serving as a surviving candidate for the time t=n are computed.

Then, in accordance with the X algorithm, the state metric sm of each of the child states each serving as a surviving candidate for the time t=n is computed by making use of the branch metric BM of the branch connecting the surviving parent state to the child state. Subsequently, the minimum state metric sm which is the smallest state metrics sm of the surviving candidates for the time t=n is identified. Then, a surviving state $S_{n-2}$ for the time t=n−2 is found as an effective state. The effective state $S_{n-2}$ for the time t=n−2 is found by going upstream from the surviving candidate $S_n$ having the minimum state metric sm for the time t=n through branches in the trellis by a distance of (L−1) time units where reference notation L denotes the cutoff length L. In the case of the typical example shown in the trellis diagram of FIG. 8, the surviving state $S_{n-2}$ for the time t=n−2 is found by going upstream from the surviving candidate having the minimum state metric sm through branches in the trellis by a distance of two (=3−1) time units because the cutoff length L has been set at 3.

Then, surviving states each included in the trellis as a surviving state originated directly from the effective state $S_{n-2}$ for the time t=n−2 and surviving candidates each included in the trellis as a surviving candidate originated for the time t=n indirectly from the effective state $S_{n-2}$ are stored in a memory as new surviving states.

Since the limited state count M has been set at 2 in this case, the number of child states each originated from the effective state $S_{n-2}$ serving as a parent state to serve as a surviving state for the time t=n−1 is two at which the limited state count M has been set. The number of child states each further originated from one of the surviving states for the time t=n−1 to serve as a surviving candidate for the time t=n is 4 which is the second power of the limited state count M. That is to say, the number of grandchild states originated indirectly from a parent state is 4 which is equal to the typical most recent surviving state count C of the M algorithm explained before by referring to the trellis diagrams of FIGS. 2A to 2C. Thus, the two surviving states for the time t=n−1 and the four candidates for the time t=n are stored in a memory as new surviving states cited above.

Then, at the time t=n+1, in accordance with the X algorithm, the number of child states each originated from one parent state for the time t=n leading ahead of the time t=n+1 by an interval of one time unit is also limited to the limited state count M which has been set at 2. There are four surviving parent states for the time t=n and each of the surviving parent states originates two child states each serving as a surviving candidate for the time t=n+1. The branch metrics BM of branches connecting each specific one of the four surviving parent states for the time t=n to the two surviving candidates originated from the specific surviving parent state are computed for each of the four surviving parent.

In addition, in accordance with the X algorithm, the state metric sm of each surviving candidate for the time t=n+1 is found by making use of the branch metric BM of the branch connecting the surviving candidate to the surviving parent state from which the surviving candidate is originated. Then, the smallest state metric among state metrics sm found for all surviving candidates for the time t=n+1 is detected. Subsequently, a surviving candidate $S_{n+1}$ with the smallest state metric sm is identified. Then, an ancestor state $S_{n-1}$ is found by going upstream through branches in the trellis from the surviving candidate $S_{n+1}$ by a distance of (L−1) time units where reference notation L denotes the cutoff length L which has been set at 3 and taken as an effective state. Since the cutoff length L has been set at 3 in the case of the typical trellis shown in the trellis diagram of FIG. 8, the ancestor state $S_{n-1}$ is found by going upstream through branches in the trellis from the surviving candidate $S_{n+1}$ by a distance of two (=3−1) time units.

Then, surviving states each included in the trellis as a surviving state originated directly from the effective state $S_{n-1}$ for the time t=n−1 and surviving candidates each included in the trellis as a surviving candidate originated for the time t=n+1 indirectly from the effective state $S_{n-1}$ are stored in a memory as new surviving states.

Since the limited state count M has been set at 2 in this case, the number of child states each originated from the effective state $S_{n-1}$ serving as a parent state to serve as a surviving state for the time t=n is 2 at which the limited state count M has been set. The number of child states each further originated from one of the surviving states for the time t=n to serve as a surviving state for the time t=n+1 is 4 which is the second power of the limited state count M. That is to say, the number of grandchild states originated indirectly from a parent state is 4 which is equal to the typical most recent surviving state count C of the M algorithm explained before by referring to the trellis diagrams of FIGS. 2A to 2C. Thus, the two surviving states for the time t=n and the four candidates for the time t=n+1 are stored in a memory as new surviving states cited above.

In accordance with the X algorithm, the processing described above is repeated thereafter.

As described before by referring to the trellis diagrams of FIGS. 2A to 2C, in accordance with the M algorithm, the number of surviving states which exist among states originated at times in the past and needs to be stored in a memory varies from time to time. In addition, with the limited state count M set at 2 and the most recent surviving state count C set at 4, the maximum value of the number of surviving states to be stored in a memory in accordance with the M algorithm for a time leading ahead of the present time by typically two time units is 4 as shown in the trellis diagram of FIG. 2C.

In accordance with the X algorithm, on the other hand, the number of states which exists among states originated at times in the past and needs to be stored in a memory is fixed all the time. With the limited state count M set at 2 and the most recent surviving state count C set at 4 for example, the maximum value of the number of states to be stored in a memory in accordance with the X algorithm for a time leading ahead of the present time by typically two time units is 2 as shown in the trellis diagram of FIG. 8.

To put it concretely, in accordance with the X algorithm, for example, four states indirectly originated from the effective state $S_{n-1}$ are selected from surviving candidates for the time t=n+1 to serve as new surviving states. In order to select the four states indirectly originated from the effective state $S_{n-1}$ from surviving candidates for the time t=n+1 to serve as new surviving states, however, it is necessary to store states each indirectly originated from the effective state $S_{n-2}$ to serve as a surviving state for the time t=n leading ahead of the time t=n+1 by an interval of one time unit in advance in a memory as surviving states.

By the same token, in order to select the four states indirectly originated from the effective state $S_{n-1}$ from surviving candidates for the time t=n+1 to serve as new surviving states, it is necessary to store states each directly originated from the effective state $S_{n-2}$ to serve as a surviving state for the time t=n−1 leading ahead of the time t=n+1 by an interval of two time units in advance in a memory as surviving states. The number of states each directly originated from the effective state $S_{n-2}$ to serve as a state for the time t=n−1 is 2 as indicated by an enclosing dashed line in the trellis diagram of FIG. 8. The number of such states stored in advance in the memory stays at 2 as long as the limited state count M remains at 2 and the cutoff length L is fixed at 3.

Thus, in the case of the X algorithm, the storage capacity of the memory used for storing states can be reduced. In the case of the M algorithm, up to four states need to be stored in a memory. In the case of the X algorithm, on the other hand, only two states need to be stored in a memory in order to carry out the processing.

As a result, in accordance with the X algorithm, the storage capacity of the memory used for storing states can be reduced and the reduced storage capacity yet allows the transmitted-series inference section 13 to operate correctly. Thus, the size of the transmitted-series inference section 13 and, hence, the size of the receiving apparatus shown in the block diagram of FIG. 3 can be made smaller than the sizes required for the M algorithm.

In addition, in the case of the X algorithm, the number of surviving child states is limited to the limited state count M. As described earlier, however, the operation to limit the number of surviving child states to the limited state count M has only an extremely small effect on the signal reception characteristic. Thus, the process to infer a series of symbols by making use of a trellis can be carried out with a high degree of precision.

In addition, in the case of the X algorithm, it is necessary to merely detect a smallest state metric among state metrics sm of surviving states. Thus, in comparison with the M algorithm which requires that state metrics sm be sorted as explained previously by referring to the trellis diagrams of FIGS. 2A to 2C, the series of symbols can be inferred fast.

Next, by referring to diagrams of FIGS. 9A to 14B, the following description explains processing carried out by the transmitted-series inference section 13 in accordance with the X algorithm to infer a series of symbols from an OFDM signal which conforms to the ISDB-T standards.

It is to be noted that, in the following description, the limited state count M is set at a typical number of 4 whereas the cutoff length L is set at a typical value of 3.

In addition, for an OFDM signal which conforms to the ISDB-T standards, MODE1, MODE2 and MODE3 are prescribed. However, the following description explains the processing carried out by the transmitted-series inference section 13 in accordance with the X algorithm to infer a series of symbols from an OFDM signal which conforms to the ISDB-T standards for MODE3 only as an example.

In MODE3, a 1-symbol OFDM signal has 5,617 carriers (or sub-carries), i.e., carriers #1 to #5617.

In the receiving apparatus shown in the block diagram of FIG. 3, the reduced-interference signals $Y_n$ are supplied by the FFT section 12 to the transmitted-series inference section 13 as the reduced-interference signals $Y_n$ of carriers #0 to #5616 typically in an order of increasing carrier frequencies. In addition, with a timing to supply the reduced-interference signal $Y_n$ of carrier #n from the FFT section 12 to the transmitted-series inference section 13, the transmission-line characteristic inference section 17 supplies the transmission-line information $H_{n+1}$ to the transmitted-series inference section 13.

Figure 9A:
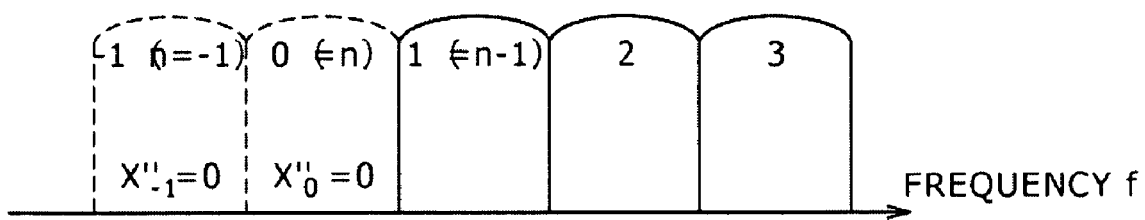
FIGS. 9A to 9B are explanatory diagrams to be referred to in description of processing carried out in order to infer an OFDM signal conforming to the ISDB-T standards by adoption of an X algorithm.
Figure 9B:
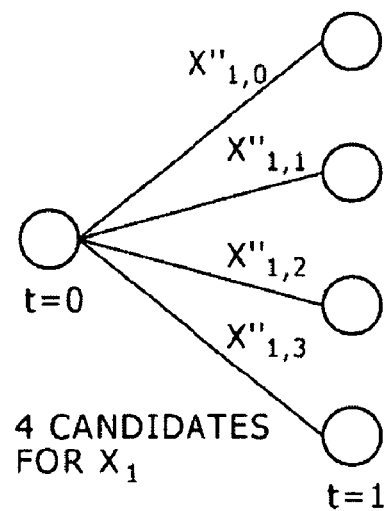

FIGS. 9A and 9B are explanatory diagrams referred to in description of processing carried out by the transmitted-series inference section 13 when the FFT section 12 supplies the reduced-interference signal $Y_0$ to the transmitted-series inference section 13 and the transmission-line characteristic inference section 17 supplies the transmission-line information $H_1$ to the transmitted-series inference section 13.

To be more specific, FIG. 9A is an explanatory diagram showing a sequence of carriers for a case in which the first carrier shown as carrier #1 serves as a carrier having a carrier number of (n+1). The carrier having a carrier number of (n+1) is the carrier used for transmitting the transmitted symbol $X_{n+1}$ expressed by Eq. (3).

In the transmitted-series inference section 13, the received value $X'_1(=X'_{n+1})$ of the transmitted symbol $X_1(=X_{n+1})$ transmitted by making use of carrier #1 (=n+1) serving as the first carrier is found in accordance with Eq. (3) making use of the reduced-interference signal $Y_0(=Y_n)$, the inferred value $X''_0(=X''_n)$ of the transmitted symbol $X_0(=X_n)$, the inferred value $X''_{-1}(=X''_{n-1})$ of the transmitted symbol $X_{-1}(=X_{n-1})$ as well as transmission-line information $H_1(=H_{n+1})$, the transmission-line information $H_0(=H_n)$ and the transmission-line information $H_1(=H_{n-1})$.

In the case of a 1-symbol OFDM signal, carriers each having a carrier number #n equal to or smaller than 0 and carriers each having a carrier number equal to or greater than 5,618 do not exist. Thus, the transmitted symbol $X_n$ of each of the carriers each having a carrier number #n equal to or smaller than 0 and the carriers each having a carrier number equal to or greater than 5,618 is set at 0 and the inferred value $X''_n$ of the transmitted symbol $X_n$ is also set at 0 as well.

Therefore, since the inferred value $X''_0 (=X''_n)$ and the inferred value $X''_{-1} (=X''_{n-1})$ are 0, substituting the value 0 of the transmitted symbols X into Eq. (3) as a replacement for $X_n$ and $X_{n-1}$ results in Eq. (4) shown as follows to serve as an equation which can be used for finding the received value $X'_1 (=X'_{n+1})$:

[Eq. 4]
$$X'_1 = \frac{Y_0}{-\frac{1}{2}H_1} \tag{4}$$

After finding the received value $X'_1$, the transmitted-series inference section 13 selects four (=M) signal points located on the IQ constellation plane as signal points each having a shorter Euclid distance to the received value $X'_1$ where reference notation M denotes the limited state count M which has been set at 4. Then, the transmitted-series inference section 13 takes four symbols represented by the four signal points each having a shorter Euclid distance to the received value $X'_1$ as the candidates (or symbol candidates) $X''_{1,i} (=X''_{1,0}, X''_{1,1}, X''_{1,2}$ and $X''_{1,3})$ for the inferred value of the transmitted symbol $X_1$.

Subsequently, the transmitted-series inference section 13 takes four states $X''_{1,i}$ corresponding to the four candidates $X''_{1,i}$ respectively as candidates (or symbol candidates) for surviving states for a time t=1 (=n+1). In addition, the transmitted-series inference section 13 computes the branch metric BM of the branch from a state for a time t=0(=n) leading ahead of the time t=1(=n+1) by an interval of one time unit to each of the surviving candidates $X''_{1,i}$ for the time t=1 (=n+1).

Let reference notation BM denote a branch metric of a branch from a state $X''_n$ for the time t=n to a state $X''_{n+1}$ for the time t=n+1. The state $X''_n$ for the time t=n is a state corresponding to the inferred value $X''_n$ whereas the state $X''_{n+1}$ for the time t=n+1 is a state corresponding to the inferred value $X''_{n+1}$. In this case, the branch metric BM can be computed typically in accordance with Eq. (5) given as follows.

[Eq. 5]
$$BM = \left| Y_n - \left( -\frac{1}{2} H_{n-1} X''_{n-1} + H_n X''_n - \frac{1}{2} H_{n+1} X''_{n-1} \right) \right|^2 \tag{5}$$

In accordance with Eq. (5), the branch metric BM is a quantity corresponding to the sum of interferences between carriers, interferences between symbols and an additivity white noise which are included in the reduced-interference signal $Y_n$. The processing to infer a series of symbols is carried out by the transmitted-series inference section 13 to minimize the sum of the branch metrics BM.

FIG. 9B is a diagram showing a trellis developed into a stage at which a state $X''_{1,i}$ corresponding to the symbol candidate $X''_{1,i}$ is taken as a surviving candidate.

Let reference notation $BM_i$ denote the branch metric BM of the branch from a parent state $X''_0$ for the time t=0(=n) to a surviving candidate $X''_{1,i}$ for the time t=1 (=n+1). In this case, the transmitted-series inference section 13 sets the state metric $sm_1$ of each of the four surviving candidates $X''_{1,i}$ for the time t=1(=n+1) at the branch metric $BM_i$ of the surviving candidates $X''_{1,i}$.

Then, at the time t=1(=n+1), the trellis does not include an ancestor state that can be reached by going upstream through branches in the trellis from a surviving candidate $X''_{1,i}$ for the time t=1(=n+1) by a distance of three (=L) time units where reference notation L denotes the cutoff length L which has been set at 3. Thus, the transmitted-series inference section 13 takes each of the four surviving candidates $X''_{1,i}$ as a surviving state $X''_{1,i}$.

FIG. 10 is a plurality of explanatory diagrams referred to in description of processing carried out by the transmitted-series inference section 13 when the FFT section 12 supplies the reduced-interference signal $Y_1$ to the transmitted-series inference section 13 and the transmission-line characteristic inference section 17 supplies the transmission-line information $H_2$ to the transmitted-series inference section 13.

Figure 10A:
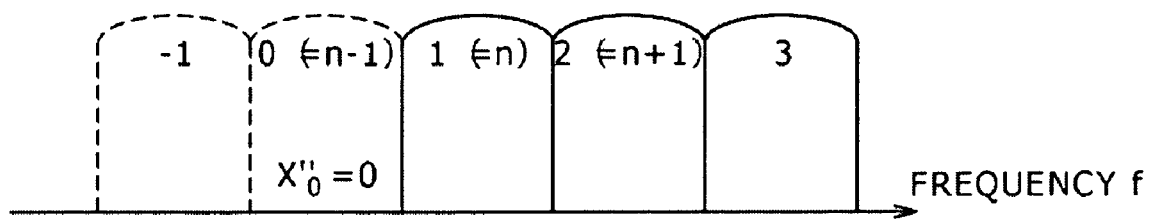
FIGS. 10A to 10B are explanatory diagrams to be referred to in description of processing carried out in order to infer an OFDM signal conforming to the ISDB-T standards by adoption of an X algorithm.

To be more specific, FIG. 10A is an explanatory diagram showing a sequence of carriers for a case in which the second carrier shown as carrier #2 serves as a carrier having a carrier number of (n+1).

In the transmitted-series inference section 13, the received value $X'_2 (=X'_{n+1})$ of the transmitted symbol $X_2 (=X_{n+1})$ transmitted by making use of carrier #2 (=n+1) serving as the second carrier is found in accordance with Eq. (3) making use of the reduced-interference signal $Y_1$ (=$Y_n$), the inferred value $X''_1 (=X''_n)$ of the transmitted symbol $X_1 (=X_n)$, the inferred value $X''_0 (=X''_{n-1})$ of the transmitted symbol $X_0 (=X_{n-1})$ as well as transmission-line information $H_2 (=H_{n+1})$, the transmission-line information $H_1 (=H_n)$ and the transmission-line information $H_0 (=H_{n-1})$.

As explained earlier by referring to the diagrams of FIGS. 9A and 9B, in the case of a 1-symbol OFDM signal, carriers each having a carrier number #n equal to or smaller than 0 and carriers each having a carrier number equal to or greater than 5,618 do not exist. Thus, the transmitted symbol $X_n$ of each of the carriers each having a carrier number #n equal to or smaller than 0 and the carriers each having a carrier number equal to or greater than 5,618 is set at 0 and the inferred value $X''_n$ of the transmitted symbol $X_n$ is also set at 0 as well. Therefore, since the inferred value $X''_c (=X''_{n-1})$ is 0, substituting the value 0 of the transmitted symbols X into Eq. (3) as a replacement for $X_n$ and $X_{n-1}$ results in Eq. (6) shown as follows to serve as an equation which can be used for finding the received value $X'_2 (=X'_{n+1})$:

[Eq. 6]
$$X'_{2,i} = \frac{Y_1 - X''_{1,i} H_1}{-\frac{1}{2} H_2} \tag{6}$$

It is to be noted that the received value $X'_{2,i}$ expressed by Eq. (6) is a received value $X'_2$ used for selecting a surviving candidate among offspring states which have been originated from the surviving ancestor state $X''_{1,i}$.

There are four surviving states $X''_{1,i}$, i.e., $X''_{1,0}, X''_{1,1}, X''_{1,2}$ and $X''_{1,3}$. In addition, for each of the surviving states $X''_{1,i}$, four received values $X'_{2,i}$ are found.

After finding the four received values $X'_{2,i}$ for each of the four received values $X'_{2,i}$, the transmitted-series inference section 13 selects four (=M) signal points located on the IQ constellation plane as signal points each having a shorter Euclid distance to the received value $X'_{2,i}$ where reference notation M denotes the limited state count M which has been set at 4. Then, the transmitted-series inference section 13 takes four symbols represented respectively by the four signal points each having a shorter Euclid distance to the received value $X'_{2,i}$ as the symbol candidates $X''_{2,i,j}$ ($=X''_{2,i,0}$, $X''_{2,i,1}$, and $X''_{2,i,3}$) for the inferred value of the transmitted symbol $X_2$.

Since the four symbol candidates $X''_{2,i,j}$ cited above are found for each of the four received values $X'_{2,i}$, a total of 16 symbol candidates $X''_{2,i,j}$ are found.

Subsequently, the transmitted-series inference section 13 takes 16 states $X''_{2,i,j}$ corresponding to the 16 symbol candidates $X''_{2,i,j}$ respectively as surviving candidates for a time t=2(=n+1). In addition, the transmitted-series inference section 13 computes the branch metric BM of the branch from a surviving state $X''_{1,i}$ for a time t=1(=n) leading ahead of the time t=2(=n+1) by an interval of one time unit to each of the surviving candidates $X''_{2,i,j}$ for the time t=2(=n+1) in accordance with Eq. (5) given before.

Figure 10B:
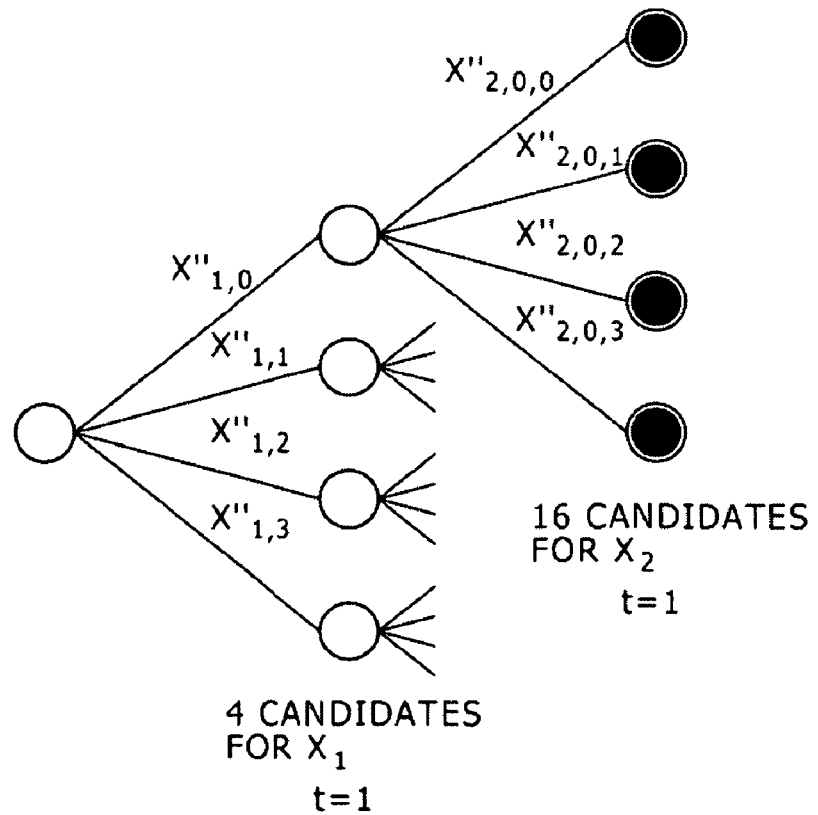

FIG. 10B is a diagram showing a trellis developed into a stage at which each of 16 states $X''_{2,i,j}$ corresponding to the 16 symbol candidates $X''_{2,i,j}$ respectively is taken as a surviving candidate.

For the time t=2(=n+1), four (=M) child states corresponding to the surviving candidates $X''_{2,i,0}$, $X''_{2,i,1}$, $X''_{2,i,2}$ and $X''_{2,i,3}$ are originated from each surviving state $X''_{1,i}$ for the time t=1(=n) leading ahead of the time t=2(=n+1) by an interval of one time unit where reference notation M denotes the limited state count M which has been set at 4.

Let reference notation $BM_{i,j}$ denote the branch metric BM of the branch from a surviving parent state $X''_{1,1}$ for the time t=1(=n) to a surviving candidate $X''_{2,i,j}$ for the time t=2(=n+1) lagging behind the time t=1(=n) by an interval of one time unit. In this case, the transmitted-series inference section 13 computes the sum of the state metric $sm_1$ of the surviving parent state $X''_{1,i}$ for the time t=1(=n) leading ahead of the time t=2(=n+1) by an interval of one time unit and the branch metric $BM_{i,j}$, taking the sum as the state metric $sm_{i,j}$ of each of the 16 surviving candidates $X''_{2,i,j}$ for the time t=2(=n+1).

Then, at the time t=2(=n+1), the trellis does not include an ancestor state that can be reached by going upstream through branches in the trellis from a surviving state $X''_{2,i,j}$ for the time t=2(=n+1) by a distance of 3(=L) time units where reference notation L denotes the cutoff length L which has been set at 3. Thus, the transmitted-series inference section 13 takes each of the 16 surviving candidates $X''_{2,i,j}$ as a surviving state $X''_{2,i,j}$.

Figure 11A:
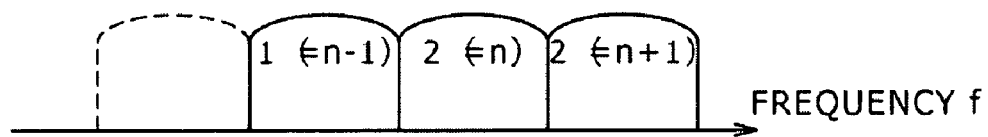
FIGS. 11A to 11B are explanatory diagrams to be referred to in description of processing carried out in order to infer an OFDM signal conforming to the ISDB-T standards by adoption of an X algorithm.
Figure 11B:
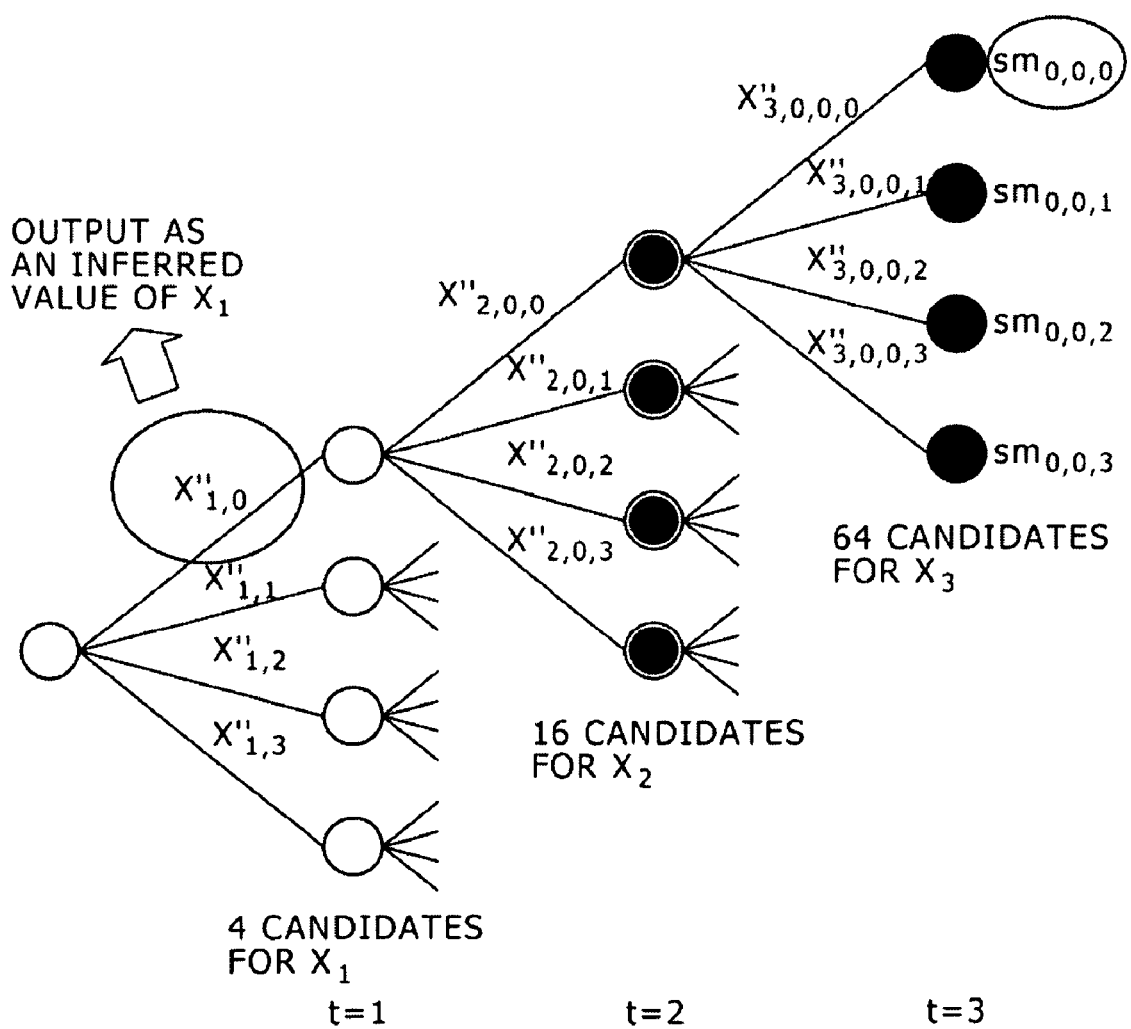

FIGS. 11A and 11B are explanatory diagrams referred to in description of processing carried out by the transmitted-series inference section 13 when the FFT section 12 supplies the reduced-interference signal $Y_2$ to the transmitted-series inference section 13 and the transmission-line characteristic inference section 17 supplies the transmission-line information $H_3$ to the transmitted-series inference section 13.

To be more specific, FIG. 11A is an explanatory diagram showing a sequence of carriers for a case in which the third carrier shown as carrier #3 serves as a carrier having a carrier number of (n+1).

In the transmitted-series inference section 13, the received value $X'_3$ ($=X'_{n+1}$) of the transmitted symbol $X_3$ ($=X_{n+1}$) transmitted by making use of carrier #3 (=n+1) serving as the third carrier is found in accordance with Eq. (3) making use of the reduced-interference signal Y2 ($=Y_n$), the inferred value $X''_2$ ($=X''_n$) of the transmitted symbol $X_2$($=X_n$), the inferred value $X''_1$ ($=X''_{n-1}$) of the transmitted symbol $X_1$($=X_{n-1}$) as well as the transmission-line information $H_3$($=H_{n+1}$), the transmission-line information $H_2$($=H_n$) and the transmission-line information $H_1$($=H_{n-1}$).

That is to say, for each of 16 surviving states $X''_{2,i,j}$ for the time t=2(=n) leading ahead of the time t=3(=n+1) corresponding to the carrier number of (n+1) by an interval of 1 time unit, the transmitted-series inference section 13 finds a received value $X'_{3,i,j}$ ($=X'_{n+1,i,j}$) in accordance with Eq. (3) given below. Thus, the transmitted-series inference section 13 computes a total of 16 received values $X'_{3,i,j}$.

[Eq. 7] (7)

$$X'_{3,i,j} = \frac{Y_2 + \frac{1}{2}X''_{i,j}H_1 - X''_{2,i,j}H_2}{-\frac{1}{2}H_3}$$

After finding the 16 received values $X'_{3,i,j}$, for each of the 16 received values $X'_{3,i,j}$, the transmitted-series inference section 13 selects four (=M) signal points located on the IQ constellation plane as signal points each having a shorter Euclid distance to the 16 received value $X'_{3,i,j}$ where reference notation M denotes the limited state count M which has been set at 4. Then, the transmitted-series inference section 13 takes four symbols represented respectively by the four signal points each having a shorter Euclid distance to the 16 received value $X'_{3,i,j}$ as the symbol candidates $X''_{3,i,j,k}$($=X''_{3,i,j,0}$, $X''_{3,i,j,1}$, $X''_{3,i,j,2}$ and $X''_{3,i,j,3}$) for the inferred value of the transmitted symbol $X_3$.

Since the four symbol candidates $X''_{3,i,j,k}$ cited above are found for each of the 16 received values $X'_{3,i,j}$ a total of 64 symbol candidates $X''_{3,i,j,k}$ are found.

Subsequently, the transmitted-series inference section 13 takes 64 states $X''_{3,i,j,k}$ corresponding to the 64 symbol candidates $X''_{3,i,j,k}$ respectively as surviving candidates for a time t=3(=n+1). In addition, the transmitted-series inference section 13 computes the branch metric BM of the branch from a surviving state $X''_{2,i,j}$ for a time t=2(=n) leading ahead of the time t=3(=n+1) by an interval of one time unit to each of the 64 surviving candidates $X''_{3,i,j,k}$ for the time t=3(=n+1) in accordance with Eq. (5) given before.

FIG. 11B is a diagram showing a trellis developed into a stage at which each of 64 states $X''_{3,i,j,k}$ corresponding to the 64 symbol candidates $X''_{3,i,j,k}$ respectively is taken as a surviving candidate.

For the time t=3(=n+1), 4(=M) child states corresponding to the surviving candidates $X''_{3,i,j,0}$, $X''_{3,i,j,1}$, $X''_{3,i,j,2}$ and $X''_{3,i,j,3}$ are originated from each surviving state $X''_{2,i,j}$ for the time t=2(=n) leading ahead of the time t=3(=n+1) by an interval of one time unit where reference notation M denotes the limited state count M which has been set at 4.

Let reference notation $BM_{i,j,k}$ denote the branch metric BM of the branch from a surviving parent state $X''_{2,i,j}$ for the time t=2(=n) to a surviving candidate $X''_{3,i,j,k}$ for the time t=3(=n+1) lagging behind the time t=2(=n) by an interval of one time unit. In this case, the transmitted-series inference section 13 computes the sum of the state metric $sm_{i,j}$ of the surviving parent state $X''_{2,i,j}$ for the time t=2(=n) leading ahead of the time t=3(=n+1) by an interval of one time unit and the branch metric $BM_{i,j,k}$, taking the sum as the state metric $sm_{i,j,k}$ of each of the 64(=$M^L$) surviving candidates $X''_{3,i,j,k}$ for the time t=3(=n+1).

Then, the transmitted-series inference section 13 finds the smallest state metrics among the state metrics $sm_{i,j,k}$ of the 64(=$M^L$) surviving candidates $X''_{3,i,j,k}$. Subsequently, as an effective state, the transmitted-series inference section 13 takes a surviving ancestor state that can be reached by going upstream through branches in the trellis from a surviving candidate $X''_{3,i,j,k}$ with the smallest state metric sm for the time t=3(=n+1) by a distance of two (=L−1) time units where reference notation L denotes the cutoff length L which has been set at 3. The ancestor state to serve as the effective state is a surviving state $X''_{1,i}$ for the time $t=1(=(n+1)-(L-1))$ for $L=3$.

Then, the transmitted-series inference section 13 selects surviving states directly originated from the effective state $X''_{1,i}$ and surviving candidates indirectly originated from the effective state $X''_{1,i}$ to serve as new surviving states.

Subsequently, the transmitted-series inference section 13 selects a symbol candidate $X''_{1,i}$ corresponding to the effective state $X''_{1,i}$ to serve as a candidate for the inferred value of the transmitted symbol $X_1(=X_{n-1})$ transmitted by making use of carrier #1 ($=n-1=n+1-(L-1)$) for $L=3$.

To put it concretely, in the case of the trellis shown in the trellis diagram of FIG. 11B, let us assume for example that the surviving candidate $X''_{3,0,0,0}$ is found to be the surviving candidate $X''_{3,i,j,k}$ with the smallest state metric sm for the time $t=3(=n+1)$. In this case, as an effective state, the transmitted-series inference section 13 takes a surviving ancestor state $X''_{1,0}$ that can be reached by going upstream through branches in the trellis from the surviving candidate $X''_{3,0,0,0}$ for the time $t=3(=n+1)$ by a distance of two ($=L-1$) time units where reference notation L denotes the cutoff length L which has been set at 3.

Then, the transmitted-series inference section 13 selects four surviving states $X''_{2,0,j}$ directly originated from the effective state $X''_{1,0}$ and 16 surviving candidates $X''_{3,0,j,k}$ indirectly originated from the effective state $X''_{1,0}$ as new surviving states. Each of the four surviving states $X''_{2,0,j}$ is a state for the time $t=2$ whereas each of the 16 surviving candidates $X''_{3,0,j,k}$ is a state for the time $t=3$. The 16 surviving candidates $X''_{3,0,j,k}$ indirectly originated from the effective state $X''_{1,0}$ are states directly originated from the four surviving states $X''_{2,0,j}$ which are each directly originated from the effective state $X''_{1,0}$.

Subsequently, the transmitted-series inference section 13 selects a symbol candidate $X''_{1,0}$ corresponding to the effective state $X''_{1,0}$ to serve as a candidate for the inferred value of the transmitted symbol $X_1(=X_{n-1})$ transmitted by making use of carrier #1 ($=n-1=n+1-(L-1)$) for $L=3$.

Figure 12:
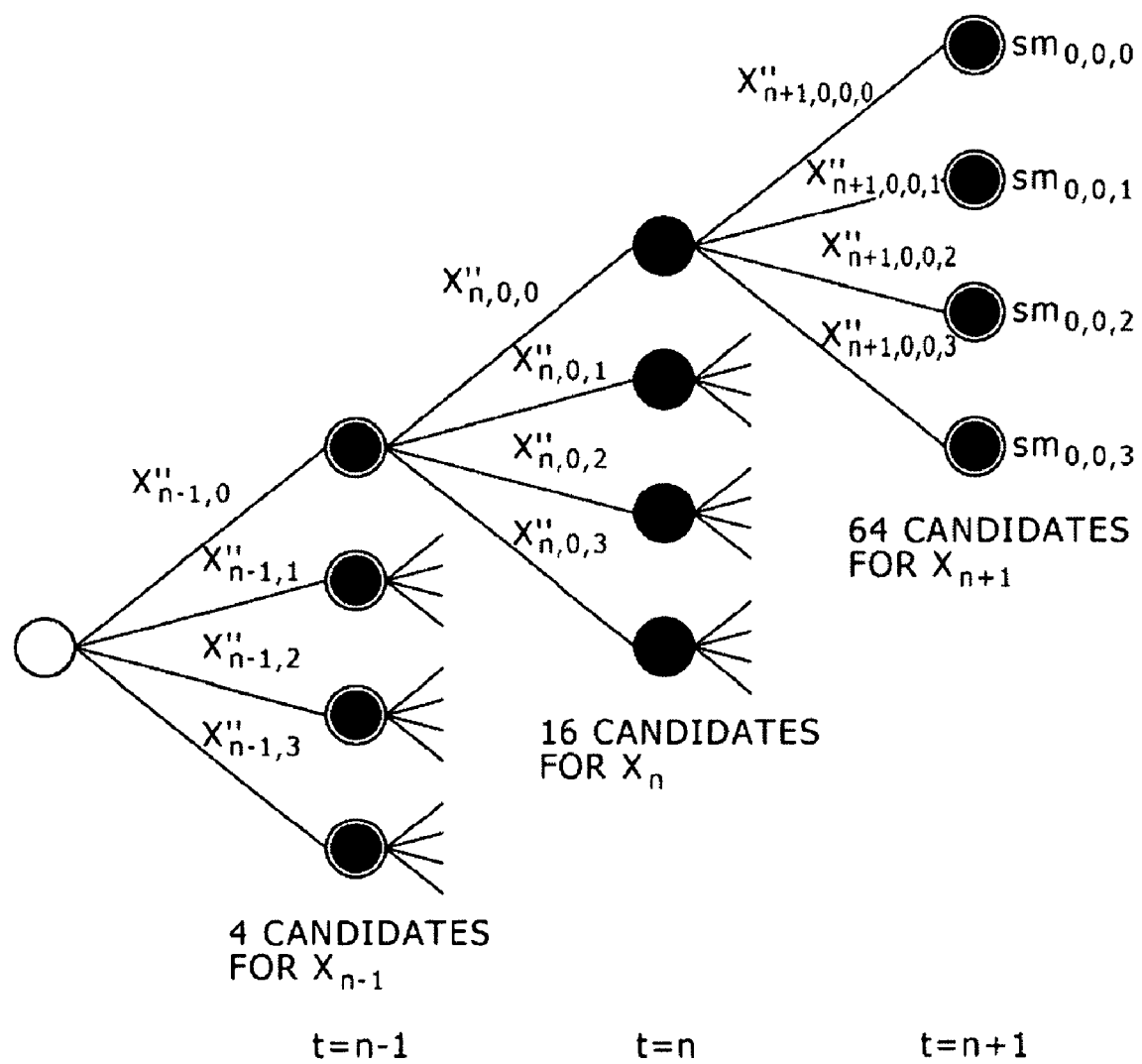
FIG. 12 is an explanatory diagram to be referred to in description of processing carried out in order to infer an OFDM signal conforming to the ISDB-T standards by adoption of an X algorithm.

FIG. 12 is a trellis diagram referred to in description of processing carried out by the transmitted-series inference section 13 when the FFT section 12 supplies the reduced-interference signal $Y_n$ of carrier #n to the transmitted-series inference section 13 and the transmission-line characteristic inference section 17 supplies the transmission-line information $H_{n+1}$ to the transmitted-series inference section 13.

If any one of carriers #4 to #5617 serves as a carrier having a carrier number of (n+1), the transmitted-series inference section 13 finds the received value $X'_{n+1}$ of the transmitted symbol $X_{n+1}$ transmitted by making use of carrier #(n+1) in accordance with Eq. (3) making use of the reduced-interference signal $Y_n$, the inferred value $X''_n$ of the transmitted symbol $X_n$, the inferred value $X''_{n-1}$ of the transmitted symbol $X_{n-1}$ as well as the transmission-line information $H_{n+1}$, the transmission-line information $H_n$ and the transmission-line information $H_{n-1}$.

That is to say, for each the 16 surviving states $X''_{n,i,j}$ for the time $t=n$ leading ahead of the time $t=n+1$ by an interval of one time unit, the transmitted-series inference section 13 computes one received value $X'_{n+1,i,j}$. Thus, the transmitted-series inference section 13 computes a total of 16 received values $X'_{n+1,i,j}$.

After finding the 16 received values $X'_{n+1,i,j}$, for each of the 16 received values $X'_{n+1,i,j}$, the transmitted-series inference section 13 selects four (=M) signal points located on the IQ constellation plane as signal points each having a shorter Euclid distance to the received value $X'_{n+1,i,j}$ where reference notation M denotes the limited state count M which has been set at 4. Then, the transmitted-series inference section 13 takes four symbols represented respectively by the four signal points each having a shorter Euclid distance to the received values $X'_{n+1,i,j}$ as the symbol candidates $X''_{n+1,i,j,k}$ ($=X''_{n+1,i,j,0}$, $X''_{n+1,i,j,1}$, $X''_{n+1,i,j,2}$ and $X''_{n+1,i,j,3}$) for the inferred value of the transmitted symbol $X_{n+1}$.

Since the four symbol candidates $X''_{n+1,i,j,k}$ cited above are found for each of the 16 received values $X'_{n+1,i,j}$, a total of 64 symbol candidates $X''_{n+1,i,j,k}$ are found.

Subsequently, the transmitted-series inference section 13 takes 64 states $X''_{n+1,i,j,k}$ corresponding to the 64 symbol candidates $X''_{n+1,i,j,k}$ respectively as surviving candidates for a time $t=n+1$. In addition, the transmitted-series inference section 13 computes the branch metric BM of the branch from a surviving state $X''_{n,i,j}$ for a time $t=n$ leading ahead of the time $t=n+1$ by an interval of one time unit to each of the surviving candidates $X''_{n+1,i,j,k}$ for the time $t=n+1$ in accordance with Eq. (5) given before.

To be more specific, FIG. 12 is a diagram showing a trellis developed into a stage at which each of the 64 aforementioned states $X''_{n+1,i,j,k}$ corresponding to the 64 symbol candidates $X''_{n+1,i,j,k}$ respectively is taken as a surviving candidate.

At the time $t=n+1$, four (=M) child states corresponding to the four symbol candidates $X''_{n+1,i,j,0}$, $X''_{n+1,i,j,1}$, $X''_{n+1,i,j,2}$ and $X''_{n+1,i,j,3}$ are originated from each surviving parent state $X''_{n,i,j}$ for the time $t=n$ leading ahead of the time $t=n+1$ by an interval of one time unit where reference notation M denotes the limited state count M which has been set at 4.

Let reference notation $BM_{i,j,k}$ denote the branch metric BM of the branch from a surviving parent state $X''_{n,i,j}$ for the time $t=n$ to a surviving candidate $X''_{n+1,i,j,k}$ for the time $t=n+1$ lagging behind the time $t=n$ by an interval of 1 time unit. In this case, the transmitted-series inference section 13 computes the sum of the state metric $sm_{i,j}$ of the surviving parent state $X''_{n,i,j}$ for the time $t=n$ leading ahead of the time $t=n+1$ by an interval of 1 time unit and the branch metric $BM_{i,j,k}$, taking the sum as the state metric $sm_{i,j,k}$ of each of the 64(=$M^L$) surviving candidates $X''_{n+1,i,j,k}$ for the time $t=n+1$.

Then, the transmitted-series inference section 13 finds the smallest state metrics among the state metrics $sm_{i,j,k}$ of the 64(=$M^L$) surviving candidates $X''_{n+1,i,j,k}$. Subsequently, as an effective state, the transmitted-series inference section 13 takes a surviving ancestor state that can be reached by going upstream through branches in the trellis from a surviving candidate $X''_{n+1,i,j,k}$ with the smallest state metric sm for the time $t=n+1$ by a distance of two (=$L-1$) time units where reference notation L denotes the cutoff length L which has been set at 3. The ancestor state to serve as the effective state is a surviving state $X''_{n-1,i}$ for the time $t=n-1(=(n+1)-(L-1))$ for $L=3$.

Then, the transmitted-series inference section 13 selects surviving states directly originated from the effective state $X''_{n-1,i}$ and surviving candidates indirectly originated from the effective state $X''_{n-1,i}$ to serve as new surviving states.

Subsequently, the transmitted-series inference section 13 selects a symbol candidate $X''_{n-1,i}$ corresponding to the effective state $X''_{n-1,i}$ to serve as a candidate for the inferred value of the transmitted symbol $X_{n-1}$ transmitted by making use of carrier #(n-1)(=n+1-(L-1)) for $L=3$.

To put it concretely, in the case of the trellis shown in the trellis diagram of FIG. 12, let us assume for example that the surviving candidate $X''_{n+1,0,0,0}$ is found to be the surviving candidate $X''_{n+1,i,j,k}$ with the smallest state metric sm for the time $t=n+1$. In this case, as an effective state, the transmitted-series inference section 13 takes a surviving ancestor state $X''_{n-1,0}$ that can be reached by going upstream through branches in the trellis from the surviving candidate $X''_{n+1,0,0,0}$ for the time t=n+1 by a distance of two (=L−1) time units where reference notation L denotes the cutoff length L which has been set at 3.

Then, the transmitted-series inference section 13 selects four surviving states $X''_{n,0,j}$ directly originated from the effective state $X''_{n-1,0}$ and 16 surviving candidates $X''_{n+1,0,j,k}$ indirectly originated from the effective state $X''_{n-1,0}$ as new surviving states. Each of the four surviving states $X''_{n,0,j}$ is a state for the time t=n whereas each of the 16 surviving candidates $X''_{n+1,0,j,k}$ is a state for the time t=n+1. The 16 surviving candidates $X''_{n+1,0,j,k}$ indirectly originated from the effective state $X''_{n-1,0}$ are states directly originated from the four surviving states $X''_{n,0,j}$ which are each directly originated from the effective state $X''_{n-1,0}$.

In addition, the transmitted-series inference section 13 selects a symbol candidate $X''_{n-1,0}$ corresponding to the effective state $X''_{n-1,0}$ to serve as a candidate for the inferred value of the transmitted symbol $X_{n-1}$ transmitted by making use of carrier #(n−1).

As described above, while sustaining the number of surviving candidates at a constant equal to $M^L$ without regard to the number of states in the trellis where reference notation M denotes the limited state count M and reference notation L denotes the cutoff length L, the transmitted-series inference section 13 is capable of inferring a series of symbols with ease.

By the way, as described above, for the time t=n+1, the transmitted-series inference section 13 finds $M^L$ surviving states $X''_{n+1,i,j,k}$ corresponding to symbol candidates $X''_{n+1,i,j,k}$ of a transmitted symbol $X_{n+1}$ transmitted by making use of carrier #(n+1) as surviving candidates $X''_{n+1,i,j,k}$ where reference notation M denotes the limited state count M which has been set at 4 whereas reference notation L denotes the cutoff length L which has been set at 3 and then, determines a surviving candidate $X''_{n+1,i,j,k}$ having a smallest state metric sm. Subsequently, the transmitted-series inference section 13 detects a surviving ancestor state $X''_{n-1,i}$ that can be reached by going upstream through branches in the trellis from a surviving candidate $X''_{n+1,i,j,k}$ with the smallest state metric sm by a distance of two (=L−1) time units to serve as the effective state for the time t=n−1(=(n+1)−(L−1)).

Then, the transmitted-series inference section 13 selects a symbol candidate $X''_{n-1,i}$ corresponding to the effective state $X''_{n-1,i}$ to serve as a candidate for the inferred value of the transmitted symbol $X_{n-1}$ transmitted by making use of carrier #(n−1) for the time t=n−1 (=(n+1)−(L−1)) for L=3.

Thus, in order to find an inferred value of the transmitted symbol $X_{n-1}$ transmitted by making use of carrier #(n−1), the transmitted-series inference section 13 must find surviving candidates including the surviving candidate $X''_{n+1,i,j,k}$ for the time t=n+1 lagging behind the time t=n−1 of the symbol candidate $X''_{n-1,i}$, which is associated with the effective state $X''_{n-1,i}$ and selected as the inferred value of the transmitted symbol $X_{n-1}$, by an interval of two time units.

For the reason described above, in the case of a 1-symbol OFDM signal having 5,617 carriers ranging from carrier #1 to carrier #5617, it is necessary to carry out the processing to infer a series of symbols till non existing carrier #5619 immediately following carrier #5618 next to last carrier #5617 becomes a carrier having a carrier number of (n+1).

Figure 13A:
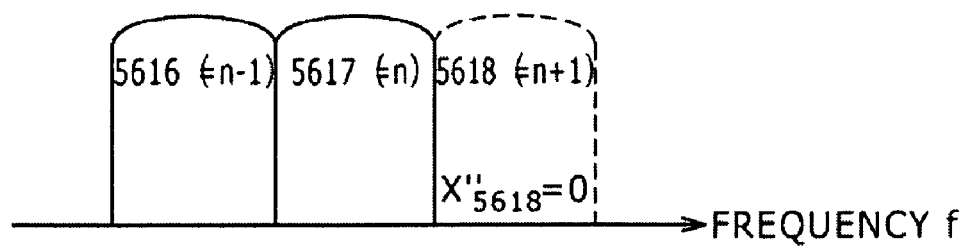
FIGS. 13A to 13B are explanatory diagrams to be referred to in description of processing carried out in order to infer an OFDM signal conforming to the ISDB-T standards by adoption of an X algorithm.
Figure 13B:
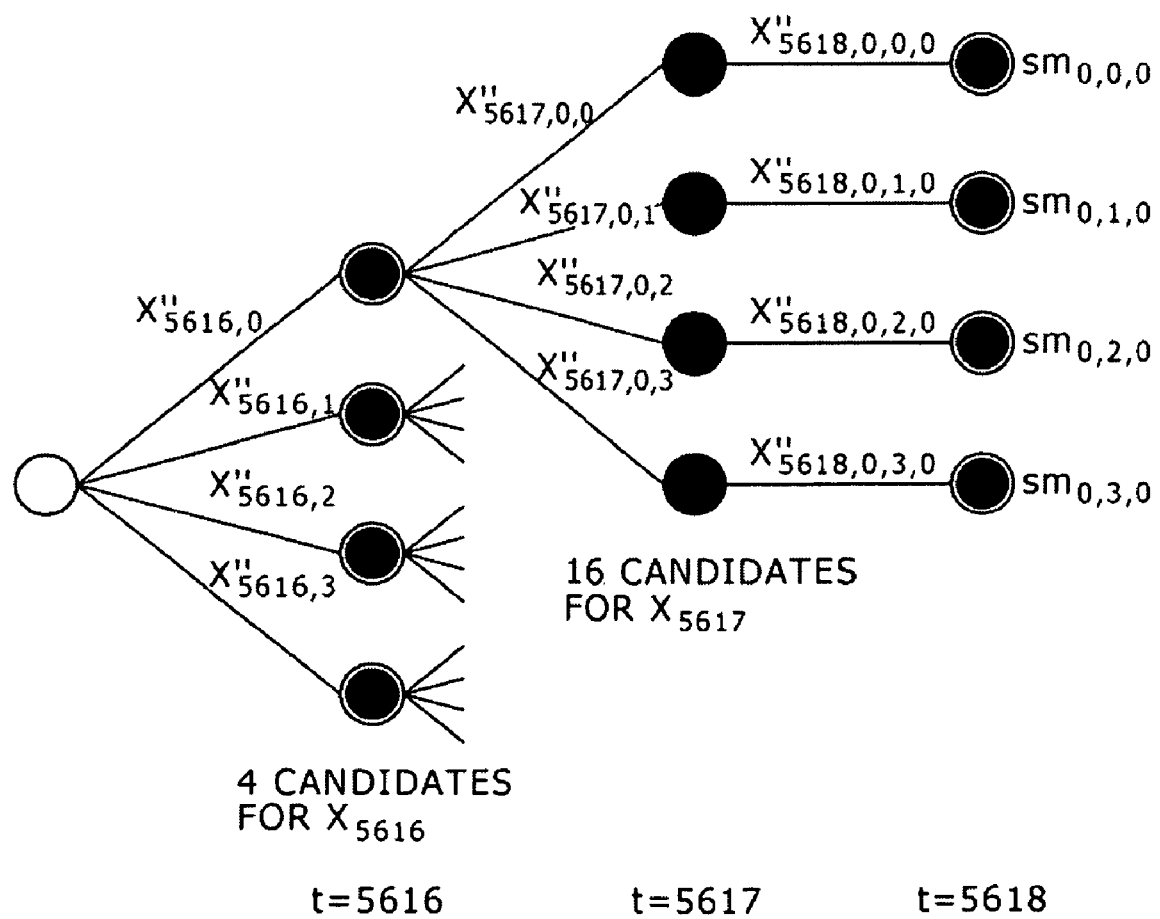

FIGS. 13A to 13C are explanatory diagrams referred to in description of processing carried out by the transmitted-series inference section 13 for a case in which a 1-symbol OFDM signal has 5,617 carriers ranging from carrier #1 to carrier #5617 and non existing carrier #5618 following last carrier #5617 becomes a carrier having a carrier number of (n+1).

To be more specific, FIG. 13A is an explanatory diagram showing a sequence of carriers for a case in which the 5618th carrier shown as carrier #5618 serves as a carrier having a carrier number of (n+1).

In the transmitted-series inference section 13, for each of the 16 surviving states $X''_{5617,i,j}(=X''_{n,i,j})$ for the time t=5,617(=n) leading ahead of the time t=5,618 (=n+1) by an interval of 1 time unit, the symbol candidate $X''_{5618,i,j,0}(=X''_{n+1,i,j,0})$ of the transmitted symbol $X_{5618}(=X_{n+1})$ transmitted by making use of the 5618th (or carrier #5618 (=carrier #(n+1))) is found.

That is to say, in the transmitted-series inference section 13, for the 16 surviving states $X''_{5617,i,j}(=X''_{n,i,j})$, 16 symbol candidates $X''_{5618,i,j,0}$ are found respectively.

In this case, as explained earlier by referring to the explanatory diagrams of FIGS. 9A and 9B, the inferred value $X''_n$ of the transmitted symbol $X_n$ transmitted by making use of a carrier having a carrier number #n at least equal to 5,618 is 0. Thus, each of the 16 symbol candidates $X''_{5618,i,j,0}$ is found to be 0.

Subsequently, the transmitted-series inference section 13 takes the 16 states $X''_{5618,i,j,0}$ corresponding to the 16 symbol candidates $X''_{5618,i,j,0}$ respectively as surviving candidates for a time t=5,618(=n+1). In addition, the transmitted-series inference section 13 computes the branch metric BM of the branch from a surviving state $X''_{5617,i,j}$ for a time t=5,617(=n) leading ahead of the time t=5,618(=n+1) by an interval of one time unit to each of the 16 surviving candidates $X''_{5618,i,j,0}$ for the time t=5,618(=n+1) in accordance with Eq. (5) given before.

FIG. 13B is a diagram showing a trellis developed into a stage at which each of 16 states $X''_{5618,i,j,0}$ corresponding to the 16 symbol candidates $X''_{5618,i,j,0}$ respectively is taken as a surviving candidate.

For the time t=5,618(=n+1), one child state corresponding to the surviving candidate $X''_{5618,i,j,0}$ is originated from each surviving state $X''_{5617,i,j}$ for the time t=5,617(=n) leading ahead of the time t=5,618(=n+1) by an interval of one time unit.

Let reference notation $BM_{i,j,0}$ denote the branch metric BM of the branch from a surviving parent state $X''_{5617,i,j}$ for the time t=5,617(=n) to a surviving candidate $X''_{5618,i,j,0}$ for the time t=5,618(=n+1) lagging behind the time t=5,617(=n) by an interval of one time unit. In this case, the transmitted-series inference section 13 computes the sum of the state metric $sm_{i,j}$ of the surviving parent state $X''_{5617,i,j}$ for the time t=5, 617(=n) leading ahead of the time t=5,618(=n+1) by an interval of one time unit and the branch metric $BM_{i,j,0}$, taking the sum as the state metric $sm_{i,j,0}$ of each of the 16 surviving candidates $X''_{5618,i,j,0}$ for the time t=5,618(=n+1)

Then, the transmitted-series inference section 13 finds the smallest state metrics among the state metrics $sm_{i,j,0}$ of the 16 surviving candidates $X''_{5618,i,j,0}$. Subsequently, as an effective state, the transmitted-series inference section 13 takes a surviving ancestor state that can be reached by going upstream through branches in the trellis from a surviving candidate $X''_{5618,i,j,0}$ with the smallest state metric sm for the time t=5,618(=n+1) by a distance of two (=L−1) time units where reference notation L denotes the cutoff length L which has been set at 3. The ancestor state to serve as the effective state is a surviving state $X''_{5616,i}$ for the time t=5,616(=(n+1)−(L−1)) for L=3.

Then, the transmitted-series inference section 13 selects surviving states directly originated from the effective state $X''_{5616,i}$ and surviving candidates indirectly originated from the effective state $X''_{5616,i}$ to serve as new surviving states.

Subsequently, the transmitted-series inference section 13 selects a symbol candidate $X''_{5616,i}$ corresponding to the effective state $X''_{5616,i}$ to serve as a candidate for the inferred value of the transmitted symbol $X5616(=X_{n-1})$ transmitted by making use of carrier #5616 (=n−1).

To put it concretely, in the case of the trellis shown in the trellis diagram of FIG. 13B, let us assume for example that the surviving candidate $X''_{5618,0,0,0}$ is found to be the surviving candidate $X''_{5618,i,j,0}$ with the smallest state metric sm for the time t=5,618(=n+1). In this case, as an effective state, the transmitted-series inference section 13 takes a surviving ancestor state $X''_{5616,0}$ that can be reached by going upstream through branches in the trellis from the surviving candidate $X''_{5618,0,0,0}$ for the time t=5,618(=n+1) by a distance of 2(=L−1) time units where reference notation L denotes the cutoff length L which has been set at 3. The ancestor state $X''_{5616,0}$ to serve as the effective state is a surviving state $X''_{5616,0}$ for the time t=5,616.

Then, the transmitted-series inference section 13 selects four surviving states $X''_{5617,0,j}$, directly originated from the effective state $X''_{5616,0}$ and four surviving candidates $X''_{5618,0,j,k}$ indirectly originated from the effective state $X''_{5616,0}$ as new surviving states. Each of the four surviving states $X''_{5617,0,j}$ is a state for the time t=5,617 whereas each of the four surviving candidates $X''_{5618,0,j,k}$ is a state for the time t=5,618. The four surviving candidates $X''_{5618,0,j,k}$ indirectly originated from the effective state $X''_{5616,0}$ are states directly originated from respectively the four surviving states $X''_{5617,0,j}$ which are each directly originated from the effective state $X''_{5616,0}$.

Subsequently, the transmitted-series inference section 13 selects a symbol candidate $X''_{5616,0}$ corresponding to the effective state $X''_{5616,0}$ to serve as a candidate for the inferred value of the transmitted symbol $X_{5616}(=X_{n-1})$ transmitted by making use of carrier #5616 (=n−1).

Figure 14A:
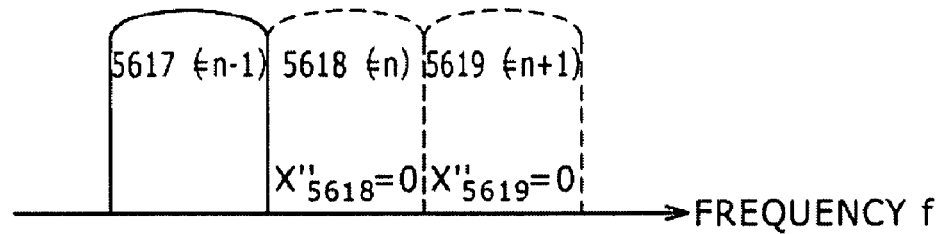
FIGS. 14A to 14B are explanatory diagrams to be referred to in description of processing carried out in order to infer an OFDM signal conforming to the ISDB-T standards by adoption of an X algorithm.
Figure 14B:
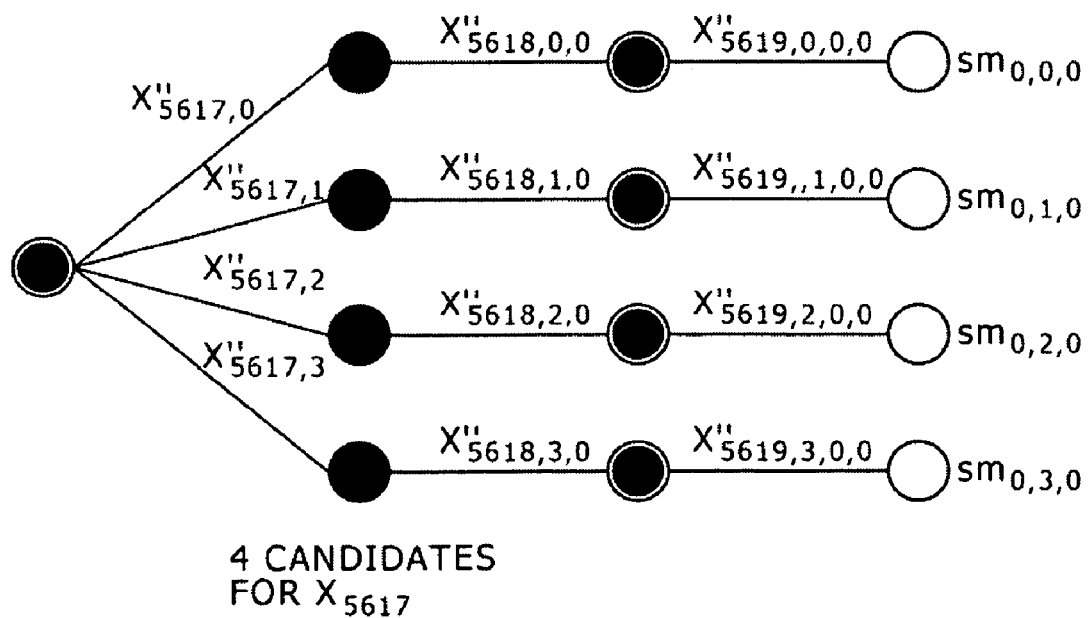

FIGS. 14A and 14B are explanatory diagrams referred to in description of processing carried out by the transmitted-series inference section 13 for a case in which a 1-symbol OFDM signal has 5,617 carriers ranging from carrier #1 to carrier #5617 and non existing carrier #5619 following non existing carrier #5618 next to last carrier #5617 becomes a carrier having a carrier number of (n+1).

To be more specific, FIG. 14A is an explanatory diagram showing a sequence of carriers for a case in which the 5619th carrier shown as carrier #5619 serves as a carrier having a carrier number of (n+1).

In the transmitted-series inference section 13, for each of the four surviving states $X''_{5618,i,0}(=X''_{n,i,0})$ for the time t=5,618(=n) leading ahead of the time t=5,619(=n+1) by an interval of one time unit, the symbol candidate $X''_{5619,i,0,0}(=X''_{n+1,i,0,0})$ of the transmitted symbol $X_{5619}(=X_{n+1})$ transmitted by making use of the 5619th (or carrier #5619 (=carrier #(n+1))) is found.

That is to say, in the transmitted-series inference section 13, for the four surviving states $X''_{5618,i,0}(=X''_{n,i,0})$, four symbol candidates $X''_{5619,i,0,0}$ are found respectively.

In this case, as explained earlier by referring to the explanatory diagrams of FIGS. 9A and 9B, the inferred value $X''_n$ of the transmitted symbol $X_n$ transmitted by making use of a carrier having a carrier number #n at least equal to 5,618 is 0. Thus, each of the four symbol candidates $X''_{5619,i,0,0}$ is found to be 0.

Subsequently, the transmitted-series inference section 13 takes the four states $X''_{5619,i,0,0}$ corresponding to the four symbol candidates $X''_{5619,i,0,0}$ respectively as surviving candidates for a time t=5,619(=n+1). In addition, the transmitted-series inference section 13 computes the branch metric BM of the branch from a surviving state $X''_{5618,i,0}$ for a time t=5,618(=n) leading ahead of the time t=5,619(=n+1) by an interval of one time unit to each of the four surviving candidates $X''_{5619,i,0,0}$ for the time t=5,619(=n+1) in accordance with Eq. (5) given before.

FIG. 14B is a diagram showing a trellis developed into a stage at which each of four states $X''_{5619,i,0,0}$ corresponding to the four symbol candidates $X''_{5619,i,0,0}$ respectively is taken as a surviving candidate.

For the time t=5,619(=n+1), one child state $X''_{5619,i,0,0}$ corresponding to the surviving candidate $X''_{5619,i,0,0}$ is originated from each surviving state $X''_{5618,i,0}$ for the time t=5,618(=n) leading ahead of the time t=5,619(=n+1) by an interval of one time unit.

Let reference notation $BM_{i,0,0}$ denote the branch metric BM of the branch from a surviving parent state $X''_{5618,i,0}$ for the time t=5,618(=n) to a surviving candidate $X''_{5619,i,0,0}$ for the time t=5,619(=n+1) lagging behind the time t=5,618(=n) by an interval of one time unit. In this case, the transmitted-series inference section 13 computes the sum of the state metric $sm_{i,0}$ of the surviving parent state $X''_{5618,i,0}$ for the time t=5,618(=n) leading ahead of the time t=5,619(=n+1) by an interval of 1 time unit and the branch metric $BM_{i,0,0}$, taking the sum as the state metric $sm_{i,0,0}$ of each of the four surviving candidates $X''_{5619,i,0,0}$ for the time t=5,619(=n+1).

Then, the transmitted-series inference section 13 finds the smallest state metrics among the state metrics $sm_{i,0,0}$ of the four surviving candidates $X''_{5619,i,0,0}$. Subsequently, as an effective state, the transmitted-series inference section 13 takes a surviving ancestor state that can be reached by going upstream through branches in the trellis from a surviving candidate $X''_{5619,i,0,0}$ with the smallest state metric sm for the time t=5,619(=n+1) by a distance of two (=L−1) time units where reference notation L denotes the cutoff length L which has been set at 3. The ancestor state to serve as the effective state is a surviving state $X''_{5617,i}$ for the time t=5,617(=(n+1)−(L−1)) for L=3.

Subsequently, the transmitted-series inference section 13 selects a symbol candidate $X''_{5617,i}$ corresponding to the effective state $X''_{5617,i}$ to serve as a candidate for the inferred value of the transmitted symbol $X_{5617}(=X_{n-1})$ transmitted by making use of carrier #5617 (=n−1). Carrier #5617 (=n−1) is the last carrier of the OFDM signal.

Accordingly, for example, it is assumed that the surviving candidate $X''_{5619,0,0,0}$ is found to be the surviving candidate $X''_{5619,i,0,0}$ with the smallest state metric sm for the time t=5,619(=n+1). In this case, as an effective state, the transmitted-series inference section 13 takes a surviving ancestor state $X''_{5617,0}$ that can be reached by going upstream through branches in the trellis from the surviving candidate $X''_{5619,0,0,0}$ for the time t=5,619(=n+1) by a distance of two (=L−1) time units where reference notation L denotes the cutoff length L which has been set at 3. The ancestor state $X''_{5617,0}$ to serve as the effective state is a surviving state $X''5617,0$ for the time t=5,617(=n−1).

Subsequently, the transmitted-series inference section 13 selects a symbol candidate $X''_{5617,0}$ corresponding to the effective state $X''_{5617,0}$ to serve as a candidate for the inferred value of the transmitted symbol $X_{5617}(=X_{n-1})$ transmitted by making use of carrier #5617(=n−1).

Figure 15:
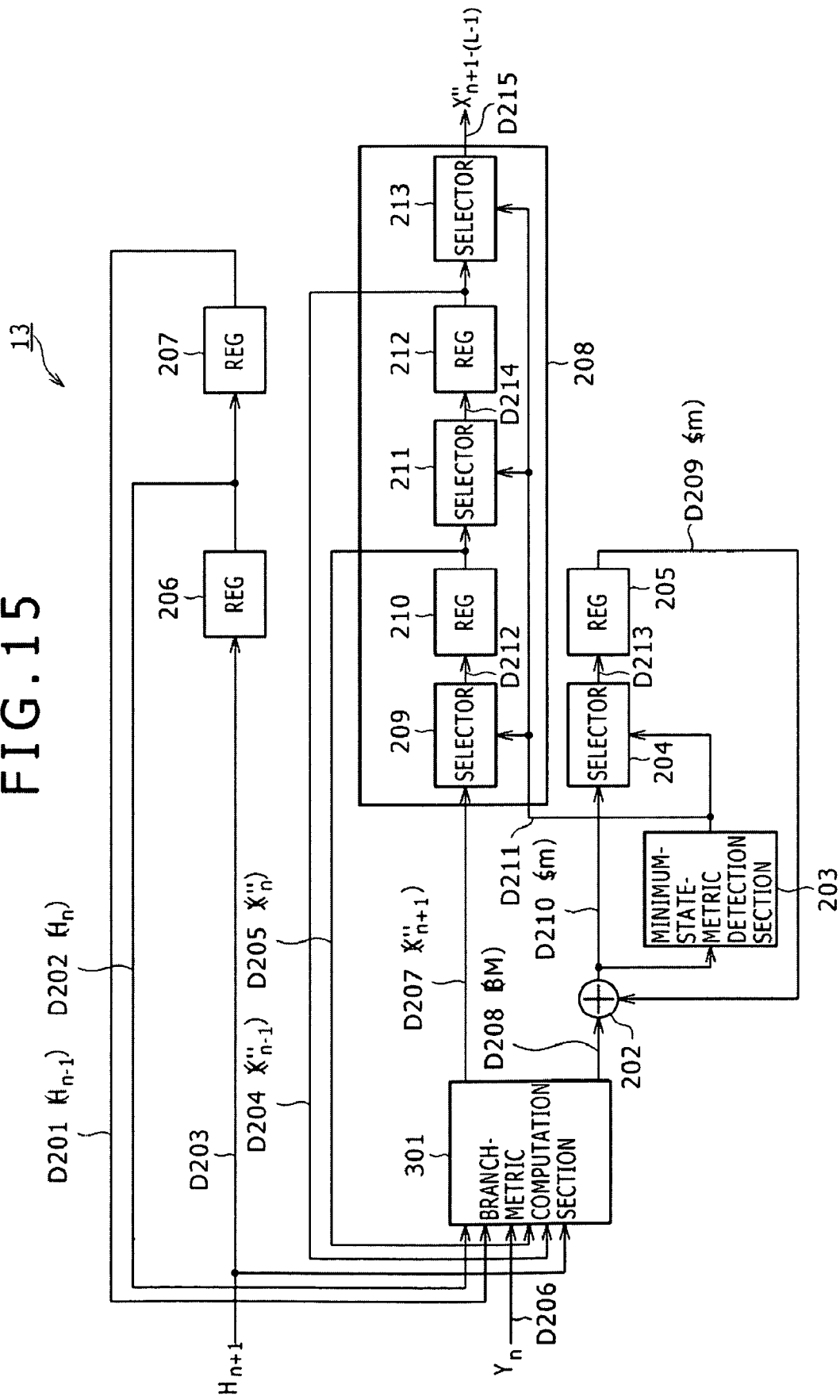
FIG. 15 is a block diagram showing a typical configuration of the transmitted-series inference section employed in the receiving apparatus shown in the block diagram of FIG. 3.

FIG. 15 is a block diagram showing a typical configuration of the transmitted-series inference section 13 employed in the receiving apparatus shown in the block diagram of FIG. 3.

As shown in the block diagram of FIG. 15, the typical configuration of the transmitted-series inference section 13 includes a branch-metric computation section 201, a state-metric computation section 202, a minimum-state-metric detection section 203, a selector 204, registers 205 to 207 each denoted by reference notation REG and a path memory 208.

The branch-metric computation section 201 receives a reduced-interference signal $Y_n$ denoted by reference notation D206 from the FFT section 12 employed in the receiving apparatus shown in the block diagram of FIG. 3 and transmission-line information $H_{n+1}$ denoted by reference notation D203 from the transmission-line characteristic inference section 17 also employed in the receiving apparatus shown in the block diagram of FIG. 3.

In addition, the branch-metric computation section 201 also receives transmission-line information $H_n$ denoted by reference notation D202 from the register 206 and transmission-line information $H_{n-1}$ denoted by reference notation D201 from the register 207.

On top of that, the branch-metric computation section 201 also receives surviving states from the path memory 208. Strictly speaking, the branch-metric computation section 201 receives symbol candidates each corresponding to one of the surviving states from the path memory 208.

That is to say, with the limited state count M set at 4 and the cutoff length L set at 3 as described above, the branch-metric computation section 201 receives data D205 and data D204 from the path memory 208. The data D205 is 16(symbol candidates $X''_{n,i,j}$ corresponding to) surviving states $X''_{n,i,j}$ for the time t=n leading ahead of the time t=n+1 by an interval of one time unit. On the other hand, the data D204 is four (symbol candidates $X''_{n-1,i,j}$ corresponding to) surviving states $X''_{n-1,i,j}$ for the time t=n−1 leading ahead of the time t=n+1 by two (=L−1) time units where reference notation L denotes the cutoff length L which has been set at 3.

While limiting the number of child states (or surviving candidates) originated from each of $16(=M^{L-1})$ surviving parent states $X''_{n,i,j}$ for the time t=n leading ahead of the time t=n+1 by an interval of one time unit to serve as states (or surviving candidates) $X''_{n+1,i,j,k}$ for the time t=n+1 to 4(=M), the branch-metric computation section 201 computes the branch metric $BM_{i,j,k}$ of the branch from each of $16(=M^{L-1})$ surviving parent states $X''_{n,i,j}$ to each of the child states (or surviving candidates) $X''_{n+1,i,j,k}$ and supplies the branch metric $BM_{i,j,k}$ to the state-metric computation section 202 as data D208 where reference notation M denotes the limited state count M which has been set at 4.

That is to say, for each of the $16(=M^{L-1})$ symbol candidates $X''_{n,i,j}$ corresponding to 16 surviving states $X''_{n,i,j}$ respectively, the branch-metric computation section 201 finds a received value $X'_{n+1,i,j}$. Thus, the branch-metric computation section 201 finds a total of 16 received values $X'_{n+1,i,j}$. The branch-metric computation section 201 finds each of the received values $X'_{n+1,i,j}$ in accordance with Eq. (3) by making use of the reduced-interference signal $Y_n$ received as the data D206 from the FFT section 12 (shown in FIG. 3), the transmission-line information $H_{n+1}$ received as the data D203 from the transmission-line characteristic inference section 17, the transmission-line information $H_n$ received as the data D202 from the register 206, the transmission-line information $H_{n-1}$ received as the data D201 from the register 207, the data D205 received from the path memory 208 and the data D204 also received from the path memory 208. As described above, the data D205 is symbol candidates $X''_{n,i,j}$ corresponding to 16 surviving states $X''_{n,i,j}$ for the time t=n. On the other hand, the data D204 is symbol candidates $X''_{n-1,i,j}$ corresponding to four surviving states $X''_{n-1,i,j}$ for the time t=n−1. Each of the symbol candidates $X''_{n,i,j}$ each corresponding to one of the 16 surviving states $X''_{n,i,j}$ for the time t=n is a symbol candidate which can become the inferred value of the transmitted symbol $X_n$ whereas each of the symbol candidates $X''_{n-1,i}$ each corresponding to one of the four surviving states $X''_{n-1,i}$ is a symbol candidate which can become the inferred value of the transmitted symbol $X_{n-1}$.

After finding the 16 received values $X'_{n+1,i,j}$, for each of the 16 received values $X'_{n+1,i,j}$, the branch-metric computation section 201 selects four (=M) signal points located on the IQ constellation plane as signal points each having a shorter Euclid distance to the received value $X'_{n+1,i,j}$ where reference notation M denotes the limited state count M which has been set at 4. Then, the branch-metric computation section 201 takes four symbols represented by the four signal points each having a shorter Euclid distance to the received values $X'_{n+1,i,j}$ as the symbol candidates $X''_{n+1,i,j,k}(=X''_{n+1,i,j,0}, X''_{n+1,i,j,1}, X''_{n+1,i,j,2}$ and $X''_{n+1,i,j,3})$ for the inferred value of the transmitted symbol $X_{n+1}$.

Since the four symbol candidates $X''_{n+1,i,j,k}(=X''_{n+1,i,j,0}, X''_{n+1,i,j,1}, X''_{n+1,i,j,2}$ and $X''_{n+1,i,j,3})$ cited above are found for each of the 16 received values $X'_{n+1,i,j}$, a total of $64(=M^L)$ symbol candidates $X''_{n+1,i,j,k}$ are found where notation L denotes the cutoff length L which has been set at 3. Then, the branch-metric computation section 201 supplies states corresponding to the 64 symbol candidates $X''_{n+1,i,j,k}$ to the path memory 208 as 64 surviving candidates $X''_{n+1,i,j,k}$ represented by data D207.

In addition, the branch-metric computation section 201 computes the branch metric BM of each of 64 branches from 16 surviving parent states $X''_{n,i,j}$ for a time t=n leading ahead of the time t=n+1 by an interval of 1 time unit to the 64 aforementioned surviving candidates $X''_{n+1,i,j,k}$ for the time t=n+1 in accordance with Eq. (5) given before. Then, the branch-metric computation section 201 supplies the 64 branch metrics BM to the state-metric computation section 202 as data D208.

That is to say, for each specific one of the 16 surviving parent states $X''_{n,i,j}$, the branch-metric computation section 201 computes the branch metrics BM of four branches from the specific surviving parent state $X''_{n,i,j}$ to four surviving candidates $X''_{n+1,i,j,k}$ in accordance with Eq. (5). Then, the branch-metric computation section 201 supplies a total of 64 branch metrics BM to the state-metric computation section 202 as data D208.

The state-metric computation section 202 computes a state metric sm for each candidate for a surviving state surviving in the trellis, that is, for each of the 64 surviving candidates $X''_{n+1,i,j,k}$, by making use of the data D208 received from the branch-metric computation section 201 as data representing the 64 branch metrics BM.

The state-metric computation section 202 receives the data D208 representing the 64 branch metrics BM of the 64 branches from the 16 surviving parent states $X''_{n,i,j}$ for the time t=n leading ahead of the time t=n+1 by an interval of one time unit to the 64 surviving candidates $X''_{n+1,i,j,k}$ for the time t=n+1 from the branch-metric computation section 201 and reads out D209 representing state metrics sm of the 16 surviving parent states $X''_{n,i,j}$ for the time t=n from the register 205.

The state-metric computation section 202 adds the data D209 read out from the register 205 as data representing 16 state metrics sm of the 16 surviving parent states $X''_{n,i,j}$ for the time t=n leading ahead of the time t=n+1 by an interval of one time unit to the data D208 received from the branch-metric computation section 201 as data representing the 64 branch metrics BM of the 64 branches from the 16 surviving parent states $X''_{n,i,j}$ for the time t=n to the 64 surviving candidates $X''_{n+1,i,j,k}$ for the time t=n+1 in order to generate data D210 representing the state metric sm of each of the 64 surviving candidates $X''_{n+1,i,j,k}$.

Then, the state-metric computation section 202 supplies the data D210 representing the state metric sm of each of the 64 surviving candidates $X''_{n+1,i,j,k}$ for the time t=n+1 to the minimum-state-metric detection section 203 and the selector 204.

The minimum-state-metric detection section 203 detects the smallest state metric among the data D210 received from the state-metric computation section 202 as data representing the state metric sm of each of the 64 surviving candidates $X''_{n+1,i,j,k}$ for the time t=n+1.

As an effective state, the minimum-state-metric detection section 203 takes a surviving ancestor state $X''_{n-1,i}$ that can be reached as a state for the time t=n−1(=(n+1)−(L−1)) by going upstream through branches in the trellis from the surviving candidate $X''_{n+1,i,j,k}$ with the smallest state metric among the data D210, which has been received from the state-metric computation section 202 as data representing the state metric sm of each of the 64 surviving candidates $X''_{n+1,i,j,k}$ for the time t=n+1, by a distance of two (=L−1) time units where reference notation L denotes the cutoff length L which has been set at 3. Then, the minimum-state-metric detection section 203 supplies data D211 serving as effective-state information representing the effective state $X''_{n-1,i}$ to the selector 204 and the path memory 208.

The selector 204 selects the state metrics sm of 16 particular surviving candidates $X''_{n+1,i,j,k}$, which are each selected to serve as a new surviving state, among the data D210 received from the state-metric computation section 202 as data representing the state metric sm of each of the 64 surviving candidates $X''_{n+1,i,j,k}$ for the time t=n+1. The 16 particular surviving candidates $X''_{n+1,i,j,k}$ are surviving candidates $X''_{n+1,i,j,k}$ each indirectly originated from the effective state $X''_{n-1,i}$ represented by the data D211 received from the minimum-state-metric detection section 203 as data serving as effective-state information.

Then, the selector 204 provides the register 205 with data D213 representing state metrics sm selected to serve as the state metrics sm of the 16 particular surviving candidates $X''_{n+1,i,j,k}$ among the data D210 received from the state-metric computation section 202 as data representing the state metric sm of each of the 64 surviving candidates $X''_{n+1,i,j,k}$ for the time t=n+1.

The register 205 is used for storing the data D213 received from the selector 204 as data representing the state metrics sm of the 16 particular surviving candidates $X''_{n+1,i,j,k}$. The register 205 supplies the data D213 representing the state metrics sm of the 16 particular surviving candidates $X''_{n+1,i,j,k}$ to the state-metric computation section 202 as the data D209 representing the state metrics sm of the 16 surviving states $X''_{n,i,j}$ for the time t=n leading ahead of the time t=n+1 by an interval of one time unit at the processing time to process the next carrier.

The register 206 receives the data D203 representing the transmission-line information $H_{n+1}$ from the transmission-line characteristic inference section 17 employed in the receiving apparatus shown in the block diagram of FIG. 3.

The data D203 received from the transmission-line characteristic inference section 17 as data representing the transmission-line information $H_{n+1}$ is stored in the register 206 only for a period having a length of one time unit in order to delay the data D203 by the period having a length of one time unit. The delayed data D203 is then supplied to the branch-metric computation section 201 and the register 207 as the data D202 representing the transmission-line information $H_n$.

The data D202 received from the register 206 as data representing the transmission-line information $H_n$ is stored in the register 207 only for a period having a length of one time unit in order to delay the data D202 by the period having a length of one time unit. The delayed data D202 is then supplied to the branch-metric computation section 201 as the data D201 representing the transmission-line information $H_{n-1}$.

As shown in the block diagram of FIG. 15, the path memory 208 employs a selector 209, a register 210, a selector 211, a register 212 and selector 213.

The register 210 employed in the path memory 208 is used for storing surviving states originated directly in the trellis from the effective state $X''_{n-1,i}$ represented by the effective-state information D211 received from the minimum-state-metric detection section 203 as new surviving candidates whereas the register 212 employed in the path memory 208 is used for storing surviving candidates originated indirectly in the trellis from the effective state $X''_{n-1,i}$ as new surviving candidates.

The selector 213 employed in the path memory 208 selects a symbol candidate corresponding to the effective state $X''_{n-1,i}$ represented by the effective-state information D211 received from the minimum-state-metric detection section 203 and outputs the selected symbol candidate as data D215 representing an inferred value $X''_{n-1,i}(=X''_{n+1-(L-1),i})$ of a transmitted symbol $X_{n-1}(=X_{n+1-(L-1)})$ for L=3.

The selector 209 employed in the path memory 208 receives the effective-state information D211 from the minimum-state-metric detection section 203 and the data D207 representing the 64 surviving candidates $X''_{n+1,i,j,k}$ for the time t=n+1 from the branch-metric computation section 201.

The selector 209 selects 16 surviving candidates originated indirectly in the trellis from the effective state $X''_{n-1,i}$ represented by the effective-state information D211 received from the minimum-state-metric detection section 203 among the data D207 received from the branch-metric computation section 201 as data representing the 64 surviving candidates $X''_{n+1,i,j,k}$ for the time t=n+1 to serve as 16 new surviving states $X''_{n,i,j}$ for the time t=n at a processing time to process the next carrier. Then, the selector 209 supplies the register 210 with data D212 representing the 16 new surviving states $X''_{n,i,j}$.

The register 210 is used for storing the data D212 received from the selector 209 as data representing the 16 new surviving states $X''_{n,i,j}$. Then, data D205 representing 16 surviving states $X''_{n,i,j}$ stored so far is supplied from the register 210 to the branch-metric computation section 201 and the selector 211.

The selector 211 selects surviving states originated directly in the trellis from the effective state $X''_{n-1,i}$ represented by the effective-state information D211 received from the minimum-state-metric detection section 203 among the data D205 received from the register 210 as data representing the 16 surviving states $X''_{n,i,j}$ for the time t=n to serve as four new surviving states $X''_{n-1,i}$ for the time t=n−1 at a processing time to process the next carrier. Then, the selector 211 supplies the register 212 with data D214 representing the four new surviving states $X''_{n-1,i}$.

The register 212 is used for storing the data D214 received from the selector 211 as data representing the four new surviving states $X''_{n-1,i}$. Then, data D204 representing four surviving states $X''_{n-1,i}$ stored so far is supplied from the register 212 to the branch-metric computation section 201 and the selector 213.

The selector 213 selects a symbol candidate corresponding to the effective state $X''_{n-1,i}$ represented by the effective-state information D211 received from the minimum-state-metric detection section 203 among the data D204 received from the register 212 as data representing the four surviving states $X''_{n-1,i}$ for the time t=n−1 and outputs the selected symbol candidate to the interference-component inference section 14 employed in the receiving apparatus shown in the block diagram of FIG. 3 as the data D215 representing an inferred value $X''_{n-1,i}$ (=$X''_{n+1-(L-1),i}$) of a transmitted symbol $X_{n-1}$(=$X_{n+1-(L-1),i}$) for L=3.

Then, the interference-component inference section 14 (shown in FIG. 3) receives the data D215 representing an inferred value $X''_{n-1,i}$(=$X''_{n+1-(L-1),i}$) of a transmitted symbol $X_{n-1}$(=$X_{n+1-(L-1),i}$) for L=3.

Figure 16:
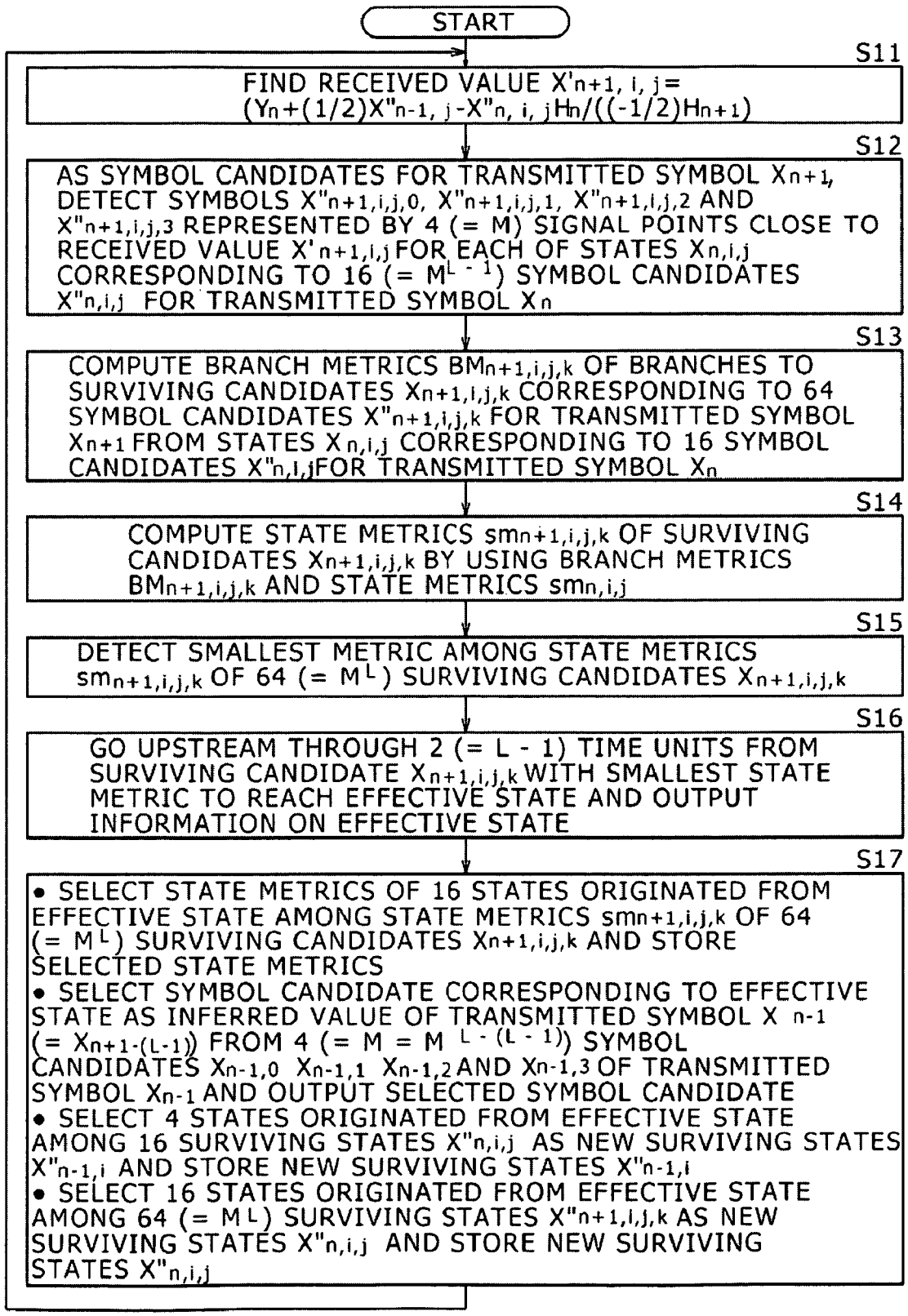
FIG. 16 shows an explanatory flowchart representing processing carried out by the transmitted-series inference section shown in the block diagram of FIG. 15 in order to infer a series of symbols.

FIG. 16 shows an explanatory flowchart representing the processing carried out by the transmitted-series inference section 13 shown in the block diagram of FIG. 15 to infer a series of symbols.

The branch-metric computation section 201 receives the reduced-interference signal $Y_n$ as the data D206 from the FFT section 12 (shown in FIG. 3) and the transmission-line information $H_{n+1}$ as the data D203 from the transmission-line characteristic inference section 17 (shown in FIG. 3).

In addition, the transmission-line information $H_{n+1}$ received from the transmission-line characteristic inference section 17 as the data D203 is also supplied to the register 206 to be stored in the register 206 as the transmission-line information $H_n$ for the time t=n leading ahead of the time t=n+1 by an interval of one time unit and, then, the register 207 as the transmission-line information $H_{n-1}$ for the time t=n−1 leading ahead of the time t=n+1 by an interval of two time units.

Data D202 representing the transmission-line information $H_n$ stored in the register 206 and data D201 representing the transmission-line information $H_{n-1}$ stored in the register 207 are supplied to the branch-metric computation section 201.

At that time, the data D205 stored in the register 210 of the path memory 208 as data representing the 16 surviving states $X''_{n,i,j}$ for the time t=n leading ahead of the time t=n+1 by an interval of one time unit and the data D204 stored in the register 212 of the path memory 208 as data representing the four surviving states $X''_{n-1,i}$ for the time t=n−1 leading ahead of the time t=n+1 by two (=L−1) time units for L=3 are also supplied to the branch-metric computation section 201.

The flowchart shown in FIG. 16 begins with a step S11 at which, for each of the 16(=$M^{L-1}$) symbol candidates $X''_{n,i,j}$ corresponding to 16 surviving states $X''_{n,i,j}$ respectively, the branch-metric computation section 201 finds a received value $X'_{n+1,i,j}$. Thus, the branch-metric computation section 201 finds a total of 16 received values $X'_{n+1,i,j}$. The branch-metric computation section 201 finds each of the received values $X'_{n+1,i,j}$ in accordance with Eq. (3) by making use of the reduced-interference signal $Y_n$ received as the data D206 from the FFT section 12 (shown in FIG. 3), the transmission-line information $H_{n+1}$ received as the data D203 from the transmission-line characteristic inference section 17 (shown, in FIG. 3), the transmission-line information $H_n$ received as the data D202 from the register 206, the transmission-line information $H_{n-1}$ received as the data D201 from the register 207, the data D205 received from the path memory 208 and the data D204 also received from the path memory 208. As described above, the data D205 is 16 symbol candidates $X''_{n,i,j}$ corresponding to surviving states $X''_{n,i,j}$ for the time t=n leading ahead of the time t=n+1 by an interval of one time unit. On the other hand, the data D204 is four symbol candidates $X''_{n-1,i}$ corresponding to surviving states $X''_{n-1,i}$ for the time t=n−1 leading ahead of the time t=n+1 by two (=L−1) time units where reference notation L denotes the cutoff length L which has been set at 3. The 16 symbol candidates $X''_{n,i,j}$ corresponding to surviving states $X''_{n,i,j}$ for the time t=n are symbol candidates which can become an inferred value of the transmitted symbol $X_n$ whereas the four symbol candidates $X''_{n-1,i,j}$ corresponding to surviving states $X''_{n-1,i}$ are symbol candidates which can become an inferred value of the transmitted symbol $X_{n-1}$.

Then, the flow of the processing goes on from the step S11 to a step S12 at which, for each of the 16 received values $X'_{n+1,i,j}$ the branch-metric computation section 201 selects four (=M) signal-points located on the IQ constellation plane as signal points each having a shorter Euclid distance to the received value $X'_{n+1,i,j}$ where reference notation M denotes the limited state count M which has been set at 4. Then, the branch-metric computation section 201 takes four symbols represented by the four signal points each having a shorter Euclid distance to the received values $X'_{n+1,i,j}$ as the symbol candidates $X''_{n+1,i,j,k}$(=$X''_{n+1,i,j,0}$, $X''_{n+1,i,j,1}$, $X''_{n+1,i,j,2}$ and $X''_{n+1,i,j,3}$) for the inferred value of the transmitted symbol $X_{n+1}$.

To put it in detail, at the step S12, the branch-metric computation section 201 finds the four symbol candidates $X''_{n+1,i,j,k}$(=$X''_{n+1,i,j,0}$, $X''_{n+1,i,j,1}$ $X''_{n+1,i,j,2}$ and $X''_{n+1,i,j,3}$) cited above for each of the 16 received values $X'_{n+1,i,j}$. That is to say, the state-metric computation section 202 finds a total of 64(=$M^L$) symbol candidates $X''_{n+1,i,j,k}$ at the step S12 where notation L denotes the cutoff length L which has been set at 3. Then, the branch-metric computation section 201 supplies states corresponding to the 64 symbol candidates $X''_{n+1,i,j,k}$ to the path memory 208 as 64 surviving candidates $X''_{n+1,i,j,k}$ represented by data D207.

Then, the flow of the processing goes on from the step S12 to a step S13 at which the branch-metric computation section 201 computes the branch metrics BM of 64 branches from 16 surviving parent states $X''_{n,i,j}$ for a time t=n leading ahead of the time t=n+1 by an interval of one time unit to the 64 aforementioned surviving candidates $X''_{n+1,i,j,k}$ for the time t=n+1 in accordance with Eq. (5) given before. Then, the branch-metric computation section 201 supplies the 64 branch metrics BM of 64 branches from the 16 surviving parent states $X''_{n,i,j}$ for a time t=n to the 64 surviving candidates $X''_{n+1,i,j,k}$ for the time t=n+1 to the state-metric computation section 202 as data D208. Subsequently, the flow of the processing goes on from the step S13 to a step S14.

At the step S14, the state-metric computation section 202 computes a state metric sm for each of the 64 surviving candidates $X''_{n+1,i,j,k}$ for the time t=n+1 by making use of the data D208 received from the branch-metric computation section 201 as data representing the 64 branch metrics BM and the data D209 stored in the register 205 as data representing the state metrics sm of the 16 surviving parent states $X''_{n,i,j}$ for a time t=n leading ahead of the time t=n+1 by an interval of one time unit.

It is assumed that the branch metrics BM of the 16 surviving parent states $X''_{n,i,j,k}$ are represented as $BM_{n+1,i,j,k}$ as well as the state metrics sm of the 16 surviving parent states $X''_{n,i,j}$ are represented as $sm_{n,i,j}$. In this case, the state-metric computation section 202 computes the state metric $sm_{n+1,i,j,k}$ of each of the 64 surviving candidates $X''_{n+1,i,j,k}$ that is, computes in accordance with the equation $sm_{n+1,i,j,k}$=$BM_{n+1,i,j,k}$+$sm_{n,i,j}$.

Then, the state-metric computation section 202 supplies the data D210 representing the state metric $sm_{n+1,i,j,k}$ of each of the 64 surviving candidates $X''_{n+1,i,j,k}$ for the time t=n+1 to the minimum-state-metric detection section 203 and the selector 204. Subsequently, the flow of the processing goes on from the step S14 to a step S15.

At the step S15, the minimum-state-metric detection section 203 detects the smallest state metric among the data D210 received from the state-metric computation section 202 as data representing the state metric $sm_{n+1,i,j,k}$ of each of the 64 surviving candidates $X''_{n+1,i,j,k}$ for the time t=n+1. Subsequently, the flow of the processing goes on from the step S15 to a step S16.

At the step S16, as an effective state, the minimum-state-metric detection section 203 takes a surviving ancestor state $X''_{n-1,i}$ that can be reached as a state for the time t=n-1(=(n+1)-(L-1)) by going upstream through branches in the trellis from the surviving candidate $X''_{n+1,i}$ with the smallest state metric sm among the data D210 received from the state-metric computation section 202 as data representing the state metric $sm_{n+1,i,j,k}$ of each of the 64 surviving candidates $X''_{n+1,i,j,k}$ for the time t=n+1 by a distance of two (=L-1) time units where reference notation L denotes the cutoff length L which has been set at 3.

Then, also at the step S16, the minimum-state-metric detection section 203 supplies data D211 serving as effective-state information representing the effective state $X''_{n-1,i}$ to the selector 204 as well as the selector 209, the selector 211 and the selector 213, which are employed in the path memory 208. Subsequently, the flow of the processing goes on to a step S17.

At the step S17, the selector 204 selects the state metrics sm of 16 particular surviving candidates $X''_{n+1,i,j,k}$, which are each selected to serve as a new surviving state, among the data D210 received from the state-metric computation section 202 as data representing the state metric $sm_{n+1,i,j,k}$ of each of the 64 surviving candidates $X''_{n+1,i,j,k}$ for the time t=n+1. The 16 particular surviving candidates $X''_{n+1,i,j,k}$ are surviving candidates $X''_{n+1,i,j,k}$ each indirectly originated from the effective state $X''_{n-1,i}$ represented by the data D211 received from the minimum-state-metric detection section 203 as data serving as effective-state information. Then, the selector 204 provides the register 205 with data D213 representing state metrics sm selected to serve as the state metrics sm of the 16 particular surviving candidates $X''_{n+1,i,j,k}$ among the data D210 received from the state-metric computation section 202 as data representing the state metric $sm_{n+1,i,j,k}$ of each of the 64 surviving candidates $X''_{n+1,i,j,k}$ for the time t=n+1. The register 205 is used for storing the data D213 received from the selector 204 as data representing the state metrics sm of the 16 particular surviving candidates $X''_{n+1,i,j,k}$.

The register 205 supplies the data D213 representing the state metrics sm of the 16 particular surviving candidates $X''_{n+1,i,j,k}$ to the state-metric computation section 202 as the data D209 representing the state metrics sm of the 16 surviving states $X''_{n,i,j}$ for the time t=n leading ahead of the time t=n+1 by an interval of one time unit at the processing time to process the next carrier.

In addition, also at the step S17, the selector 213 employed in the path memory 208 selects a symbol candidate corresponding to the effective state $X''_{n-1,i}$ represented by the effective-state information D211 received from the minimum-state-metric detection section 203 among the data D204 stored in the register 212 as data representing the four surviving states $X''_{n-1,i}$ for the time t=n-1 and outputs the selected symbol candidate to the interference-component inference section 14 employed in the receiving apparatus shown in the block diagram of FIG. 3 as the data D215 representing an inferred value $X''_{n-1,i}(=X''_{n+1-(L-1),i})$ of a transmitted symbol $X_{n-1}(=X_{n+1-(L-1)})$ for L=3.

On top of that, also at the step S17, the selector 211 employed in the path memory 208 selects four surviving states originated directly in the trellis from the effective state $X''_{n-1,i}$ represented by the effective-state information D211 received from the minimum-state-metric detection section 203 among the data D205 received from the register 210 as data representing the 16 surviving states $X''_{n,i,j}$ for the time t=n to serve as 4 new surviving states $X''_{n-1,i}$ for the time t=n-1 at a processing time to process the next carrier.

Then, the selector 211 supplies the register 212 with data D214 representing the four new surviving states $X''_{n-1,i}$. The register 212 is used for storing the data D214 received from the selector 211 as data representing the 4 new surviving states $X''_{n-1,i}$.

In addition, also at the step S17, the selector 209 employed in the path memory 208 selects 16 surviving candidates originated indirectly in the trellis from the effective state $X''_{n-1,i}$ represented by the effective-state information D211 received from the minimum-state-metric detection section 203 among the data D207 received from the branch-metric computation section 201 as data representing the 64 surviving candidates $X''_{n+1,i,j,k}$ for the time t=n+1 to serve as 16 new surviving states $X''_{n,i,j}$ for the time t=n at a processing time to process the next carrier.

Then, the selector 209 supplies the register 210 with data D212 representing the 16 new surviving states $X''_{n,i,j}$. The register 210 is used for storing the data D212 received from the selector 209 as data representing the 16 new surviving states $X''_{n,i,j}$.

Then, when the branch-metric computation section 201 receives the reduced-interference signal $Y_n$ received as the data D206 for the next carrier from the FFT section 12 (shown in FIG. 3) and the transmission-line information $H_{n+1}$ received as the data D203 for the next carrier from the transmission-line characteristic inference section 17 (shown in FIG. 3), the flow of the processing goes back from the step S17 to the step S11 to repeat the processing described above.

Figure 17:
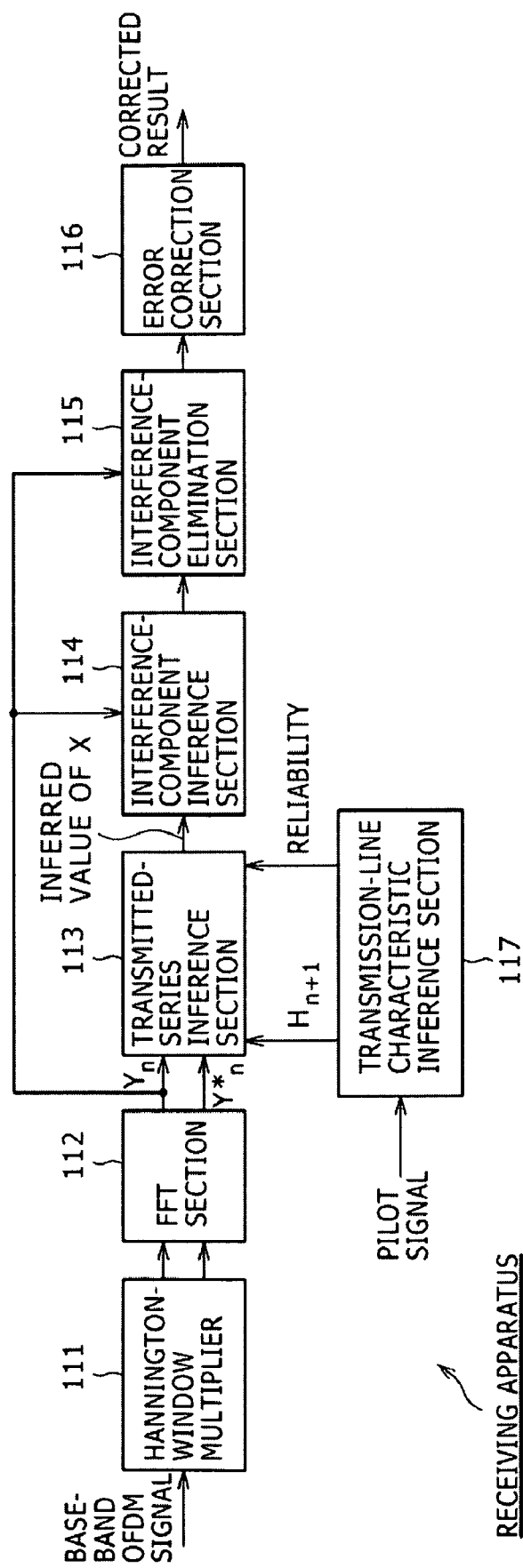
FIG. 17 is a block diagram showing a typical configuration of a receiving apparatus according to another embodiment of the present invention.

Next, FIG. 17 is given as a block diagram showing a typical configuration of a receiving apparatus according to another embodiment of the present invention.

Components employed in the other embodiment shown in the block diagram of FIG. 17 as components identical with their respective counterparts employed in the embodiment shown in the block diagram of FIG. 3 are denoted by the same reference numerals as the counterparts and the identical components are not explained again in the following description in order to avoid duplications of descriptions.

The receiving apparatus shown in the block diagram of FIG. 17 employs an interference-component inference section 14, an interference-component elimination section 15 and an error correction section 16 which are identical with their respective counterparts employed in the receiving apparatus shown in the block diagram of FIG. 3.

The receiving apparatus shown in the block diagram of FIG. 17 is different from the receiving apparatus shown in the block diagram of FIG. 3, however, in that the receiving apparatus shown in the block diagram of FIG. 17 employs a Hannington-window multiplication section 111, a FFT section 112, a transmitted-series inference section 113 and a transmission-line characteristic inference section 117 to serve as substitutes for respectively the Hannington-window multiplication section 11, the FFT section 12, the transmitted-series inference section 13 and the transmission-line characteristic inference section 17 which are employed in the receiving apparatus shown in the block diagram of FIG. 3.

As described previously, in the receiving apparatus shown in the block diagram of FIG. 3, a Hannington window with coefficients of $-\frac{1}{2}$, $-1$ and $-\frac{1}{2}$ is applied to the OFDM signal to establish a constraint condition of Eq. (1) in a process to infer a series of symbols by making use of a trellis. The Hannington window with coefficients of $-\frac{1}{2}$, $+1$ and $-\frac{1}{2}$ is the so-called Hannington window with a phase of 0 and is referred to as a reference Hannington window in the following description.

In the case of the receiving apparatus shown in the block diagram of FIG. 17, on the other hand, a Hannington window with a properly adjusted phase is also applied to the OFDM signal to establish a constraint condition for a process to infer a series of symbols by making use of a trellis. Referred to as an adjusted-phase Hannington window in the following description, the Hannington window with a properly adjusted phase is a Hannington window having coefficients different from those of the reference Hannington window.

The receiving apparatus shown in the block diagram of FIG. 17 computes the branch metric BM of a branch to each surviving candidate by synthesizing branch metrics BM calculated for the reference Hannington window and adjusted-phase Hannington windows applied to the OFDM signal as two or more window functions having coefficient sets different from each other. Then, the receiving apparatus shown in the block diagram of FIG. 17 infers a series of symbols by making use of the synthesis branch metric BM.

By virtue of a method for inferring a series of symbols by making use of two or more window functions having coefficient sets different from each other, the signal reception characteristic can be further improved in comparison with a case in which only one window function is used. This method is referred also to as a window diversity.

The receiving apparatus shown in the block diagram of FIG. 17 infers a series of symbols by making use of a window diversity provided by a variety of window functions.

To put it in detail, the Hannington-window multiplication section 111 receives a base-band OFDM signal which is a signal in the time domain. In the same way as the Hannington-window multiplication section 11 employed in the receiving apparatus shown in the block diagram of FIG. 3, the Hannington-window multiplication section 111 applies the reference Hannington window to the OFDM signal supplied thereto and outputs an OFDM signal to the FFT section 112 as a result of the process of applying the reference Hannington window to the original OFDM signal.

In addition, the Hannington-window multiplication section 111 also applies the adjusted-phase Hannington window to the OFDM signal supplied thereto and outputs an OFDM signal to the FFT section 112 as a result of the process of applying the adjusted-phase Hannington window to the original OFDM signal.

In the same way as the FFT section 12 employed in the receiving apparatus shown in the block diagram of FIG. 3, the FFT section 112 carries out an FFT process on the OFDM signal received from the Hannington-window multiplication section 111 as an OFDM signal obtained as a result of the process of applying the reference Hannington window to the original OFDM signal. Then, the FFT section 112 provides the transmitted-series inference section 113, the interference-component inference section 14 and the interference-component elimination section 15 with the reduced-interference signal $Y_n$ expressed by Eq. (1) given earlier as a signal which has been obtained as a result of the FFT process.

In addition, the FFT section 112 also carries out an FFT process on the OFDM signal received from the Hannington-window multiplication section 111 as an OFDM signal obtained as a result of the process of applying the adjusted-phase Hannington window to the original OFDM signal. Then, the FFT section 112 provides the transmitted-series inference section 113 with a reduced-interference signal $Y^*_n$ which has been obtained as a result of the FFT process.

The reduced-interference signal $Y^*_n$ obtained as a result of the FFT process carried out on the OFDM signal obtained as a result of the process of applying the adjusted-phase Hannington window to the original OFDM signal is expressed by Eq. (8) as follows.

[Eq. 8]

$$Y^*_n = W_m X_{n-1} H_{n-1} + W_c X_n H_n + W_p X_{n+1} H_{n+1} + N_n \quad (8)$$

It is to be noted that each of reference notations $W_m$, $W_c$ and $W_p$ used in the equation given above denotes a coefficient of the adjusted-phase Hannington window. The coefficients $W_m$, $W_c$ and $W_p$ vary in accordance with the phase of the adjusted-phase Hannington window.

Much like the reduced-interference signal $Y_n$ expressed by Eq. (1), the reduced-interference signal $Y^*_n$ expressed by Eq. (8) can be regarded as a convolution signal. Thus, the transmitted symbol $X_n$ can be inferred by carrying out a process of inferring a series of symbols by making use of a trellis.

Therefore, the receiving apparatus shown in the block diagram of FIG. 17 is capable of establishing constraint conditions of Eqs. (1) and (8) as constraint conditions for inferring a symbol series (or a data series) of transmitted symbols $X_n$ on the basis of trellises by applying the reference Hannington window and an adjusted-phase Hannington window to the OFDM signal.

The transmitted-series inference section 113 infers a symbol series of transmitted symbols by making use of the reduced-interference signal $Y_n$ and the reduced-interference signal $Y^*_n$, which each have been received from the FFT section 112 as a convolution signal, supplying the inferred value of each of the transmitted symbols to the interference-component inference section 14.

The transmitted-series inference section 113 receives the reduced-interference signal $Y_n$ and the reduced-interference signal $Y^*_n$ from the FFT section 112 as well as the transmission-line information $H_{n+1}$ and a reliability from the transmission-line characteristic inference section 117 to be used in the process of inferring a symbol series of transmitted symbols.

Typically, the reliability indicates a degree with which the phase of the adjusted-phase Hannington window matches the position (the phase or the delay quantity) of a multipath echo. Typically, the reliability corresponds to the smallness of the quantity of an inter-symbol interference contained in the reduced-interference signal $Y^*_n$.

Thus, the transmitted-series inference section 113 infers a symbol series of transmitted symbols by making use of a trellis on the basis of the reduced-interference signal $Y_n$ and the reduced-interference signal $Y^*_n$, which have been received from the FFT section 112, as well as the transmission-line information $H_{n+1}$ and the reliability which have been received from the transmission-line characteristic inference section 117.

To put it concretely, in the same way as the transmitted-series inference section 13 shown in FIG. 3, the transmitted-series inference section 113 finds first candidates for the received value $X'_{n+1}$ of the transmitted symbol $X_{n+1}$ by making use of the reduced-interference signal $Y_n$ and the transmission-line information $H_{n+1}$ in accordance with Eq. (3). In the following description, a first candidate for the received value $X'_{n+1}$ of the transmitted symbol $X_{n+1}$ is also referred to as a candidate for the received value $X'_{n+1}$ for the reference Hannington window.

In addition, the transmitted-series inference section 113 finds second candidates for the received value $X'_{n+1}$ of the transmitted symbol $X_{n+1}$ by making use of the reduced-interference signal $Y^*_n$ and the transmission-line information $H_{n+1}$ in accordance with Eq. (9) given below to serve as an equation which expresses the transmitted symbol $X_{n+1}$. Eq. (9) is an equation derived from Eq. (8), which expresses the reduced-interference signal $Y^*_n$, by discarding the noise component $N_n$. In the following description, a second candidate for the received value $X'_{n+1}$ of the transmitted symbol $X_{n+1}$ is also referred to as a candidate for the received value $X'_{n+1}$ for the adjusted-phase Hannington window.

[Eq. 9]

$$X_{n+1} = \frac{Y'_n - W_m X_{n-1} H_{n-1} - W_c X_n H_n}{W_p H_{n-1}} \qquad (9)$$

Then, the transmitted-series inference section 113 synthesizes a candidate A for the received value $X'_{n+1}$ for the reference Hannington window with a candidate B for the received value $X'_{n+1}$ for the adjusted-phase Hannington window in accordance with the reliability received from the transmission-line characteristic inference section 117 and takes the result of the synthesizing process as the received value $X'_{n+1}$ of the transmitted symbol $X_{n+1}$.

To put it in detail, let reference notation $\alpha$ denote the reliability received from the transmission-line characteristic inference section 117 to serve as a reliability representing a degree with which the phase of the adjusted-phase Hannington window matches the phase of a multipath echo and have a value in the range 0 to 1. In this case, the transmitted-series inference section 113 synthesizes a candidate A for the received value $X'_{n+1}$ for the reference Hannington window with a candidate B for the received value $X'_{n+1}$ for the adjusted-phase Hannington window typically in accordance with the following equation:

Synthesizing-process result=$(1-\alpha)A + \alpha B$

The transmitted-series inference section 113 takes the result of the synthesizing process as the received value $X'_{n+1}$ of the transmitted symbol $X_{n+1}$.

Then, in the same way as the transmitted-series inference section 13 shown in FIG. 3, the transmitted-series inference section 113 finds $64(=M^L)$ surviving candidates from the received value $X'_{n+1}$ and computes first and second candidates for the branch metric BM of the branch to each of the 64 surviving candidates.

To put it in detail, for the reference Hannington window, the transmitted-series inference section 113 computes the branch metric BM in accordance with Eq. (5) with the right-side expression thereof including the reduced-interference signal $Y_n$ and takes the computed branch metric BM as a first candidate $BM_1$ for the branch metric BM of the branch to a surviving candidate.

For the adjusted-phase Hannington window, on the other hand, the transmitted-series inference section 113 computes the branch metric BM in accordance with Eq. (10) shown below as an equation with the right-side expression thereof including the reduced-interference signal $Y^*_n$ as the expression on the right-hand side of Eq. (5) includes the reduced-interference signal $Y_n$. The transmitted-series inference section 113 takes the computed branch metric BM as a second candidate $BM_2$ for the branch metric BM of the branch to a surviving candidate.

[Eq. 10]

$$BM = |Y^*_n - (W_m X_{n-1} H_{n-1} + W_c X_n H_n + W_p X_{n+1} H_{n+1})|^2 \qquad (10)$$

Then, the transmitted-series inference section 113 synthesizes the first branch-metric candidate $BM_1$ computed for the reference Hannington window with the second branch-metric candidate $BM_2$ computed for the adjusted-phase Hannington window in accordance with the reliability received from the transmission-line characteristic inference section 117 and takes the result of the synthesizing process as the branch metric BM of the branch to the surviving candidate.

To put it in detail, let reference notation $\alpha$ denote the reliability received from the transmission-line characteristic inference section 117 to serve as a reliability representing a degree with which the phase of the adjusted-phase Hannington window matches the phase of a multipath echo and have a value in the range 0 to 1 as described above. In this case, the transmitted-series inference section 113 synthesizes the first branch-metric candidate $BM_1$ computed for the reference Hannington window with the second branch-metric candidate $BM_2$ computed for the adjusted-phase Hannington window typically in accordance with the following equation:

Synthesizing-process result=$(1-\alpha)BM_1 + \alpha BM_2$

Then, the transmitted-series inference section 113 takes the result of the synthesizing process as the branch metric BM of the branch to the surviving candidate.

Subsequently, the transmitted-series inference section 113 finds the state metric sm of the surviving candidate by making use of the branch metric BM of the branch to the surviving candidate and determines the inferred value $X''_{n+1}$ of the transmitted symbol $X_{n+1}$ in the same way as the transmitted-series inference section 13 shown in the block diagram of FIG. 3.

The transmission-line characteristic inference section 117 receives a pilot signal conforming to the OFDM system. In the same way as the transmission-line characteristic inference section 17 shown in the block diagram of FIG. 3, the transmission-line characteristic inference section 117 infers the transmission-line information $H_{n+1}$ from the pilot signal and supplies the transmission-line information $H_{n+1}$ to the transmitted-series inference section 113.

In addition, the transmission-line characteristic inference section 117 detects the phase of a multipath echo from the pilot signal. Then, the transmission-line characteristic inference section 117 computes a reliability $\alpha$ representing a degree with which the phase of the adjusted-phase Hannington window matches the phase of the multipath echo, and supplies the reliability $\alpha$ to the transmitted-series inference section 113.

Figure 18:
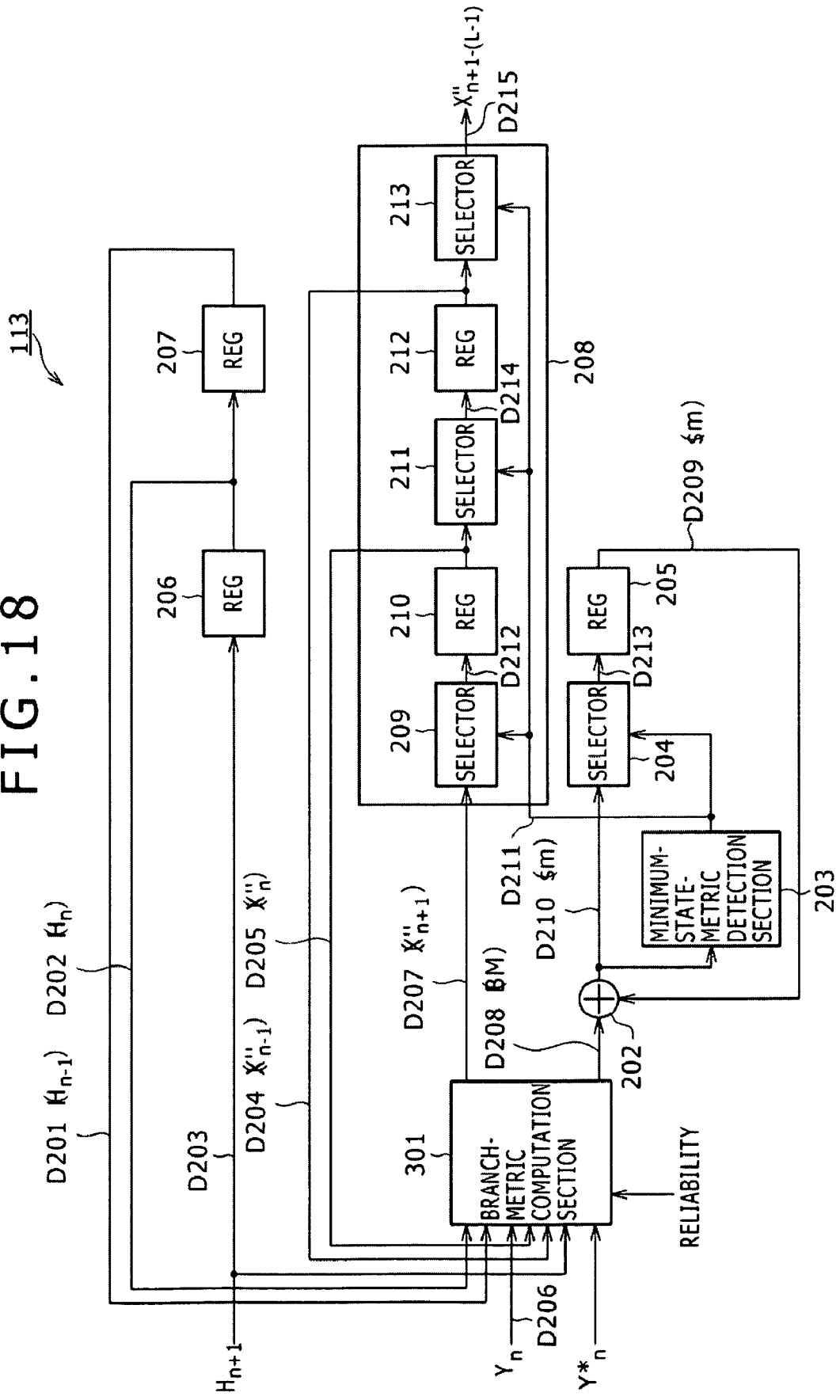
FIG. 18 is a block diagram showing a typical configuration of a transmitted-series inference section employed in the receiving apparatus shown in the block diagram of FIG. 17.

FIG. 18 is a block diagram showing a typical configuration of the transmitted-series inference section 113 employed in the receiving apparatus shown in the block diagram of FIG. 17.

Components employed in the transmitted-series inference section 113 shown in the block diagram of FIG. 18 as components identical with their respective counterparts employed in the transmitted-series inference section 13 shown in the block diagram of FIG. 15 are denoted by the same reference numerals as the counterparts, and the identical components are not explained again in the following description in order to avoid duplications of descriptions.

The transmitted-series inference section 113 shown in the block diagram of FIG. 18 is similar to the transmitted-series inference section 13 shown in the block diagram of FIG. 15 in that the transmitted-series inference section 113 shown in the block diagram of FIG. 18 also employs the state-metric computation section 202, the minimum-state-metric detection section 203, the selector 204, the registers 205 to 207 and the path memory 208.

The transmitted-series inference section 113 shown in FIG. 18 is different from the transmitted-series inference section 13 shown in FIG. 15, however, in that the transmitted-series inference section 113 shown in FIG. 18 employs a branch-metric computation section 301 which serves as a substitute for the branch-metric computation section 201 employed in the transmitted-series inference section 13 shown in FIG. 18.

The branch-metric computation section 301 receives a reduced-interference signal $Y_n$ denoted by reference notation D206 as well as a reduced-interference signal $Y^*_n$ from the FFT section 112 shown in FIG. 17 and transmission-line information $H_{n+1}$ denoted by reference notation D203 from the transmission-line characteristic inference section 117 shown in FIG. 17.

In addition, the branch-metric computation section 301 also receives transmission-line information $H_n$ denoted by reference notation D202 from the register 206 and transmission-line information $H_{n-1}$ denoted by reference notation D201 from the register 207.

On top of that, the branch-metric computation section 301 also receives surviving states from the path memory 208. Strictly speaking, the branch-metric computation section 301 receives symbol candidates each corresponding to one of the surviving states from the path memory 208.

That is to say, with the limited state count M set at 4 and the cutoff length L set at 3 as described above the branch-metric computation section 301 receives data D205 and data D204 from the path memory 208. The data D205 is 16(symbol candidates $X"_{n,i,j}$ corresponding to) surviving states $X"_{n,i,j}$ for the time t=n leading ahead of the time t=n+1 by an interval of one time unit. On the other hand, the data D204 is four (symbol candidates $X"_{n-1,i,j}$ corresponding to) surviving states $X"_{n-1,i}$ for the time t=n−1 leading ahead of the time t=n+1 by two (=L−1) time units where reference notation L denotes the cutoff length L which has been set at 3.

In the same way as the branch-metric computation section 201 shown in the block diagram of FIG. 15, while limiting the number of states (or surviving candidates) originated from each of 16(=$M^{L-1}$) surviving states $X"_{n,i,j}$ for the time t=n leading ahead of the time t=n+1 by an interval of one time unit to serve as states (or surviving candidates) $X"_{n+1,i,j,k}$ for the time t=n+1 to four (=M), the branch-metric computation section 301 computes the branch metric $BM_{i,j,k}$ of the branch from each of 16(=$M^{L-1}$) surviving states $X"_{n,i,j}$ to each of the states (or surviving candidates) $X"_{n+1,i,j,k}$ and supplies the branch metric $BM_{i,j,k}$ to the state-metric computation section 202 as data D208 where reference notation M denotes the limited state count M which has been set at 4.

In this case, however, the branch-metric computation section 301 computes the data D208 representing the branch metric $BM_{i,j,k}$ of the branch from each of 16(=$M^{L-1}$) surviving states $X"_{n,i,j}$ to each of the states (or surviving candidates) $X"_{n+1,i,j,k}$ by synthesizing a first branch-metric candidate $BM_1$ calculated for the reference Hannington window with a second branch-metric candidate $BM_2$ calculated for the adjusted-phase Hannington window in accordance with the reliability received from the transmission-line characteristic inference section 117.

That is to say, for the reference Hannington window, the branch-metric computation section 301 finds a candidate for a received value $X'_{n+1,i,j}$ in accordance with Eq. (3) by making use of the reduced-interference signal $Y_n$ received as the data D206 from the FFT section 112 shown in FIG. 17, the transmission-line information $H_{n+1}$ received as the data D203 from the transmission-line characteristic inference section 117 shown in FIG. 17, the transmission-line information $H_n$ received as the data D202 from the register 206, the transmission-line information $H_{n-1}$ received as the data D201 from the register 207, the data D205 received from the path memory 208 and the data D204 also received from the path memory 208. As described above, the data D205 is symbol candidates $X"_{n,i,j}$ corresponding to 16 surviving states $X"_{n,i,j}$ for the time t=n. On the other hand, the data D204 is symbol candidates $X"_{n-1,i,j}$ corresponding to four surviving states $X"_{n-1,i,j}$ for the time t=n−1. The symbol candidates $X"_{n,i,j}$ corresponding to 16 surviving states $X"_{n,i,j}$ for the time t=n are symbol candidates which can become an inferred value of the transmitted symbol $X_n$ whereas the symbol candidates $X"_{n-1,i,j}$ corresponding to four surviving states $X"_{n-1,i,j}$ are symbol candidates which can become an inferred value of the transmitted symbol $X_{n-1}$.

In addition, for the adjusted-phase Hannington window, the branch-metric computation section 301 finds a candidate for a received value $X'_{n+1,i,j}$ in accordance with Eq. (3) by making use of the reduced-interference signal $Y^*_n$ received as the data D206 from the FFT section 112 (shown in FIG. 17), the transmission-line information $H_{n+1}$ received as the data D203 from the transmission-line characteristic inference section 117 (shown in FIG. 17), the transmission-line information $H_n$ received as the data D202 from the register 206, the transmission-line information $H_{n-1}$ received as the data D201 from the register 207, the data D205 received from the path memory 208 and the data D204 also received from the path memory 208. As described above, the data D205 is symbol candidates $X"_{n,i,j}$ corresponding to 16 surviving states $X"_{n,i,j}$ for the time t=n. On the other hand, the data D204 is symbol candidates $X"_{n-1,i}$ corresponding to four surviving states $X"_{n-1,i}$ for the time t=n−1. The symbol candidates $X"_{n,i,j}$ corresponding to 16 surviving states $X"_{n,i,j}$ for the time t=n are symbol candidates which can become an inferred value of the transmitted symbol $X_n$ whereas the symbol candidates $X"_{n-1,i}$ corresponding to four surviving states $X"_{n-1,i}$ are symbol candidates which can become an inferred value of the transmitted symbol $X_{n-1}$.

Then, the transmitted-series inference section 113 synthesizes the candidate computed for the reference Hannington window to serve as a candidate for a received value $X'_{n+1,i,j}$ with the candidate computed for the adjusted Hannington window to serve as a candidate for a received value $X'_{n+1,i,j}$ in accordance with the reliability received from the transmission-line characteristic inference section 117 and takes the result of the synthesizing process as the received value $X'_{n+1,i,j}$ of the transmitted symbol $X_{n+1}$.

After that, the branch-metric computation section 301 selects four (=M) signal points located on the IQ constellation plane as signal points each having a shorter Euclid distance to the received value $X'_{n+1,i,j}$ where reference notation M denotes the limited state count M which has been set at 4. Then, the branch-metric computation section 301 takes four symbols represented by the four signal points each having a shorter Euclid distance to the received values $X'_{n+1,i,j}$ as the symbol candidates $X"_{n+1,i,j,k}$(=$X"_{n+1,i,j,0}$, $X"_{n+1,i,j,1}$ $X"_{n+1,i,j,2}$ and $X"_{n+1,i,j,3}$) for the inferred value of the transmitted symbol $X_{n+1}$.

Since the four symbol candidates $X"_{n+1,i,j,k}$(=$X"_{n+1,i,j,0}$, $X"_{n+1,i,j,1}$ $X"_{n+1,i,j,2}$ and $X"_{n+1,i,j,3}$) cited above are found for each of the 16 received values $X'_{n+1,i,j}$, a total of 64(=$M^L$) symbol candidates $X"_{n+1,i,j}$ are found where notation L denotes the cutoff length L which has been set at 3. Then, the branch-metric computation section 301 supplies states corresponding to the 64 symbol candidates $X"_{n+1,i,j,k}$ to the path memory 208 as 64 surviving candidates $X"_{n+1,i,j,k}$ represented by data D207.

In addition, in the same way as the branch-metric computation section 201 shown in FIG. 15, the transmitted-series inference section 301 computes a branch metric BM in accordance with Eq. (5) and takes the computed branch metric BM as a first candidate for the branch BM of the branch from a surviving state $X''_{n,i,j}$ for the time t=n leading ahead of the time t=n+1 by an interval of one time unit to a surviving candidate $X''_{n+1,i,j,k}$ for the time t=n+1.

That is to say, for the reference Hannington window, the branch-metric computation section 301 computes a branch metric BM in accordance with Eq. (5) with the right-side expression thereof including the reduced-interference signal $Y_n$ and takes the computed branch metric BM as a first candidate for the branch BM of the branch from a surviving state $X''_{n,i,j}$ for the time t=n leading ahead of the time t=n+1 by an interval of one time unit to a surviving candidate $X''_{n+1,i,j,k}$.

By the same token, for the adjusted-phase Hannington window, the branch-metric computation section 301 also computes a branch metric BM in accordance with Eq. (10) with the right-side expression thereof including the reduced-interference signal $Y^*_n$ and takes the computed branch metric BM as a second candidate for the branch metric BM to a surviving candidate $X''_{n+1,i,j,k}$.

Then, the branch-metric computation section 301 synthesizes the candidate for the reference Hannington window to serve as the first candidate for the branch metric BM with the candidate calculated for the adjusted-phase Hannington window to serve as the second candidate for the branch metric BM in accordance with the reliability received from the transmission-line characteristic inference section 117.

Subsequently, the branch-metric computation section 301 provides the state-metric computation section 202 with the result of the process of synthesizing the candidate calculated for the reference Hannington window to serve as the first candidate with the candidate calculated for the adjusted-phase Hannington window to serve as the second candidate. The branch-metric computation section 301 supplies the synthesis branch metrics BM to the state-metric computation section 202 as data D208.

As described above, in the receiving apparatus shown in the block diagram of FIG. 3, a received value $X'_{n+1}$ of a transmitted symbol $X_{n+1}$ is found from the reduced-interference signal $Y_n$ (or the reduced-interference signal $Y_n$ and the reduced-interference signal $Y^*_n$ in the case of the receiving apparatus shown in the block diagram of FIG. 17), and the number of symbol candidates for the transmitted symbol $X_{n+1}$ is squeezed or limited to the limited state count M which is the number of symbols each represented by a signal point separated away from the received value $X'_{n+1}$ on the IQ plane by a shorter Euclid distance.

In addition, a state corresponding to each of the symbol candidates is taken as a surviving candidate which is a candidate for a surviving state and a branch metric BM of the branch to the surviving candidate is computed. The branch to a surviving candidate is a branch through which a transition to the surviving candidate from a parent state from which the surviving candidate has been originated is made. Then, the state metric sm of a surviving candidate is calculated by making use the branch metric BM of the branch to the surviving candidate.

Subsequently, a smallest state metric among the state metrics sm of the surviving candidates is identified. Then, as an effective state, the receiving apparatus takes a particular surviving state which can be reached by going upstream through branches in the trellis from the surviving candidate with the smallest state metric sm by a distance of (L−1) time units where reference notation L denotes the cutoff length L. Subsequently, a symbol candidate for the effective state is selected and output as the inferred value of the transmitted symbol $X_{n+1-(L-1)}$.

In addition, surviving states originated directly from the effective state and surviving candidates originated directly from the effective state are selected to serve as new surviving states, and states other than the new surviving states are excluded from being used as subjects for which branch and state metrics are to be computed.

Thus, while the number of surviving candidates is being limited to a fixed value of $M^L$, the series of symbols can be inferred. As a result, it is possible to avoid a substantial increase of the size of the receiving apparatus due to the extremely large number of surviving candidates.

In addition, by making use of a window diversity provided by a variety of window functions, the signal reception characteristic can be further improved.

It is to be noted that, for a large value of the limited state count M and a large value of cutoff length L, the signal reception characteristic can be better improved. In this case, however, the number of surviving states and the number of surviving candidates are also large, undesirably increasing the size of the receiving apparatus.

For a small value of the limited state count M and a small value of cutoff length L, on the other hand, the number of surviving states and the number of surviving candidates are also small as well, making it possible to avoid the increase of the size of the receiving apparatus. In this case, however, the signal reception characteristic inevitably deteriorates to a certain degree.

It is thus desirable to determine the values of the limited state count M and the cutoff length L by considering the tradeoff between the signal reception characteristic and size of the receiving apparatus.

In addition, it is desirable to set the cutoff length L at a value at least equal to 2. This is because, if the value of the cutoff length L is set at 1, the processing is no longer the processing to infer a data series or no longer the inference processing which makes use of a trellis.

The series of processes described previously can be carried out by hardware and/or execution of software. If the series of processes described above is carried out by execution of software, each of programs composing the software can be installed into typically a general-purpose computer functioning as the receiving apparatus from a download site, a recording medium or the like.

Figure 19:
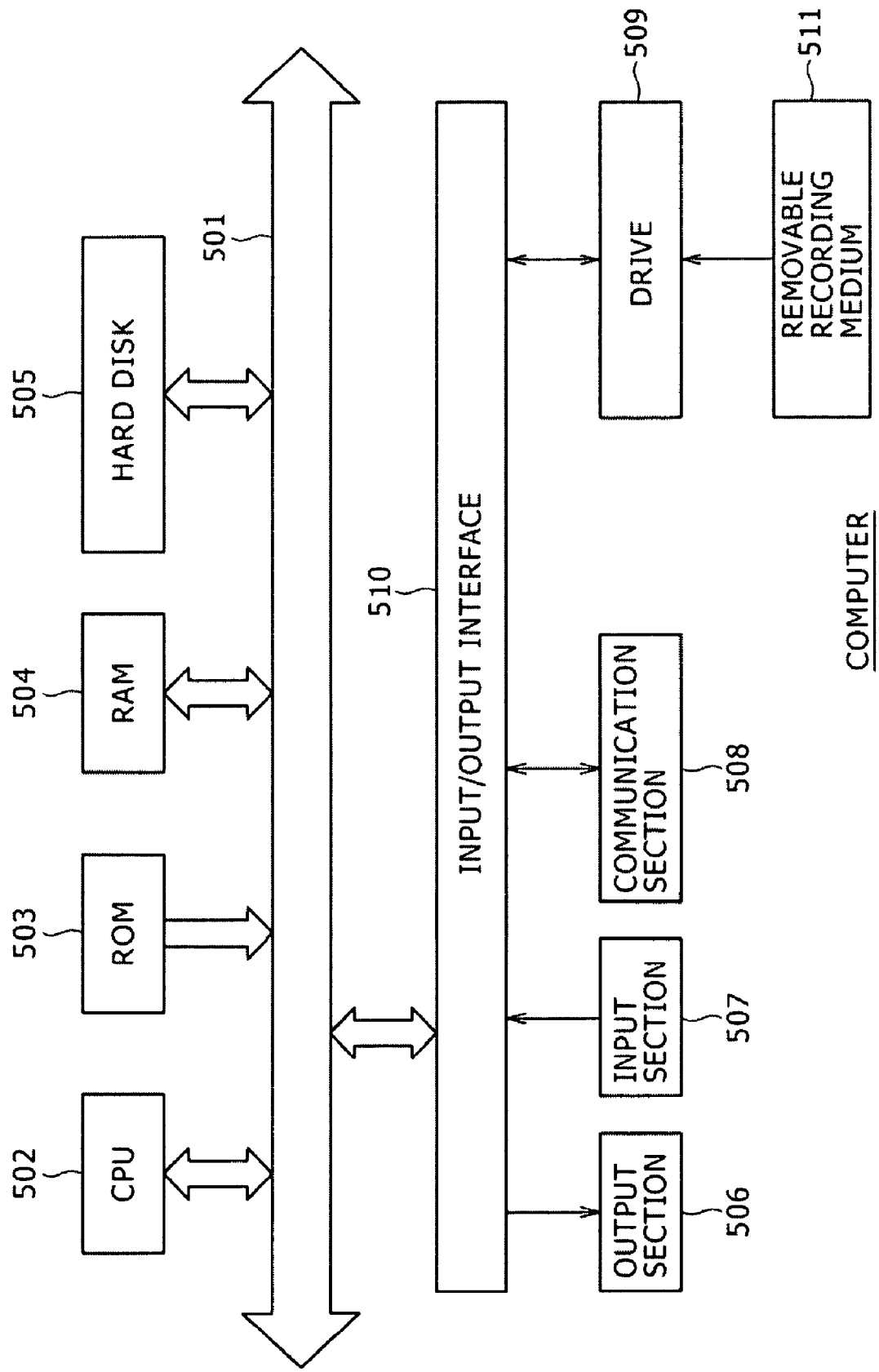
FIG. 19 is a block diagram showing a typical configuration of an embodiment implementing a computer to which the present invention is applied.

FIG. 19 is a block diagram showing a typical configuration of an embodiment implementing the computer in which each of the programs is installed as a program to be executed to carry out the series of processes described previously.

Each of the programs is installed from typically a download site mentioned above or a removable recording medium 511 into a hard disk 505 which is embedded in the computer to serve as a storage section. As an alternative, each of the programs is stored in advance in a ROM (Read Only Memory) 503 which serves as another storage section embedded in the computer.

Examples of the removable recording medium 511 also each referred to as a package medium include a magnetic disk such as a flexible disk, an optical disk such as a CD-ROM (Compact Disc Read Only Memory) or a DVD (Digital Versatile Disk), an MO (magneto-optical) disk and a semiconductor memory. Each of the programs can be stored in the removable recording medium 511 permanently or temporarily. The programs stored in the removable recording medium 511 are given to the user as the so-called package software recorded on the package medium.

Instead of installing each of the programs from the removable recording medium 511 into the computer, the programs can also be installed from the download site cited before. In this case, each of the programs is downloaded to the computer through a radio communication from the download site by way of an artificial satellite provided for digital satellite broadcastings. As an alternative, each of the programs is downloaded to the computer through a wire communication from the download site by way of a network such as a LAN (Local Area Network) or the Internet. In the computer, each of the programs downloaded from the download site is received by a communication section 508 to be eventually installed into the hard disk 505.

In the computer shown in the block diagram of FIG. 19 as a computer for executing functions of the receiving apparatus, a CPU (Central Processing Unit) 502 carries out various kinds of processing in accordance with the flowchart described previously or processing of sections included in configurations shown in various block diagrams of figures by execution of the programs stored in advance in the ROM 503 or the programs loaded from the hard disk 505, in which the programs have been installed, into a RAM (Random Access Memory) 504. The RAM 504 is also used for properly storing various kinds of information such as data required in execution of the processing.

The CPU 502, the ROM 503, the RAM 504 and the hard disk 505 serving as the storage section as described above are connected to each other by a bus 501, which is also connected to an input/output interface 510. The input/output interface 510 is connected to an input section 507, an output section 506, the communication section 508 mentioned before and a drive 509. The input section 507 includes a keyboard, a mouse and a microphone whereas the output section 506 includes an LCD (Liquid Crystal Display) unit and a speaker. Typically, the user operates the input section 507 in order to enter a command, according to which a program stored in advance in the ROM 503 is executed or a program already installed in the hard disk 506 is loaded into the RAM 504 for execution. The CPU 502 outputs results of the processing carried out thereby to the output section 506 by way of the bus 501 and the input/output interface 510, transmits the results to an external apparatus by way of the bus 501, the input/output interface 510 and the communication section 508 or stores the results in the hard disk 505 by way of the bus 501.

As described above, each of the programs to be executed by the CPU 502 can be a program stored in advance in the ROM 503 or a program installed from the removable recording medium 511 mounted on the drive 509 into the hard disk 505 employed in the computer. As an alternative, each of the programs to be executed by the CPU 502 can also be a program installed from the download site cited before. In this case, each of the programs to be executed by the CPU 502 is downloaded to the computer through a radio communication from the download site by way of an artificial satellite provided for digital satellite broadcastings. As another alternative, each of the programs to be executed by the CPU 502 is downloaded to the computer through a wire communication from the download site by way of a network such as a LAN (Local Area Network) or the Internet. In the computer, each of the programs downloaded from the download site is received by the communication section 508 to be installed into the hard disk 505.

It is also worth noting that, in this patent specification, steps of a program executed by the computer in order to carry out various kinds of processing do not have to be sequenced along the time axis in the same order as the steps of the flowchart described previously. For example, the processing sequence may also include steps which are carried out concurrently as parallel processing or carried out individually as processing objects.

In addition, a program can be executed by one computer or a plurality of computers in a distributed processing environment. On top of that, a program can be transferred to a remote computer to be executed by the remote computer in a remote processing system.

The present application contains subject matter related to that disclosed in Japanese Priority Patent Application JP 2008-066090 filed in the Japan Patent Office on Mar. 14, 2008, the entire content of which is hereby incorporated by reference.

In addition, implementations of the present invention are by no means limited to the embodiments described above. That is to say, the embodiments can be changed in a variety of ways within a range not deviating from essentials of the present invention.

What is claimed is:

1. A data processing apparatus comprising:
a branch-metric computation section configured to compute a branch metric while limiting the number of child states each originated from a parent state in a trellis used for inferring a data series to a number M determined in advance;
a state-metric computation section configured to compute a state metric of a candidate for a surviving state surviving in said trellis by making use of said branch metric;
a detection section configured to detect a minimum state metric which is a smallest state metric among state metrics each computed as a candidate for a surviving state;
a storage section configured to store states, which have been each originated through branches in said trellis from an effective state reached by going upstream from a state with said minimum state metric through branches in said trellis by a distance of (L−1) time units where L is a cutoff length used as a unit for cutting off a process to infer said data series, as surviving states; and
a selection section configured to select a candidate, which corresponds to said effective state to serve as a candidate for data composing said data series, to be used to serve as a candidate for the inferred value of said data.

2. The data processing apparatus according to claim 1 wherein the number of said candidates for said surviving states is limited to $M^L$.

3. The data processing apparatus according to claim 1 wherein said branch-metric computation section limits the number of child states each originated from a parent state through a branch in said trellis to the number of child states originated from said parent state through one of M said branches each having said branch metric which is small in comparison with said branch metrics of said other child states.

4. The data processing apparatus according to claim 1 wherein said branch-metric computation section limits the number of child states each originated from a parent state through a branch in said trellis to the number of states each corresponding to one of candidates for pieces of data included in said data series as data pieces each represented by one of M signal points close to a point located on an IQ constellation plane as a point computed in accordance with a constraint condition for inferring said data series by making use of said trellis.

5. The data processing apparatus according to claim 1 wherein application of a window function to a signal establishes a constraint condition for inferring said data series by making use of said trellis.

6. The data processing apparatus according to claim 5 wherein said window function is a Hannington window.

7. The data processing apparatus according to claim 5 wherein said window function is applied to said signal in a time domain or a frequency domain.

8. The data processing apparatus according to claim 1 wherein:
application of a window function to a signal establishes a constraint condition for inferring said data series by making use of said trellis; and
said branch-metric computation section synthesizes said branch metrics each calculated for one of two or more window functions to a serve as a branch metric of a branch, through which a child state is originated from a parent state in said trellis, in order to compute said branch metric of said branch.

9. A data processing method provided for a data processing apparatus, which is used for inferring a data series, comprising the steps of:
computing a branch metric while limiting the number of child states each originated from a parent state in a trellis used for inferring said data series to a number M determined in advance;
computing a state metric of a candidate for a surviving state surviving in said trellis by making use of said branch metric;
detecting a minimum state metric which is a smallest state metric among state metrics each computed as said state metric of a candidate for a surviving state;
storing states, which have been each originated through branches in said trellis from an effective state reached by going upstream from a state with said minimum state metric through said branches in said trellis by a distance of (L−1) time units where L is a cutoff length used as a unit for cutting off a process to infer said data series, as surviving states; and
selecting a candidate, which corresponds to said effective state to serve as a candidate for data composing said data series, to be used to serve as a candidate for the inferred value of said data.

10. A program to be executed by a computer functioning as a data processing apparatus comprising:
a branch-metric computation section configured to compute a branch metric while limiting the number of child states each originated from a parent state in a trellis used for inferring a data series to a number M determined in advance;
a state-metric computation section configured to compute a state metric of a candidate for a surviving state surviving in said trellis by making use of said branch metric;
a detection section configured to detect a minimum state metric which is a smallest state metric among state metrics each computed as a candidate for a surviving state;
a storage section configured to store states, which have been each originated through branches in said trellis from an effective state reached by going upstream from a state with said minimum state metric through said branches in said trellis by a distance of (L−1) time units where L is a cutoff length used as a unit for cutting off a process to infer said data series, as surviving states; and
a selection section configured to select a candidate, which corresponds to said effective state to serve as a candidate for data composing said data series, to be used to serve as a candidate for the inferred value of said data.

11. A data processing apparatus which limits the number of candidates for surviving states surviving in a trellis used for computing a data series to $M^L$, where M is a predetermined number and L is a cutoff length used as a unit for cutting off a process to infer the data series, in processing to:
limit the number of child states each originated from a parent state in the trellis to the predetermined number M; and
make use of a state series having a length equal to the cutoff length L in outputting an inferred value of data composing the data series.

12. A data processing apparatus comprising:
branch-metric computation means for computing a branch metric while limiting the number of child states each originated from a parent state in a trellis used for inferring a data series to a number M determined in advance;
state-metric computation means for computing a state metric of a candidate for a surviving state surviving in said trellis by making use of said branch metric;
detection means for detecting a minimum state metric which is a smallest state metric among state metrics each computed as a candidate for a surviving state;
storage means for storing states, which have been each originated through branches in said trellis from an effective state reached by going upstream from a state with said minimum state metric through said branches in said trellis by a distance of (L−1) time units where L is a cutoff length used as a unit for cutting off a process to infer said data series, as surviving states; and
selection means for selecting a candidate, which corresponds to said effective state to serve as a candidate for data composing said data series, to be used to serve as a candidate for the inferred value of said data.

\* \* \* \* \*